(12) United States Patent
Coleman

(10) Patent No.: US 11,092,977 B1
(45) Date of Patent: Aug. 17, 2021

(54) FLUID TRANSFER COMPONENT COMPRISING A FILM WITH FLUID CHANNELS

(71) Applicant: Zane Coleman, Elmhurst, IL (US)

(72) Inventor: Zane Coleman, Elmhurst, IL (US)

( * ) Notice: Subject to any disclaimer, the term of this patent is extended or adjusted under 35 U.S.C. 154(b) by 168 days.

(21) Appl. No.: 16/559,587

(22) Filed: Sep. 3, 2019

Related U.S. Application Data

(63) Continuation-in-part of application No. 15/798,392, filed on Oct. 30, 2017, now Pat. No. 10,401,876.

(51) Int. Cl.
*F28F 7/00* (2006.01)
*G05D 7/00* (2006.01)

(52) U.S. Cl.
CPC .................. *G05D 7/00* (2013.01)

(58) Field of Classification Search
CPC .... G05D 7/00; F28F 3/02; F28F 3/025; F28F 3/046; F28D 2011/0266; F28D 3/04; F28D 9/00; F28D 9/068; B23P 11/00
USPC .......................................... 165/46, 166, 174
See application file for complete search history.

(56) References Cited

U.S. PATENT DOCUMENTS

| | | |
|---|---|---|
| 2,999,296 A | 9/1961 | Breen et al. |
| 3,679,059 A | 7/1972 | Wyatt et al. |
| 4,055,163 A | 10/1977 | Costello et al. |
| 4,056,094 A | 11/1977 | Rosenberg |
| 4,167,934 A | 9/1979 | Miles |
| 4,234,431 A | 11/1980 | Mishiro et al. |
| 4,264,447 A | 4/1981 | Nicolet |
| 4,270,517 A | 6/1981 | Stephens |
| 4,327,706 A | 5/1982 | Nickerson |
| 4,521,442 A | 6/1985 | Guamieri |
| 4,668,558 A | 5/1987 | Barber |
| 4,701,234 A | 10/1987 | Rogemont et al. |
| 4,758,481 A | 7/1988 | Fauvel |
| 4,861,498 A | 8/1989 | Robinsky |
| 4,871,456 A | 10/1989 | Naruo et al. |
| 4,950,549 A | 8/1990 | Rolando et al. |
| 5,069,403 A | 12/1991 | Marentic et al. |
| 5,078,925 A | 1/1992 | Rolando et al. |
| 5,133,516 A | 7/1992 | Marentic et al. |

(Continued)

FOREIGN PATENT DOCUMENTS

| | | |
|---|---|---|
| EP | 0602560 A1 | 6/1994 |
| EP | 0661502 A2 | 7/1995 |

(Continued)

*Primary Examiner* — Davis D Hwu
(74) *Attorney, Agent, or Firm* — Zane Coleman

(57) ABSTRACT

In one embodiment, a fluid transfer film for transferring a fluid comprises an extruded polymer layer having a thickness less than 5 millimeters; an input side and an output side where the fluid flows in a flow direction through an active region from the input side to the output side; and more than 10 fluid channels defined by interior surfaces within the extruded polymer layer formed during in an extrusion process, each fluid channel of the more than 10 fluid channels is separated spatially in at least 1 row in a thickness direction of the fluid transfer film, the more than 10 fluid channels have a channel density across the active region greater than 5 fluid channels per centimeter, wherein the interior surfaces defining the more than 10 fluid channels are hydrophilic, and the fluid flows through the more than 10 fluid channels by at least capillary action.

20 Claims, 9 Drawing Sheets

(56) References Cited

U.S. PATENT DOCUMENTS

| | | |
|---|---|---|
| 5,158,557 A | 10/1992 | Noreen et al. |
| 5,175,030 A | 12/1992 | Lu et al. |
| 5,192,456 A | 3/1993 | Ishida et al. |
| 5,204,001 A | 4/1993 | Tonelli et al. |
| 5,245,693 A | 9/1993 | Ford et al. |
| 5,281,208 A * | 1/1994 | Thompson ........ A61F 13/15203 604/365 |
| 5,451,317 A | 9/1995 | Ishida et al. |
| 5,466,431 A | 11/1995 | Dorfman et al. |
| 5,514,120 A | 5/1996 | Johnston et al. |
| 5,585,186 A | 12/1996 | Scholz et al. |
| 5,639,373 A | 6/1997 | Mahendran et al. |
| 5,691,846 A | 11/1997 | Benson, Jr. et al. |
| 5,728,446 A | 3/1998 | Hester et al. |
| 5,753,373 A | 5/1998 | Scholz et al. |
| 5,771,810 A | 6/1998 | Wolcott |
| 5,944,997 A | 8/1999 | Pedersen et al. |
| 6,057,520 A | 5/2000 | Goodwin-Johansson |
| 6,091,502 A | 7/2000 | Weigl et al. |
| 6,178,966 B1 | 1/2001 | Breshears |
| 6,193,890 B1 | 2/2001 | Pedersen et al. |
| 6,224,766 B1 | 5/2001 | Yamamoto et al. |
| 6,229,683 B1 | 5/2001 | Goodwin-Johansson |
| 6,236,491 B1 | 5/2001 | Goodwin-Johansson |
| 6,277,209 B1 | 8/2001 | Yamada et al. |
| 6,290,685 B1 | 9/2001 | Insley et al. |
| 6,303,035 B1 | 10/2001 | Cote et al. |
| 6,373,682 B1 | 4/2002 | Goodwin-Johansson |
| 6,375,848 B1 | 4/2002 | Cote et al. |
| 6,381,846 B2 | 5/2002 | Insley et al. |
| 6,396,620 B1 | 5/2002 | Goodwin-Johansson |
| 6,406,629 B1 | 6/2002 | Husain et al. |
| 6,420,622 B1 | 7/2002 | Johnston et al. |
| 6,431,695 B1 | 8/2002 | Johnston et al. |
| 6,456,420 B1 | 9/2002 | Goodwin-Johansson |
| 6,461,716 B1 * | 10/2002 | Lee .................. A61L 15/26 428/137 |
| 6,485,273 B1 | 11/2002 | Goodwin-Johansson |
| 6,507,688 B1 | 1/2003 | Nath |
| 6,514,412 B1 | 2/2003 | Insley et al. |
| 6,585,939 B1 | 7/2003 | Dapprich |
| 6,681,788 B2 | 1/2004 | Parce et al. |
| 6,696,157 B1 | 2/2004 | David et al. |
| 6,721,104 B2 | 4/2004 | Schachar et al. |
| 6,746,567 B2 | 6/2004 | Johnston et al. |
| 6,749,813 B1 | 6/2004 | David et al. |
| 6,761,962 B2 | 7/2004 | Bentsen et al. |
| 6,907,921 B2 | 6/2005 | Insley et al. |
| 6,986,428 B2 | 1/2006 | Hester et al. |
| 7,027,683 B2 | 4/2006 | O'Connor et al. |
| 7,243,703 B2 | 7/2007 | Yamaguchi et al. |
| 7,303,642 B2 | 12/2007 | Topolkaraev |
| 7,331,378 B2 | 2/2008 | Bhatti et al. |
| 7,334,630 B2 | 2/2008 | Goodson et al. |
| 7,422,911 B2 | 9/2008 | Schembri |
| 7,468,211 B2 | 12/2008 | McCormick et al. |
| 7,531,120 B2 | 5/2009 | Van Rijn et al. |
| 7,755,840 B2 | 7/2010 | Batchko et al. |
| 7,939,811 B2 | 5/2011 | Thundat et al. |
| 8,574,704 B2 | 11/2013 | Smith et al. |
| 9,586,186 B2 | 3/2017 | Roe |
| 2001/0045358 A1 | 11/2001 | Kopf-Sill et al. |
| 2001/0047962 A1 | 12/2001 | Zha et al. |
| 2001/0052494 A1 | 12/2001 | Cote et al. |
| 2002/0011330 A1 | 1/2002 | Insley et al. |
| 2002/0011443 A1 | 1/2002 | Komatsu et al. |
| 2003/0102076 A1 | 6/2003 | Johnston et al. |
| 2003/0129379 A1 | 7/2003 | Yao et al. |
| 2003/0211291 A1 * | 11/2003 | Castiglione ............... B32B 7/02 428/172 |
| 2004/0050532 A1 | 3/2004 | Yamaguchi et al. |
| 2004/0169932 A1 | 9/2004 | Esch et al. |
| 2004/0226886 A1 | 11/2004 | Hester et al. |
| 2005/0084681 A1 | 4/2005 | Levitt et al. |
| 2005/0100270 A1 | 5/2005 | O'Connor |
| 2005/0106360 A1 | 5/2005 | Johnston et al. |
| 2005/0123727 A1 | 6/2005 | Hester et al. |
| 2007/0212266 A1 | 9/2007 | Johnston et al. |
| 2009/0277056 A1 | 11/2009 | Peeters et al. |
| 2010/0318072 A1 | 12/2010 | Johnston et al. |
| 2011/0077172 A1 | 3/2011 | Aizenberg et al. |
| 2011/0192233 A1 | 8/2011 | Aizenberg et al. |
| 2011/0245077 A1 | 10/2011 | Anderson et al. |
| 2013/0216854 A1 | 8/2013 | Feinerman et al. |
| 2014/0225301 A1 | 8/2014 | Xu et al. |
| 2014/0290731 A1 | 10/2014 | Aizenberg et al. |
| 2014/0295565 A1 | 10/2014 | Babcock |
| 2014/0314975 A1 | 10/2014 | Smith et al. |
| 2015/0338175 A1 | 11/2015 | Raman et al. |
| 2016/0038940 A1 | 2/2016 | Babcock |
| 2017/0253410 A1 | 9/2017 | Franca et al. |

FOREIGN PATENT DOCUMENTS

| | | |
|---|---|---|
| EP | 0937494 A2 | 8/1999 |
| NO | 2006121534 A1 | 11/2006 |
| WO | 0037369 A1 | 6/2000 |
| WO | 2001032930 A1 | 5/2001 |
| WO | 2006043181 A2 | 4/2006 |
| WO | 2008070048 A2 | 6/2008 |
| WO | 2012084707 A1 | 6/2012 |

* cited by examiner

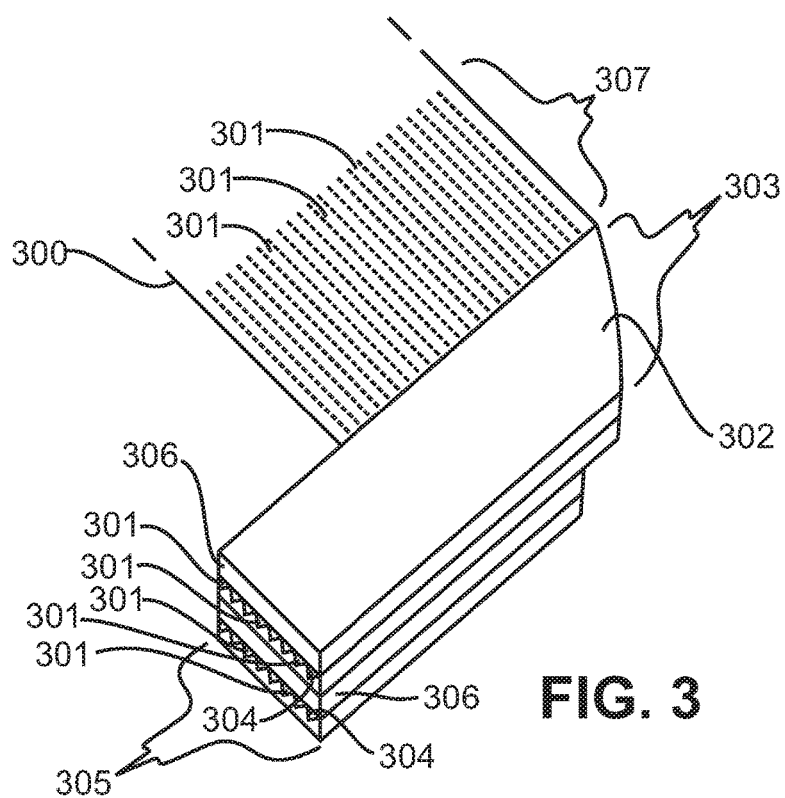
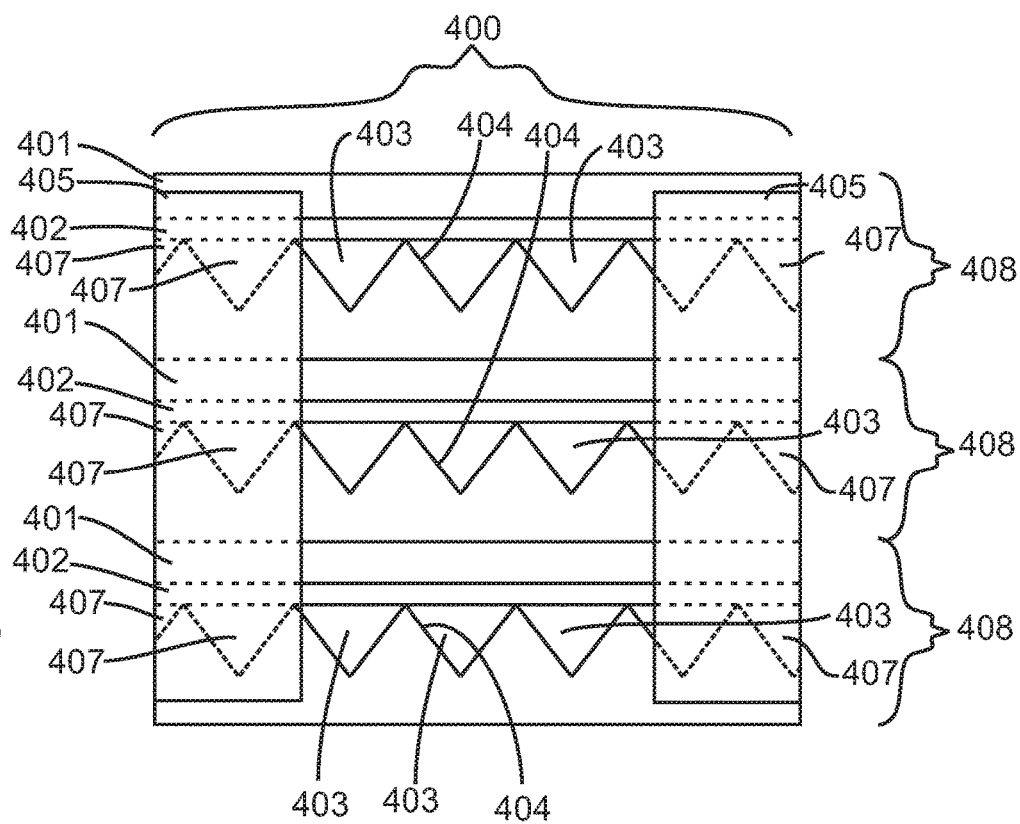

FLUID TRANSFER COMPONENT COMPRISING A FILM WITH FLUID CHANNELS

CROSS-REFERENCE TO RELATED APPLICATIONS

This application is a continuation-in-part of U.S. application Ser. No. 15/798,392 filed Oct. 30, 2017, entitled "Fluid collection component comprising a film with fluid channels," which is a continuation-in-part of U.S. application Ser. No. 13/680,010 filed Nov. 16, 2012, entitled "Fluid transfer systems, devices, components, and methods of manufacture," which claims the benefit of U.S. Provisional Application No. 61/560,295 entitled "Fluid transfer system, devices, components, and method of manufacture" filed Nov. 16, 2011, the entire contents of each are incorporated by reference herein.

BACKGROUND

Many materials that change their optical properties are typically electrically complex, expensive and have poor long term reliability. Fluid transfer systems are needed that are simple, do not leak or having complex or unreliable coupling to fluid transfer components, or have a high flow resistance.

BRIEF SUMMARY

This invention generally relates to systems, devices, components and methods of their manufacture for transferring fluid from a first location to a second location. The system may comprise a film with film supporting members, such as without limitation, standoffs, or channels. In another embodiment, the system comprises a plurality of hollow fibers or tubes through which fluid flows. The fluid flow may, without limitation, transfer thermal energy or optically modifying materials. Examples include, without limitation, solar heat transfer films or fibers, color changing films or fibers, light transmission changing films or fibers, and optical property changing films or fibers. In one embodiment, a fluid transfer system comprises one or more fluid transfer components and one or more fluid input couplers or fluid output couplers. In a further embodiment, the fluid transfer system comprises one or more transfer fluids. In another embodiment, the fluid transfer system comprises a flow source for moving the fluid in the system. In one embodiment, the fluid transfer system delivers fluid to an active region, receives fluid from an active region, or passes a fluid through an active region. In one embodiment, a first fluid in the active region (or in one or more channels within the active region) of the fluid transfer flows out of the active region and a second fluid different from the first fluid flows into the active region. In another embodiment, the fluid receives or delivers energy, such as thermal energy, in the active region and delivers or receives, respectively, the energy to a second component in the fluid transfer system, such as a heat exchanger. In one embodiment, the active region of the fluid transfer system changes from a first optical state to a second optical state due to fluid transition within one or more channels in a film. In another embodiment, the fluid transfer component comprises at least one liquid input coupler or liquid output coupler. In another embodiment, the liquid input coupler and/or the liquid output coupler comprises a fluid channel geometry converter. In one embodiment, the fluid transfer system comprises a film with one or more layers, wherein a fluid input coupler, an active region, and a fluid output coupler comprise regions of the film. In another embodiment, the fluid transfer component comprises film-based fluid channels converted from a first spatial arrangement geometry to a second spatial arrangement geometry different from the first spatial arrangement geometry. In another embodiment, the fluid transfer component comprises at least one of a fluid input coupler and fluid output coupler comprising a fluid channel geometry converter comprising re-arranged extended segments of a film comprising the active region fluid channels. As used herein a fluid transfer component may control and/or manipulate the flow or transfer of any type of fluid and may comprise channels, chambers and other fluidic component that behave as do most macroscopic systems, or the devices or components can be constructed in a way so that they are considered microfluidic devices.

In one embodiment, a fluid transfer film for transferring a fluid comprises an extruded polymer layer having a thickness less than 5 millimeters; an input side and an output side where the fluid flows in a flow direction through an active region from the input side to the output side; and more than 10 fluid channels defined by interior surfaces within the extruded polymer layer formed during in an extrusion process, each fluid channel of the more than 10 fluid channels is separated spatially in at least 1 row in a thickness direction of the fluid transfer film, the more than 10 fluid channels have a channel density across the active region greater than 5 fluid channels per centimeter, wherein the interior surfaces defining the more than 10 fluid channels are hydrophilic, and the fluid flows through the more than 10 fluid channels by at least capillary action.

BRIEF DESCRIPTION OF THE DRAWINGS

FIG. 3 is a perspective view of a portion of an embodiment of a fluid transfer component comprising a fluid channel geometry converter input coupler.

FIG. 4 is a side view of an input end region of an embodiment of a fluid channel geometry converter input coupler comprising a stacked layer of ends of segments extending from a film comprising a cover layer.

DETAILED DESCRIPTION OF THE INVENTION

Figure 1:
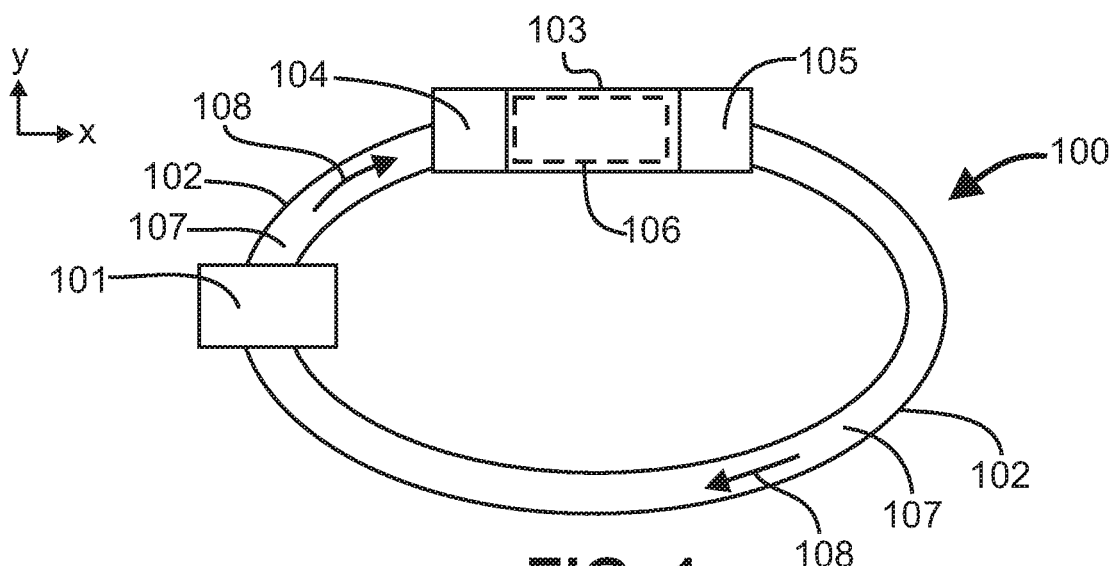
FIG. 1 is a top view of an embodiment of a fluid transfer system comprising a flow source operatively coupled by a fluid connector to a fluid transfer component.

The features and other details of the invention will now be more particularly described. It will be understood that particular embodiments described herein are shown by way of illustration and not as limitations of the invention. The principal features of this invention can be employed in various embodiments without departing from the scope of the invention. All parts and percentages are by weight unless otherwise specified.

Glossary

In describing one or more embodiments, the following terms are defined as set forth below:

"Channel" as used herein is to be interpreted in a broad sense. Thus, it is not intended to be restricted to elongated configurations where the transverse or longitudinal dimension greatly exceeds the diameter or cross-sectional dimension. Rather, such terms are meant to comprise cavities or tunnels of any desired shape or configuration through which fluids may be directed. Such a fluid cavity may, for example, comprise a flow-through cell where fluid is to be continually passed or, alternatively, a chamber for holding a specified, discrete amount of fluid for a specified amount of time. "Channels" may be filled or may contain internal structures comprising valves or equivalent components. "Fluid channels," "flow channels," and "fluid flow channels," are terms used interchangeably herein representing channels through which fluid flows.

"Flow source" is an element that is capable of supplying energy for doing work that can move a fluid.

"Fluid" as used herein is to be understood, without any restriction thereto, to refer to any type of fluid that may be used, including but not limited to gases, liquids, gels, or plasmas; additionally, the fluid may be a pure materials or a mixture of fluids and molecules, particles, colloids or other types of material may be suspended or solvated within the fluid.

"Polymeric material" means a material that is formed by combining monomers to produce a natural or synthetic organic molecule(s) that contains one or more repeating units regularly or irregularly arranged in the organic molecule(s).

"Surface relief" means a non-planar surface that has defined features extending from (protruding) or receding from (recessed) from a surface in a predetermined, random, or a combination thereof, arrangement.

"Optically coupled" as used herein means connected, whether directly or indirectly, for purposes of transmitting a light beam. A first and a second element may be optically coupled if a beam may be provided from the first element to the second element, whether or not an intermediate component manipulates the beam between the first and second elements.

"Film" as used herein means a sheet of material with a thickness generally equal to or less than 5 millimeters. "Film" may include a generally flexible sheet of polymeric material, a sheet of rubber material, a sheet of inorganic material, a sheet of metal material, or a combination of one or more materials. A "Film" may comprise a plurality of sheets of materials. For example, a "Film" may be a film of silicone material, a fluoropolymer film, a thin sheet of flexible glass, a laminate of a thin glass sheet and a polymer film, a metal foil, a laminate of a fluoropolymer film and a metal foil, or a multi-layer thermoset polydimethylsiloxane film.

Fluid Transfer System

In one embodiment, a fluid transfer system comprises one or more fluid transfer components and one or more fluid input couplers or fluid output couplers. In a further embodiment, the fluid transfer system comprises one or more transfer fluids. In another embodiment, the fluid transfer system comprises a flow source for moving the fluid in the system. In one embodiment, the fluid transfer system delivers fluid to an active region, receives fluid from an active region, or passes a fluid through an active region. In one embodiment, a first fluid in the active region (or in one or more channels within the active region) of the fluid transfer flows out of the active region and a second fluid different from the first fluid flows into the active region. In another embodiment, the fluid receives or delivers energy, such as thermal energy, in the active region and delivers or receives, respectively, the energy to a second component in the fluid transfer system, such as a heat exchanger. In one embodiment, the active region of the fluid transfer system changes from a first optical state to a second optical state due to fluid transition within one or more channels in a film. In another embodiment, the fluid transfer component comprises at least one liquid input coupler or liquid output coupler. In another embodiment, the liquid input coupler and/or the liquid output coupler comprises a fluid channel geometry converter. In one embodiment, the fluid transfer system comprises a film with one or more layers, wherein a fluid input coupler, an active region, and a fluid output coupler comprise regions of the film. In another embodiment, the fluid transfer component comprises film-based fluid channels converted from a first spatial arrangement geometry to a second spatial arrangement geometry different from the first spatial arrangement geometry. In another embodiment, the fluid transfer component comprises at least one of a fluid input coupler and fluid output coupler comprising a fluid channel geometry converter comprising re-arranged extended segments of a film comprising the active region fluid channels. As used herein a fluid transfer component may control and/or manipulate the flow or transfer of any type of fluid and may comprise channels, chambers and other fluidic component that behave as do most macroscopic systems, or the devices or components can be constructed in a way so that they are considered microfluidic devices.

In another embodiment, a fluid channel geometry converter is defined by a plurality of channels physically separated, folded or bent, and stacked to form a fluid input end or output end comprising a plurality of layers comprising channels in a spatial arrangement geometry different from the spatial arrangement geometry of the channels in the active region of the fluid transfer component. In another embodiment, one or more inner surfaces of the channels in the fluid channel geometry converter are defined by a surface of a film comprising surface relief features. In another embodiment, the one or more inner surfaces of the channels in the fluid channel geometry converter comprise a material contiguous along a fluid flow path from a first fluid channel geometry to a second fluid channel geometry different from the first. In one embodiment, a plurality of channels configured to receive fluid comprise one or more surfaces defined by a surface of a film contiguous throughout the fluid channel geometry conversion.

One or more fluid transfer components may be at least one selected from the group: connected physically, connected mechanically, optically coupled, thermally coupled, electrically connected, connected by a hose, connected by a coupler, connected by manifold coupler, connected by a fluid channel geometry converter coupler, and in fluid communication with another fluid transfer component or system component. The plurality of fluid transfer components may be arranged in a matrix, tiled in one or more directions, or be operatively connected to each other in one or more pre-determined or user selectable configurations. In one embodiment, the fluid transferring components, their methods of manufacture and system configurations suitable or adaptable for use in part in embodiments include fluid collection and transport systems described in U.S. Pat. No. 6,290,685, the entire contents are incorporated by reference herein.

Fluid Transfer Component

In one embodiment, a fluid transfer component comprises at least one fluid flowing channel defined by a non-planar surface separated from a second, opposite surface wherein fluid flows through the channels from an input edge side of a fluid transfer component toward an output side of the fluid transfer component.

The fluid transfer component comprises one or more fluid channels formed along the component. The channels have a channel flow dimension (the dimension of the flow length of the fluid in a channel from the input side of the fluid transfer component to the output side of fluid transfer component) larger than the channel transverse flow dimension. The transverse flow dimension is the average dimension of the channel in a direction orthogonal to the direction of the fluid flow, such as the thickness direction of a film comprising channels or a direction orthogonal to the flow direction and the thickness direction of a film, for example. The active flow ratio for a channel is the ratio of the average channel flow dimension to an average channel transverse flow dimension in the active region of a fluid transfer component. The active flow ratio for a fluid transfer component is average of the active flow ratios of the channels. In one embodiment, the active flow ratio for a channel or fluid transfer component is greater than one or more selected from the group: 1, 2, 5, 10, 15, 20, 50, 100, 200, 500, 1,000, 5,000, 10,000 50,000, 75,000, 100,000, 200,000, 500,000 and 1,000,000. For example, in one embodiment, a fluid transfer system comprises a film-based fluid transfer component that comprises a plurality of channels formed by optically adhering a 1 meter by 1 meter prism film comprising a linear array of 50 micrometer pitch 90 degree apex angle linear prisms with a 25 micrometers prism height to a 25 micrometer adhesive film on a 100 micrometer PET carrier film such that the channels formed have a channel height of 20 micrometers after lamination (due to the adhesive filling in some of the channels). In this example, the flow dimension from one side of the film at the input to the opposite side for the output is 1 meter and the dimension orthogonal to the flow dimension and component is 20 micrometers, and the active flow ratio for the channels and the fluid transfer component is 50,000.

The fluid transfer component may be in the form of one or more selected from the group: film, collection of films, multilayer films, sheet, fiber, collection of fibers (including hollow or open cavity fibers), weave of fibers (including without restriction plain weave, satin weave, twill weave, leno weave, traditional Japanese weave, knitted fibers, stitched fibers, roving, non-woven fibers (including staple nonwovens, spunlaid nonwovens, airlaid paper, wet laid mat, flame attenuated mat, meltblown fibers), panel, window, tile, shingle, laminate, flooring laminate, wallpaper, covering, rug, blanket, sign (including various types such as, without limitation, window signs, road signs, vehicle signs, building signs, billboards) ornamental covering, writing medium, storage medium, furniture, door, desk, housing for an electronic device, display, curtain, carpet, tape (including but not limited to those described U.S. patent application publication no. 20030102076, the entire contents are incorporated by reference herein), medical blanket (including but not limited to those described in U.S. patent application publication no. 20110245077, the entire contents are incorporated by reference herein), vehicle component (such as without limitation, embedded into the outer armor in land craft, water craft or air craft such as a tank, jeep, all-terrain vehicle, plane, helicopter, boat, etc.), or a combination of one or more of the aforementioned forms.

The shape of the fluid transfer component or a region thereof may have a shape that is one or more selected from the group: planar, flat, bent, folded, rolled, curved, creased, in a sine-wave shape, concave, convex, and a shape conforming to a surface region or the entirety of one or more shapes resembling all or a portion of a three dimensional object or a geometric figure (including sphere, cone, pyramid, polyhedron, topological polyhedron, tapered polyhedron, and polytope).

The fluid transfer component comprises an active region operatively configured to provide at least one selected from the group: optical, thermal, physical, and fluid transfer properties to the fluid transfer system to the region.

Film Based Fluid Transfer System

In one embodiment, a fluid transfer system comprises a film-based fluid transfer component comprising at least one fluid flowing channel defined by a non-planar surface separated from a second, opposite surface wherein fluid flows through the channels from an input side of a fluid transfer component toward an output side of the fluid transfer component, at least one film coupler, at least one fluid, and a fluid flow source.

In one embodiment, the film-based fluid transfer component comprises a film with a surface relief profile physically coupled to a second surface wherein the two surfaces substantially form the top and bottom surfaces of channels that permit fluid to flow from the input edge of the component to the output edge of the component. The surface relief profile may be on an outer or inner surface of the film or component. In one embodiment, the film-based fluid transfer system comprises a plurality of films. In another embodiment, the channels are formed from two films laminated, co-extruded, coated, or otherwise physically coupled to each other. In another embodiment, the film-based fluid transfer component comprises a film comprising one or more hollow cavities through which fluid may flow. One or more of the films may comprise one or more input couplers or output couplers disposed along one or more edges operatively configured to input a fluid into the active region of the film-based fluid transfer component or output a fluid from the active region of the film-based fluid transfer component.

Fluid Transfer Film

In one embodiment, the fluid transfer component is a film and is referred to herein as a fluid transfer film. In one embodiment, the fluid transfer film comprises one or more channels defined by a non-planar surface separated from a second surface wherein fluid flows through the one or more channels from an input side of a fluid transfer film toward an output side of the fluid transfer film. Films may be substrates or carriers further comprising a coating (such as an ultraviolet cured embossed microstructure or a thermally embossed microstructure). In one embodiment, the fluid transfer film has a thickness less than one selected from the group of 10, 20, 30, 40, 50, 75, 100, 150, 200, 300, 400, 500, 750, 1,000, and 5,000 micrometers. In one embodiment, the film is reinforced to provide increased strength. In one embodiment, the film comprises one or more selected from the group: one or more fibers, filaments, chain-like links, mesh, weaving of material, roving, particles, multiple layers, a metal layer, a layer of film with a high modulus of elasticity. In one embodiment, the film is a metal sheet comprising surface relief features. In another embodiment, the film is polymeric film comprising carbon fibers or particles.

Multilayer Fluid Transfer Film

In one embodiment, the fluid transfer film is a multilayer film comprising a base layer and a second layer or coating comprising a surface relief profile. In another embodiment, the fluid transfer film comprises two film layers on opposite sides of the channel wherein at least one of the inner surfaces of the film layers or a layer or material between the film layers comprises a surface defining one or more fluid channels. In one embodiment, a fluid transfer film comprises a foil or metal layer opposite the light receiving side of the film.

In another embodiment, the multilayer film comprises a plurality of layers or regions comprising a plurality of channels positioned in different planes in the transverse flow direction. For example, in one embodiment three microstructured films with a substantially planar bottom surface are laminated to each other and a top cover layer using a pressure sensitive adhesive to form 3 layers of channels. The channels in each layer may be oriented in the same direction, orthogonal directions, at an angle to each other, or a combination thereof.

This type of construction multiplies the ability of the component to transport fluid because each layer significantly increases flow capacity. The layers may comprise different channel configurations and/or number of channels, depending on a particular application. Furthermore, this type of stacked construction can be particularly suitable for applications that are restricted in width and therefore require a relatively narrow fluid transfer device from which a certain fluid transfer capacity is desired. Thus, a narrow component can be made having increased flow capacity.

In one embodiment, each layer may have different optical and/or thermal properties. For example, in one embodiment, a multi-color sign comprising a fluid transfer film comprises a composite comprising three fluid transfer films operatively configured to receive a first fluid with a red dye concentration, a second fluid with a green concentration, and a third fluid with a blue concentration. In this example, the color of the active region of the fluid transfer film composite corresponding to the overlapping active regions of the individual films can be changed from transparent to red, to blue, to green, or a combination of colors (such as purple) defined by the gamut enclosed by the three primary colors. In another embodiment, a first layer in a fluid transfer film composite comprises first fluid channels is operatively configured to receive a thermal transfer liquid with a specific heat higher than 4 at 25 degrees Celsius and a second layer in a fluid transfer film comprises second fluid channels operatively configured to receive a black or light absorbing dyed or pigmented fluid or a transparent fluid.

Hollow Component Based Fluid Transfer System

In one embodiment, a fluid transfer system comprises a hollow component based fluid transfer component comprising at least one fluid flowing channel defined at least in part by one or more inner or outer surfaces of the hollow component wherein fluid flows through the channels from an input side of a fluid transfer component toward an output side of the fluid transfer component, at least one coupler, at least one fluid, and a fluid flow source. The hollow component based fluid transfer component may comprise an arrangement of the hollow components that may be collectively arranged to each other, arranged on a substrate or carrier, formed during the formation of transfer component, applied to the transfer component or a substrate or carrier, or otherwise formed or arranged to provide a plurality of channels within the fluid transfer component operatively configured to transfer fluid from the input side to the output side of the fluid transfer component.

Hollow Component

In one embodiment, the hollow component based fluid transfer component comprises one or more selected from the group of capillary elements, hollow fibers, hollow tubes, hollow channels, a hollow channel formed with a cross-sectional shape in at least one region selected from the group: circle, ellipse, rectangle, square, triangle, polygon, irregular shape, amoeba-like shape, random shape, and a combination of one or more of the aforementioned shapes. For example, in one embodiment, a plain weave of hollow fibers is cut and extrusion coated on the top and bottom with an adhesive and carrier film to form a carrier film-adhesive-weave-adhesive-carrier film composite using an adhesive such that fluid may flow through the hollow fibers from one weft end to the opposite weft end and/or one warp end to the opposite warp end.

In one embodiment, the hollow component based fluid transfer component comprises one or more surface relief profiles on one or more internal or external surfaces. For example, in one embodiment, the fiber is a shaped fiber or profile fiber with a cross-sectional macro-shape in substantially concentric circular form and with an outer surface micro-shape with protrusions with triangular cross-sectional shapes along the outer circumference of the fiber. In this embodiment, for example, the protrusions may help maintain the separation between the fibers while reducing the overall density of the component.

In another embodiment, the fiber is a shaped fiber or profile fiber with a cross-sectional macro-shape in substantially concentric circular form and with an inner surface micro-shape with protrusions with triangular cross-sectional shapes along the outer circumference of the fiber. In this embodiment, for example, the inner shapes may help wick the fluid to improve the flow of the fluid.

In one embodiment, the outer surfaces of the shaped or profile fiber create small channels when the fibers are coated, laminated, co-extruded, or otherwise operatively coupled to a substrate or other material such that the interfacial tension between the outer surface profile and the adjacent materials prevents the material from wicking into the gaps of the outer surface profile. In this embodiment, for example, the gaps in the profile can be very small and made at low cost since the fiber profiles can be created from stretching the fiber and shrinking the profile as opposed to mechanical embossing. Furthermore, since these channels can be formed surrounding a fiber (hollow or solid), the fill factor of active channels can be very high in one or more directions.

In one embodiment, the hollow fiber comprises surface relief features on the outer surface of the fiber, on the inner surface of the fiber, or on both the outer and inner surface of the fiber. In another embodiment, the fluid flows by capillary action within the fiber and the inner surface relief features of the hollow fiber have an average dimension transverse to the radial direction less than 100 micrometers.

In one embodiment, the hollow (or solid) fiber comprises a metal or metal alloy fiber or wire such as a drawn hollow aluminum wire, a drawn hollow copper wire, a drawn hollow steel wire. In another embodiment, the hollow (or solid) fiber comprises at least one of an organic material, inorganic material, polymer, rubber (such as silicone), polyurethane, thermoplastic polymer, thermoset polymer, transparent polymer, translucent polymer, white polymer, and colored polymer.

Fluid Transfer System Type

The fluid transfer system may be an open system or closed loop system. For example, in one embodiment, wherein two fluids are mixed or variable amounts of an additive such as a dye are added to a fluid, it may be desirable to remove from a reservoir the mixed fluid that has passed out of the active region of the fluid transfer component. In another embodiment, a closed loop fluid transfer system is used for a solar thermal transfer fluid wherein the fluid absorbs (directly or indirectly) the heat energy from solar radiation, the system transfers the fluid to a heat exchanger in a building to provide heating, and returns the fluid to absorb the heat energy. In one embodiment, the fluid transfer system is an open system that transfers a fluid to the environment or receives a fluid from the environment.

The fluid transfer system may have one or more fluid transfer components with one or more operating states in one or more active regions. For example, the system may be bistable (switching from an optically clear to a black state and back to a clear state, etc., for example), tri-stable, multi-stable, continuously changing, single state (such as with a continuous thermal transfer system) or a combination of states in one or more operating modes. In another embodiment, the fluid transfer component has one or more active regions with different active states at the same or different times. For example, in one embodiment, a sign comprising a white backlight may contain bright letters in a first active region of the fluid transfer component comprising a transparent fluid of air in the first active region surrounded by a black active region comprising a second liquid in with carbon black micro-pigments creating white letters on a black background. In this example, the fluid flow could be operatively switched such that air is flowed into the area surrounding the letters and the black fluid could be directed to flow through the letters to create black letters on a white background.

The fluid transfer system may provide other fluid management or operational configuration such as switching, responding to internal or external variables or conditions, fluid control, fluid mixing, mixing a component within the fluid.

Material of the Fluid Transfer Component

In one embodiment, film-based fluid transfer components comprise surface relief features and channels capable of spontaneously and uniformly transporting liquids along the film channels. Two general factors that influence the ability of the channels to spontaneously transport liquids (e.g., water, glycol, liquid silicone, salt solutions, beverages, condensate, cleaning solutions, etc.) are (i) the geometry or topography of the surface (capillarity, size and shape of the channels) and (ii) the nature of the film surface (e.g., surface energy). To achieve the desired amount of fluid transfer capability the designer may adjust the structure or topography of the channels and/or adjust the surface energy of one or more channel surfaces or a film surface from which they may be formed. In one embodiment, a closed channel wick made from a film-based fluid transfer component is sufficiently hydrophilic to allow the desired liquid to wet the surface. Generally, to facilitate spontaneous wicking in open channels, the liquid must wet the surface of the film, and the contact angle be equal or less than 90 degrees minus one-half the notch angle. The channels or surface relief features of the fluid transfer component can be of any geometry that provides desired fluid or liquid transport, and preferably one that is readily replicated.

The fluid transfer component can be formed from any polymeric materials suitable for casting or embossing including, for example, polyolefins, polyesters, polyamides, poly(vinyl chloride), polyether esters, polyimides, polyesteramide, polyacrylates, polyvinylacetate, hydrolyzed derivatives of polyvinylacetate, etc. Polyolefins may be used, particularly polyethylene or polypropylene, blends and/or copolymers thereof, and copolymers of propylene and/or ethylene with minor proportions of other monomers, such as vinyl acetate or acrylates such as methyl and butylacrylate. In one embodiment, polyolefins are preferred because of their excellent physical properties, ease of processing, and typically lower cost than other thermoplastic materials having similar characteristics. Polyolefins readily replicate the surface of a casting or embossing roll. They are tough, durable and hold their shape well, thus making such films easy to handle after the casting or embossing process. In another embodiment, hydrophilic polyurethanes are used for their physical properties and inherently high surface energy.

Alternatively, fluid transfer components can be cast from thermosets (curable resin materials) such as polyurethanes, acrylates, epoxies and silicones, and cured by exposure radiation (e.g., thermal, UV or E-beam radiation, etc.) or moisture. Suitable fluid transfer components also can be manufactured using pressure sensitive adhesive materials. In some cases the channels may be formed using inorganic materials (e.g., glass, ceramics, or metals). Preferably, the fluid transfer component substantially retains its geometry and surface characteristics upon exposure to liquids. Structured layers and surface relief profiles can be cast from curable resin materials such as acrylates or epoxies and cured through free radical pathways promoted chemically, by exposure to heat, UV, or electron beam radiation. Examples of suitable materials for substrates include, but are not limited to poly(methylmethacrylate) polycarbonates, polyesters, and polyimides, fluoropolymers, polyimides, and multilayer films comprising one or more layers of polymers, foils or materials (such as fiber weaves). Examples of suitable photocurable resin compositions include, but are not limited to alkyl acrylates and methacrylates (e.g., polymethyl methacrylate). The composition may also include a photoinitiator. Examples of suitable photoinitiators include benzoin ethers such as benzoin methyl ether and benzoin isopropyl ether; substituted acetophenones such as 2,2-diethyoxacetophenone, 2,2-dimethoxy-2-phenyl-1-phenylacetophenone, and dimethoxyhydroxyacetophenone; substituted alpha-ketols such as 2-methyl-2-hydroxy propiophenone; aromatic sulfonyl chlorides such as 2-naphthalene sulfonyl chloride; and photoactive oximes such as 1-phenyl-1,2-propanedione-2-(O-ethoxycarbonyl) oxime. In one embodiment, the fluid transfer film is an extruded film In one embodiment, the fluid transfer film is a thin, drawn glass sheet comprising a plurality of fluid channels.

Fluid transfer components can comprise one or more materials selected from the group: glass (including ultrathin glass), metals (including foils and sheets, aluminum foil, thin stainless steel, or thin titanium alloy), alloys, polymers, copolymers, thermoplastic polymers, thermoset polymers, curable polymers, rubbers (including silicone), polyurethane. In one embodiment, the active region of the fluid transfer component comprises a glass layer and a polymer layer. As used here, thermoplastic, as differentiated from thermoset, refers to a polymer which softens and melts when exposed to heat and re-solidifies when cooled and can be melted and solidified through many cycles. A thermoset polymer, on the other hand, irreversibly solidifies when heated and cooled. A cured polymer system, in which polymer chains are interconnected or crosslinked, can be formed at room temperature through use of chemical agents or ionizing irradiation.

Polymers useful in forming one or more selected from the group: substrate, carrier, layer, structured surface or layer, and surface relief profile of fluid transfer components in embodiments include but are not limited to polyamides, polyimides, high heat resistant polyimide, thermoplastic polyimide, polystyrene, polysulfone, acrylonitrile butadiene styrene (ABS), polymethyl methacrylate, polycarbonate, polyvinyl chloride, polyvinylidene chloride, polyvinyl acetate, polyethylene-vinyl acetate copolymers, polyvinyl alcohol, polyethylene-polyvinyl alcohol copolymers, fluoro resins, silicon resins, natural rubber, polyisoprene rubber, polybutadiene rubber, styrene-butadiene copolymers, butyl rubber, halogenated butyl rubber, chloroprene rubber, acryl rubber, polybutene, ethylene propylene diene monomer (M-class) rubber (EPDM), cross-linked EPDM, acrylonitrile-butadiene copolymers, fluoro rubber, silicone rubber, silicone polymers, fluoropolymers having a low index of refraction, for example, silicone polymers such as polydimethylsiloxane polymer, polymethylphenylsiloxane polymer, fluorosilicone polymers, fluoropolymers, ethylene tetrafluoride-propylene hexafluoride copolymers (FEP), ethylene tetrafluoride-perfluoroalkoxyethylene copolymers (PFE), polychlorotrifluoroethylene (PCTFE), ethylene tetrafluorideethylene copolymers (ETFE), polyvinylidene fluoride, polyvinyl fluoride, vinylidene fluoride-trifluorinated ethylene chloride copolymers, vinylidene fluoride-propylene hexafluoride copolymers, vinylidene fluoridepropylene hexafluoride-ethylene tetrafluoride terpolymers, ethylene tetrafluoride-propylene rubber, fluorinated thermoplastic elastomers, polyolefins such as polyethylene, polypropylene, polypropylene copolymers, polyethylene copolymers, CFC (chlorofluorocarbon), ECTFE (polyethylene), ETFE (ethylene trifluoroethylene), FEVE (Fluoroethylene-Alkyl Vinyl Ether), FPM/FKM (Fluorocarbon [Chlorotrifluoroethylenevinylidene fluoride]), FFPM/FFKM (Perfluorinated Elastomer [Perfluoroelastomer]), HFC (hydrofluorocarbon), HCFC hydrochlorofluorocarbon, HFP (hexafluoropropylene), Nafion, PBOS (perfluorobutanesulfonyl fluoride), PCTFE (Kel-F, CTFE) (polychlorotrifluoroethylene), Perfluoropolyoxetane, fluoroelastomers, PFA (perfluoroalkoxy polymer), PFOA (perfluorooctanoic acid), PFOS (perfluorooctane sulfonate), PFPE (Perfluoropolyether), PMTFPS (polymethyltrifluoropropylsiloxane), POSS (polyhedral oligomeric silsesquioxane), PPVE (perfluoropropyl vinyl ether), PTFE (polytetrafluoroethylene), (PVDF) polyvinylidene diflouride, PVF (polyvinylfluoride), TEOS (tetraethoxysilane), TFE (tetrafluoroethylene), acetates, cellulose ethers, polyvinyl alcohols, polysaccharides, polyesters, polyamides, poly(vinyl chloride), polyurethanes, polyureas, polycarbonates, silicone (meth)acrylate copolymer, EVA (ethylene vinyl acetate), PET (polyethylene terephthalate), polystyrene, fluoropolymers such as those discussed in U.S. Pat. No. 6,507,688, the entire contents are incorporated by reference herein, and polyimide films or other layers such as disclosed in U.S. Pat. No. 7,243,703, the entire contents are is incorporated by reference herein.

Component Material Additives

The component may also comprise additives that impart various properties into the polymeric structured layer. For example, plasticizers can be added to decrease elastic modulus to improve flexibility. The additives may also include surface energy modifiers (such as surfactants and hydrophilic polymers), plasticizers, antioxidants, pigments, release agents, antistatic agents, monohydroxy and polyhydroxy compounds, thixotropic agents, toughening agents, pigments, fillers, abrasive granules, stabilizers, light stabilizers, antioxidants, flow agents, bodying agents, flatting agents, colorants, binders, blowing agents, fungicides, bactericides, surfactants, glass and ceramic beads, and reinforcing materials such as woven and non-woven webs of organic and inorganic fibers. For example, in one embodiment, a based fluid transfer component is a polymer film including carbon particles or carbon fibers to improve thermal conductivity and/or increase the melt temperature.

The component may further comprise additives known in the polymer processing and polymer film industry to improve UV resistance, weathering resistance, ozone resistance, chemical resistance, tear resistance, optical properties, thermal properties, physical properties, mechanical properties, or processing properties. In one embodiment, the component material comprises a chemical or additive to prevent algae growth or the growth of other biofouling organisms. For example, in one embodiment, the component material comprises copper sulfate.

Properties of the Fluid Transfer Component

The fluid transfer component may comprise physical, thermal, mechanical, optical and other properties sufficient to operatively provide fluid transfer, reliability, usability, ease of manufacturing, and other qualities needed depending on the application. For example, the flexibility of the fluid transfer component may be sufficiently high to enable the fluid transfer component to be used as a cover to lay across an article or as a drape to lay across a patient. In one embodiment the Young's Modulus of the fluid transfer component is less than one selected from the group: 20, 15, 10, 5, 4, and 3 Gigapascals. In one embodiment, the fluid transfer component has a change in yellowness index (AYI) less than one selected from the group of 7, 5, 4, 3, 2, and 1 when exposed to 1000 hours of weathering time by Xenon 1200 (DIN53387 test). In one embodiment, the fluid transfer component does not significantly degrade when exposed to 5,000 hours of exposure to solar radiation.

Physical Properties of the Fluid Transfer Component

In one embodiment, the fluid transfer component comprises a dimension in at least first direction larger than one or more selected from the group of 5 mm, 1 cm, 10 cm, 20 cm, 50 cm, 75 cm, 1 meter, 1.5 meters, 2 meters, and 3 meters.

In one embodiment, the fluid transfer component is transferred from a substantially planar film form or sheet form into a non-planar shape by at least one selected from the group: thermoforming, vacuum forming, insert molding, in-mold decoration, heat pressing, curing (photo or thermal) and heat and/or pressure lamination.

Shape of Fluid Transfer Component

In one embodiment, the fluid transfer component is in the form of a film, sheet, or roll and cut in the shape of a square, rectangle, ellipse, circle, polygon, arcuate shape, or a combination thereof. In another embodiment, the fluid transfer component is in the shape of a wave-like film (where the film has a sinusoidal curve, for example), corrugated, saw-tooth-like, lenticular film, flat film, cylinder, rectilinear, polygon, sphere, ellipsoid, or a combination of one or more of the aforementioned shapes. In one embodiment, the fluid transfer component substantially conforms to the surface upon which it positioned, such as for example, a patient when it is a drape, roofing shingles when positioned on a roof, a vehicle when positioned on a vehicle, or an article of clothing when positioned on the article. In another embodiment, the shape of the fluid transfer component is variable in a first state and substantially fixed in a second state. In one embodiment, the shape of the fluid transfer component is fixed upon exposure to energy, temperature, or radiation (such as ultraviolet light exposure). The shape of the fluid transfer component may be fixed onto an object by UV exposure, thermal exposure radiation exposure, thermosetting, cross-linking, methods of polymerization, or using an adhesive or epoxy such as a pressure sensitive adhesive. For example, in one embodiment, the fluid transfer component comprises a thermosetting material that sets when exposed to a temperature above 40 degrees Celsius. In this example, the fluid transfer component is a film that sets in the shape conforming to the surface structure of a roof upon which it is placed when the film is exposed to high temperatures in a solar thermal transfer application. In another example, the fluid transfer component is applied to a surface of an article of clothing or a vehicle, conforms to the shape the surface to which it is applied, and is locked into the shape by UV exposure, heat, or other methods of polymerizing, thermosetting, or cross-linking.

Thickness

In one embodiment, the thickness of the fluid transfer component, the average thickness of the fluid transfer component, the average thickness of the fluid transfer component substrate, the average thickness of the fluid transfer component superstrate, or the average thickness of the active region of the fluid transfer component is less than one selected from the group 5, 4, 3, 2, 1, 0.5, 0.4, 0.3, 0.2, 0.1, 0.9, 0.08, 0.07, 0.06, 0.05, 0.04, 0.03, 0.02, 0.01 and 0.09 millimeters. For example, in one embodiment, the substrate of a film-based fluid transfer component is less than 0.1 millimeters such that when the film is segmented, folded, and stacked, the area of the fluid input end defined by the ends of the stacked segments forming a fluid channel geometry converter occupied by the substrate is minimized. In one embodiment, the fluid transfer component comprises a thermal insulation layer in the active region that does not extend to the fluid input end formed by a fluid channel geometry converter. In another embodiment, the average thickness of the fluid transfer component in the active region is greater than 0.5 millimeter and the average thickness of each segment of a film comprising one or more surfaces of the channels collectively forming a fluid input end when stacked in the fluid channel geometry converter is less than 0.5 millimeters. In another embodiment, the average thickness of the fluid transfer component in the active region is greater than 1 millimeters and the average thickness of each segment of a film comprising one or more surfaces of the channels collectively forming a fluid input end when stacked in the fluid channel geometry converter is less than 1 millimeter. In another embodiment, the average thickness of the fluid transfer component in the active region is greater than 2 millimeters and the average thickness of each segment of a film comprising one or more surfaces of the channels collectively forming a fluid input end when stacked in the fluid channel geometry converter is less than 2 millimeters. In another embodiment, the average thickness of the fluid transfer component in the active region is greater than 0.2 millimeters and the average thickness of each segment of a film comprising one or more surfaces of the channels collectively forming a fluid input end when stacked in the fluid channel geometry converter is less than 0.2 millimeters.

Fluid Channels

In one embodiment, the fluid transfer component comprises one or more fluid channels comprising cavities or tunnels of any desired shape or configuration through which fluids may be directed. In one embodiment, the fluid transfer element comprises channels with parallel linear topographies. In one embodiment, the channels are defined, at least in part, by a first surface relief profile. In another embodiment, the channels are defined by objects disposed between two or more surfaces (that may be planar or non-planar) such that the objects define and separate the surfaces. In another embodiment, the channels are defined by a hollow or cavity comprising component such that when operatively coupled with a surface channels are formed that can operatively flow fluid from an input side to an output side of the fluid transfer component. In a further embodiment, the fluid transfer component is formed by one or more methods selected from the group: extrusion, embossing, coating, and injection molding such that internal channels are formed or cavities are formed external to the component that can be operatively coupled to a surface to form channels.

In one embodiment, the fluid channels have an average flow dimension less than one selected from the group of 10, 20, 30, 40, 50, 75, 100, 150, 200, 300, 400, 500, 750, 1,000, and 5,000 micrometers. In one embodiment, the fluid channels have an average transverse flow dimension less than one selected from the group of 10, 20, 30, 40, 50, 75, 100, 150, 200, 300, 400, 500, 750, 1,000, and 5,000 micrometers. In one embodiment, sidewalls of a channel assist in maintaining separation between two layers of material such as a top and bottom substrate film. In another embodiment, the channels direct flow in predetermined direction without substantial cross-contamination or interference that could increase flow resistance, inhibit analysis when the fluid transfer component is used for chromatography or assay analysis for example, or cause non-uniform fluid thickness in the active region that could reduce thermal or optical performance, for example.

As used here, channel aspect ratio means the ratio of a channel's length to its hydraulic radius, and hydraulic radius is the wettable cross-sectional area of a channel divided by its wettable inner surface perimeter (the distance around the portion of the inner surface of the channel in a cross-section that is wet). In one embodiment, a structured surface that is a microstructured surface defines discrete fluid channels that have a minimum aspect ratio (length/hydraulic radius) of 10:1, in some embodiments exceeding approximately 100:1, and in other embodiments at least about 1000:1. The aspect ratio could be indefinitely high but generally would be less than about 10,000,000:1. In one embodiment, the hydraulic radius of a channel is no greater than about 300 micrometers. In many embodiments, it can be less than 100 micrometers, and may be less than 10 micrometers. A smaller hydraulic radius may be used in some applications and the hydraulic radius could be less than one micrometer in size. In some embodiments, the hydraulic radius is greater than about 1 micrometer.

In one embodiment, the fluid channels are separated by non-planar surfaces or walls. For example, in one embodiment, the cross-section of a fluid transfer component comprises a fluted corrugated film defining fluid channels due to the wave-like film.

In another embodiment the percentage of the cross-sectional area of a fluid transfer component occupied by fluid channel openings is greater than one selected from the group, 20%, 30%, 40%, 50%, 60%, 70%, 75%, 80%, 85%, 90% and 95% when the cross-section is taken orthogonal to the direction of fluid flow in the active region. In this embodiment, the fluid channels occupy a high percentage of the cross-sectional area and the efficiency and/or performance can be improved. For example, a higher percentage cross-sectional area can transfer more fluid per unit width and/or thickness of the fluid transfer component (where the width and thickness are orthogonal to each other and the direction of fluid flow through the channel), collect or transfer more heat, have a higher reflectance percentage, higher absorption percentage, higher scattering angle, higher optical performance, or higher thermal performance, etc.

Separation Between Fluid Channels

In one embodiment, the average separation between the fluid channels in the active region of a fluid transfer component in a direction orthogonal to the direction of fluid flow and thickness direction of the film or component is less than one selected from the group 5, 4, 3, 2, 1, 0.5, 0.2, 0.1, 0.08, 0.7, 0.6, 0.5, 0.4, 0.3, 0.2, 0.1, 0.08, 0.06, 0.04, 0.03, 0.02, and 0.01 micrometers. In one embodiment, the separation distance is very small such that a higher volumetric flow rate can be achieved for very small channels, such as those designed for fluid flow at least in part due to capillary action. In one embodiment, the average separation between the fluid channels in the active region of a fluid transfer component in a direction orthogonal to the direction of fluid flow and thickness direction of the film or component is greater than one selected from the group 5, 4, 3, 2, 1, 0.5, 0.2, 0.1, 0.08, 0.7, 0.6, 0.5, 0.4, 0.3, 0.2, 0.1, 0.08, 0.06, 0.04, 0.03, 0.02, and 0.01 micrometers. In one embodiment, the separation distance is sufficiently large for practical manufacturing methods and/or film integrity with high pressure flow.

In one embodiment, a fluid transfer film comprises fluid channels wherein the separation between the fluid channels varies in the cross direction perpendicular to the thickness direction and the flow direction. In this embodiment, the fluid channels comprise an irregular pitch in the cross direction. In one embodiment, a fluid transfer film comprises a first set of fluid channels with a first cross-sectional shape and a first pitch, and a second set of fluid channels with the first cross-sectional shape and a second pitch wherein the ratio of the first pitch to second pitch is greater than one selected from the group of 1.1, 1.2, 1.5, 1.8, 2, 4, 6, and 10.

Inner Surfaces of the Channels

In one embodiment, the channels are defined by inner surfaces of one or more materials or layers of a fluid transfer component. In another embodiment, one or more inner surfaces of the channels comprise a surface relief profile that may be constant, regular, or varying in one or more directions such as the fluid flow direction or a direction transverse to the fluid flow. The inner surfaces of the channels may comprise coatings and/or surface relief features to improve the fluid transfer component performance such as fluid transfer efficiency. In one embodiment, the dimension of one or more fluid channels in the thickness direction of the fluid transfer component or film (such as microcapillary film) and/or the direction orthogonal to the fluid flow direction and thickness direction of the fluid transfer component or film varies in the flow direction. Examples of methods of varying the size of the channel along the flow direction are described in U.S. Patent Application Publication No. US20140225301, the entire contents of which are incorporated by reference herein.

Surface Relief Profile

In one embodiment, the fluid transfer component comprises one or more surface relief profiles selected from the group: prismatic, linear, diffractive, semicircular cross-sections, polygonal cross sections, arrays of features, arrays of groups of features. Examples of features include but are not limited to those discussed in U.S. Pat. No. 6,431,695, the entire contents of which are incorporated herein by reference. Other examples of shapes or cross sectional shapes suitable for use as a surface relief profile in one or more embodiments include corner cubes, inverted corner cubes, truncated prisms, truncated corner cubes, truncated pyramids, linear prisms, truncated linear prisms, hemispheres, truncated hemispheres, optically refracting surface features such as used in optical films (including with limitation, brightness enhancing films, reverse prism films, lenticular films, transmissive right angle films, and image directing films), substantially rectangular cavities (such as in structural polycarbonate panels also known as multi-walled polycarbonate sheets, hollow polycarbonate sheets, and fluted polycarbonate sheets), an inverted shape of one the aforementioned shapes, and a combination of one or more of the aforementioned shapes. In one embodiment, the surface relief profile of one or more layers, materials, or regions of a fluid transfer component defines a channel with the cross-sectional shape of the inverted surface relief profile of the surface. For example, a fluid transfer component comprising a lenticular film with convex lenticules bonded to a planar surface using a planar pressure sensitive adhesive forms channels with plano-concave cross sections.

One or more of the surface relief profiles may be oriented in the up direction, down direction, lateral direction, parallel to the flow direction, orthogonal to the flow direction, or at an angle to the outer surface of the component. The surface relief profile of one channel may be different, and thus the cross-sectional shape of the channel may be different between two neighboring or distant channels.

In one embodiment, the surface relief profile has a first set of surface relief profile shapes that define one or more channels and a second set of surface relief profiles that define an interior surface of the channel.

In one embodiment, the surface relief profile has a surface roughness, Ra, greater than one selected from the group: 0.25 micrometers 0.5 micrometers, 1 micrometer, 2 micrometers, 5 micrometers, 10 micrometers, 20 micrometers, 25 micrometers, 50 micrometers, 100 micrometers, 200 micrometers, and 500 micrometers. In another embodiment, the surface relief profile has a surface roughness, Ra, less than one selected from the group: 0.25 micrometers 0.5 micrometers, 1 micrometer, 2 micrometers, 5 micrometers, 10 micrometers, 20 micrometers, 25 micrometers, 50 micrometers, 100 micrometers, 200 micrometers, and 500 micrometers. In one embodiment, the surface relief profile has a surface roughness between 0.25 micrometers and 10 micrometers, 0.5 micrometers and 5 micrometers, or 0.25 micrometers and 50 micrometers.

In one embodiment, the surface relief profile is substantially absent (the corresponding surface is substantially planar or has a substantially smaller surface roughness) in a first region of the fluid transfer component. In another embodiment, the surface relief profile is substantially absent around the periphery of a fluid transfer component. For example, in one embodiment, the inner regions of a fluid transfer component comprise a surface relief profile defining channels while the periphery of the active region of the fluid transfer component comprise substantially planar surfaces that provide a seal preventing fluid flow out of the active region except in regions corresponding to the input and output couplers.

The surface relief profile may comprise shapes or features on the top or bottom surface of a fluid transfer component or the top or bottom of an inner surface of a fluid transfer component and may be oriented up, down, or at an angle to the top direction, bottom direction or a surface of the component.

The structured surface can also be provided with a very low profile. Thus, fluid transfer components may comprise a structured polymeric layer with a thickness less than 5000 micrometers, and even possibly less than 1500 micrometers. To do this, the channels may be defined by peaks that have a height of approximately 5 to 1200 micrometers and that have a peak distance of about 10 to 2000 micrometers.

In one embodiment, the surface relief profile is a microstructured surface that defines discrete fluid channels that have a minimum aspect ratio (length/hydraulic radius) greater than one selected from the group of 10:1, 100:1, 1000:1, 5,000:1, 10,000:1, and 100,000:1. 500,000:1, 1,000,000:1, 5,000,000:1, 10,000,000:1, and 20,000,000:1. The hydraulic radius is the wettable cross-sectional area of a channel divided by its wettable channel circumference. In one embodiment, the hydraulic radius of a channel is at most one or more selected from the group 5 mm, 2 mm, 1 mm, 750 micrometers, 500 micrometers, 300 micrometers, 100 micrometers, 50 micrometers, 25 micrometers, 15 micrometers, 10 micrometers, 5 micrometers, 2 micrometers, 1 micrometer, and 0.5 micrometers.

The making of structured surfaces, and in particular microstructured or nanostructured surfaces, on a layer such as a polymeric layer in the form of a polymeric film for example, and materials suitable for making the structured surfaces are disclosed in U.S. Pat. Nos. 5,069,403; 5,133,516; 5,691,846; 5,514,120; 5,158,557; 5,175,030; 4,668,558; and U.S. Pat. Publications Nos. 20110192233 and 20110077172, the entire contents of each are incorporated by reference herein.

In one embodiment, the surface relief profile of the channel is a nano/microstructured porous material infused with a lubricating fluid, such as a SLIPS (Slippery Liquid-Infused Porous Surface) surface. In one embodiment, the inner surface of one or more channels of a fluid transfer component is a lubricated porous surface or the fluid transferred through the one or more channels lubricates the porous surface. In one embodiment, the SLIPS coating is optically transparent. Examples of lubricated porous surfaces and their methods of manufacture are disclosed in WIPO patent application publication number (WO) 2012100099, the entire contents of which are incorporated by reference herein.

In one embodiment, one or more surfaces of the fluid transfer component comprise corner cube type retroreflecting surface features. In this embodiment, portions of the cube surfaces may define one or more surfaces of one or more channels or one or more channels may comprise side walls and the corner cube-shaped surface features may be disposed along the top and/or bottom surface of the one or more channels. The cube surfaces may be oriented off axis from the normal to the surface of the fluid transfer component such that, for example, in a solar thermal application where the fluid transfer component comprises a film and is positioned conformably on the angled roof of a building, the optical axis of the corner cubes may be oriented at a first angle theta, where theta is greater than zero degrees and less than 90 degrees, to the normal of the film such that solar incident radiation may be optimally retroreflected during the summer months.

Channel Wall Thickness

In one embodiment, the average thickness of one or more walls (such as a side wall, top wall, or bottom wall) of one or more channels in a fluid transfer component is less than one selected from the group: 3, 2, 1, 0.5, 0.4, 0.2, 0.1, 0.05, 0.04, 0.03, 0.02, 0.01, and 0.005 millimeters. In one embodiment, the average thickness of all of the walls (including side walls, top wall, and bottom wall if present) of one or more channels in a fluid transfer component is less than one selected from the group: 3, 2, 1, 0.5, 0.4, 0.2, 0.1, 0.05, 0.04, 0.03, 0.02, 0.01, and 0.005 millimeters.

Surface Relief Shape within a Shape

In some embodiments, the surface relief structures have a larger scale cross-sectional shape and a smaller scale cross-sectional shape within the larger scale shape. In other words, the surface relief structures can have different length scales of structures. For example, in one embodiment, on a scale of 100's of microns, the channel has the cross-sectional shape of a rectangle, whereupon further magnification, one can see that the surface walls of the rectangular shape comprise linear wall protrusions on the scale of micrometers or tens of micrometers wide along the sides of the rectangle directed toward the interior of the rectangle. Similarly, in another example, on a scale of micrometers, the channel has the cross-sectional shape of a circle, whereupon further magnification, one can see that the surface walls of the circular shape comprise linear surface protrusions along the sides of the circle directed toward the interior of the circle. In another embodiment, the smaller scale features protrude away from the center of the channel. In one embodiment, the smaller scale features provide increased wettability and the larger scale features provide a larger scale channel size for providing the thickness of the fluid layer, providing a sufficient volume of fluid for fluid flow, or providing the wall structures for channeling the fluid in the channels independently without interaction from neighboring channels.

Fluid Channel Thickness Variation Across Channel

In one embodiment, the thickness of the fluid channel varies in a cross direction orthogonal to the direction of fluid flow and orthogonal the thickness direction of the fluid transfer film. In one embodiment, the thickness of the fluid channel decreases in the cross-direction from the center of the fluid channel to the neighboring fluid channel. In one embodiment, the fluid channels have an average maximum width in a cross-direction, an average maximum thickness (separation between internal surfaces) in the thickness direction, an edge region of the fluid channel that is 10 percent of the average maximum width for the fluid channels from the edge of the fluid channel closest to one or more neighboring fluid channels in the cross direction, and a central region that is within 10 percent of the average maximum width for the fluid channels from the center of the fluid channel in the cross direction. In one embodiment, the average thickness of the fluid channel in the edge region of the fluid channel is less than one selected from the group: 50, 40, 30, 20, and 10 percent of the average maximum thickness of the fluid channels. In one embodiment, the average thickness of the fluid channel in the central region is greater than one selected from the group: 50, 60, 70, 80 and 90 percent of the average maximum thickness of the fluid channels. In one embodiment, the thickness of the fluid channels tapers from the central region to the edge region and edges closest to the neighboring fluid channel in the cross direction. In one embodiment the ratio of the average thickness of the fluid channel in the central region to the average thickness of the fluid channel in the edge region is greater than one selected from the group: 2, 4, 5, 8, and 10. In some embodiments, by having tapered edge regions or edge regions with reduced thickness, the integrity of the channels may be maintained (such as by higher tear resistance or by reduced failure at high fluid pressure) while maintaining a particular width and pitch of the fluid channels since there is more polymer above and below the region between the two fluid channels and/or the region of the polymer above and below the end regions of the fluid channels. Furthermore in the case fluid channels with cross-sections comprising arcs (such as cross-sections in the shape of a plano-convex lens, or biconvex lens) that reduce in width toward the edge regions, the fluid channels may function as a lens that can focus light along an axis passing through the central region of the fluid channels when fluid of a refractive index higher than the surface material or polymer defining the channel is propagated through the fluid channels.

In one embodiment, the average thickness of the fluid channel in the edge region of the fluid channel is greater than one selected from the group: 50, 60, 70, 80, and 90 percent of the average maximum thickness of the fluid channels. In one embodiment, the average thickness of the fluid channel in the central region is less than one selected from the group: 60, 50, 40, 30, 20, and 10 percent of the average maximum thickness of the fluid channels. In one embodiment, the thickness of the fluid channels tapers from the edge regions to the central region in the cross direction. In one embodiment the ratio of the average thickness of the fluid channel in the edge region to the average thickness of the fluid channel in the central region is greater than one selected from the group: 2, 4, 5, 8, and 10. In some embodiments, by having tapered edge regions or edge regions with reduced thickness, the integrity of the channels in the central region of the fluid channels may be maintained (such as by higher tear resistance or by reduce failure at high fluid pressure) while maintaining a particular width and pitch of the fluid channels since there is more polymer above and below the central region of the fluid channels.

Overlapping Fluid Channels in the Thickness Direction

In one embodiment, a fluid transfer film comprises first fluid channels and second fluid channels that overlap in the thickness direction such that a line parallel to the thickness direction passing through at least a portion of a first fluid channels also passes through at least one second fluid channel. In one embodiment, the second fluid channels overlap the first fluid channels twice such that a line parallel to the thickness direction passing through a portion of the first fluid channels also passes through two portions of the second fluid channels (it passes in and out of the second fluid channel twice). In other embodiments, second fluid channels overlap the first fluid channel 3, 4, 5, or 6 times such that a line parallel to the thickness direction passing through the first fluid channels also passes through 3, 4, 5, or 6 portions, respectively, of the second fluid channels. In some embodiments, by using fluid channels with different cross-sectional shapes and locations the properties (such as optical, mechanical, thermal, flow rates, and other properties disclosed herein) of the fluid transfer film, fluid channels, combinations of the fluid channels in regions, or regions of the fluid transfer film may vary.

Fluid Channels with Opposite Flow

In some embodiments, the fluid transfer film comprises a first set of fluid channels and a second set of fluid channels (that may or may not have the same cross-sectional shape as the first set of fluid channels) wherein the flow direction of a first fluid in the first set of fluid channels is opposite the flow direction of a second fluid (which may be the same as the first fluid) in the second set of fluid channels. In one embodiment, the first fluid channels are adjacent the second fluid channels in an alternating channel flow arrangement. In this embodiment, the properties (such as optical, mechanical, thermal, flow rates, and other properties disclosed herein) of the first fluid channels (or collectively the regions of the fluid transfer film comprising the first fluid channels) may be localized to the first fluid channels with the neighboring or adjacent fluid channels comprising fluids flowing with an opposite flow direction may optionally having a different property simultaneously in the second fluid channels or region of the fluid transfer film comprising the second fluid channels. In one embodiment, the flow direction of a first fluid in the first set of fluid channels is opposite the flow direction of a second fluid in the second set of fluid channels wherein the flow from the first channels turns and flows back through the second set of channels within the active region or external to the active region (or device or fluid transfer film). In this embodiment, the flow may return to the source while passing through the active region twice and (optionally) return on the same side of the film (and/or active area) that the supply originated (i.e. the supply and return may be on the same side). In one embodiment, the first set of fluid channels are adjacent the second set of fluid channels in the cross direction. In another embodiment, each fluid channel of the first set of fluid channels is adjacent one or two fluid channels of the second set of fluid channels, such as, for example, alternating fluid channels from the first set and the second set of fluid channels.

Fluid Channels within Other Fluid Channels

In one embodiment, a fluid transfer film comprises a first fluid channels and second fluid channels wherein the second fluid channels are positioned within the first fluid channels. In this embodiment, for example, a temperature regulating fluid, such as a fluid flowing within the inner fluid channel may regulate the temperature of a fluid in the outer fluid channel, which may be important for chemical, microchannel reactor, medical, or other applications including those disclosed herein. In one embodiment, a fluid transfer film comprises a first fluid channels, second fluid channels, and third fluid channels, wherein the second fluid channels and third fluid channels are positioned within the first fluid channels. In one embodiment, a fluid transfer film comprises a first fluid channels, second fluid channels, and third fluid channels wherein the second fluid channels are positioned within the first fluid channels, and the third fluid channels are separated from the first fluid channels and the second fluid channels in the plane comprising the cross direction and orthogonal to the direction of fluid flow in one or more of the first fluid channels, second fluid channels, and third fluid channels. In one embodiment, the walls of the inner fluid channel comprise a flexible material (such as a rubber, elastomer, one or more polymers disclosed herein, or other polymer such as an elastic polymer) such that when the pressure of the fluid in the inner fluid channel is increased, the cross-sectional size of the inner fluid channel increases (the walls expand), and may reduce the volume of fluid in the outer fluid channel and/or substantially fill the outer fluid channel. In one embodiment, the pressure of the fluid in the inner fluid channel may be adjusted to change the properties (optical, thermal, mechanical, and others disclosed herein) of the fluid transfer film in the active region. For example, with a light absorbing dye within a fluid within the inner fluid channel, a low pressure imparts low stress on the walls of the inner fluid channel and the cross-sectional size of the inner fluid channel in the cross direction may be small, and the light transmission through the active region of the fluid transfer film may be high (such as greater than 50%, 60%, 70%, or 80%). In this example, when the pressure of the fluid in the inner fluid channel is increased, one or both of the cross-sectional dimensions of the inner fluid channel in the cross-sectional plane may increase (such as increase till they reach one or more inner surfaces of the outer fluid channel) such that the percentage of a width of the active area of the fluid transfer film comprising the inner fluid with the light absorbing dye increases and the average light absorption of the active area of the fluid transfer film of light incident on the active area increases. In one embodiment, the outer fluid channel comprises air or a low refractive index fluid, the walls of the inner fluid channel comprise a first polymer and the inner fluid (fluid within the inner fluid channel) and the walls defining the inner fluid channel define a lightguide with light propagating within the inner fluid and inner fluid channel walls in a waveguide condition (totally internally reflect light). In this embodiment, with the inner fluid at a first pressure, such as a low pressure, the outer surface of the inner fluid channel walls have a minimal or low percentage of contact with the inner surfaces of the outer fluid channel such that a low percentage of light is extracted from the lightguide due to contact. In this embodiment, when the pressure of the inner fluid is increased, the percentage of the surface area of the outer surface of the inner fluid channel walls in contact with the inner surface of the outer fluid channels increases and more light is coupled into the polymer defining the outer fluid channels due to frustration of the total internal reflection of the light propagating within the inner fluid and the inner fluid channel walls. In this embodiment, the polymer defining the outer fluid channels may comprise a light scattering material (or a light scattering film (volumetric or surface scattering) may be in contact with one or more outer surfaces of the active region of the fluid film, or the outer surface of the polymer defining the outer fluid channels may comprise a surface relief profile that scatters light) such that at a low pressure with light from a light source propagating by total internal reflection through the inner fluid channel and the polymer defining the inner fluid channel, a low percentage of the propagating light exits the fluid transfer film in the light emitting region and when the pressure of the inner fluid is increased, a higher percentage of the propagating light is extracted into the polymer defining the outer fluid channel, is scattered, and exits the fluid transfer film in the active region. In this example, the pressure of the inner fluid controls the amount of light emitted in the active region of the fluid transfer film.

In one embodiment, a fluid transfer film comprises outer fluid channels and inner fluid channels wherein the inner fluid channels are positioned within the outer fluid channels and the outer fluid channel comprises an outer fluid with a first temperature flowing through the outer fluid channel such that heat is transferred to the environment through the polymer defining the outer fluid channels or heat is transferred from the environment through the polymer defining the outer fluid channels into the outer fluid if the first temperature is greater than the environmental temperature or less than the environmental temperature, respectively. In this embodiment, the when the polymer defining the inner fluid channel is flexible or elastic, the pressure of a fluid in the inner fluid channel may increase the cross-sectional dimensions of the inner fluid channel such that it reduces the cross-sectional area of the outer fluid channel, and thus reduces the volume of the outer fluid flowing through the outer fluid channel and reduces the transfer of heat into or out of the outer fluid channel. In this embodiment, the pressure of the inner fluid may be adjusted to quickly change the heating or cooling in the active area of the fluid transfer film. In this embodiment, the change in rate of heat transfer in the active region may occur very quickly relative to adjusting the temperature of the outer fluid. Similarly, in this embodiment, the pressure of the outer fluid may be increase relative to the inner fluid in the inner fluid channel such that the volume of fluid in the outer fluid channel may be increase. In some embodiments, the pressure and/or flow rates of the inner fluid and/or the outer fluid may be increased or decreased to control the volume and/or flow rate of fluid through the inner and/or outer fluid channels, which may be useful when the fluid transfer film is used in a warming blanket, cooling blanket, radiator, or thermal transfer device, or other device disclosed herein wherein one or more properties in the active region are changed, for example.

In one embodiment, a fluid transfer film comprises first fluid channels and second fluid channels, wherein the first fluid channels are coaxial with the second fluid channels and share a common geometric central axis. For example, in one embodiment, a first fluid channel with a circular cross-section may comprise a second fluid channel sharing the same central common axis within the first fluid channel. In this embodiment, the cross-sections of the channels in the cross direction represent concentric circles. The cross-sectional shapes do not need to be circular, and may be, for example, elliptical, asymmetrically shaped elliptical, triangular, rectangular, square, or other shape disclosed herein. In one embodiment, a fluid transfer film comprises first fluid channels and second fluid channels, wherein the flow of a first fluid in the first fluid channels is opposite in direction to the flow of a second fluid in the second fluid channels. In this embodiment, the second fluid channels could be within the first fluid channels.

Different Flow Rates in Different Channels

In one embodiment, the fluid transfer film comprises a first set of fluid channels and a second set of fluid channels (that may or may not have the same cross-sectional shape as the first set of fluid channels) wherein the flow rate of a first fluid in the first set of fluid channels is less than the flow rate of a second fluid (which may be the same as the first fluid) in the second set of fluid channels. In one embodiment, at a particular time, a device comprising a fluid transfer film comprising a first set of fluid channels and a second set of fluid channels adjusts the flow rate of a first fluid in the first set of fluid channels such that it is less than one selected from the group of 80, 70, 60, 50, 40, 30, 20, 10, 5, and 2 percent of the flow rate of a second fluid (which may be the same as the first fluid) in the second set of fluid channels. In another embodiment, at a particular time, a device comprising a fluid transfer film comprising a first set of fluid channels and a second set of fluid channels adjusts the flow rate of a first fluid in the first set of fluid channels such that is greater than the flow rate of a second fluid (which may be the same as the first fluid) in the second set of fluid channels by one selected from the group of 80, 70, 60, 50, 40, 30, 20, 10, 5, and 2 percent of the flow rate of a second fluid.

Surface Energy

In one embodiment, the fluid transfer film comprises a material on one or more surfaces defining one or more channels with a surface free energy (SFE) at 20° C. in mN/m$^2$ less than one selected from the group: 50, 45, 40, 35, 30, 25, 20, and 10. In other embodiments, a higher surface free energy on one or more surfaces defining one or more channels is desired and the surface free energy (SFE) at 20° C. in mN/m$^2$ is greater than one selected from the group: 50, 45, 40, 35, 30, 25, 20, and 10.

In one embodiment, two fluids (such as air and a liquid) are positioned within the active region of the fluid transfer component. In one embodiment, when the fluid is in contact with one or more surfaces that define one or more channels within the fluid transfer component, the liquid creates small air pockets beneath the liquid and the surface. In one embodiment, the surface, liquid, and air create a condition of contact angle hysteresis. In one embodiment, the contact angle hysteresis is a thermodynamic hysteresis based on surface roughness or surface homogeneity. In one embodiment, the surface relief profile comprises a randomly rough surface and a low contact angle hysteresis, which means that the liquid droplet is not able to wet the microstructure spaces between the protruding surface relief features.

In one example, $\gamma \cos \theta^* = f_1(\gamma_{1,sv} - \gamma_{1,sl}) + (1 - f_1)\gamma$ where $\gamma$ is the Cassie-Baxter surface tension between the liquid and gas, the $\gamma_{1,sv}$ is the solid vapor surface tension and $\gamma_{1,sl}$ is the solid liquid surface tension, $f_1$ is the fraction of solid surface area wet by the liquid, and $\theta^*$ is the apparent contact angle which corresponds to the stable equilibrium state (i.e. minimum free energy state for the system).

Wettability

In one embodiment, the fluid transfer film comprises a material on one or more surfaces with a high degree of wettability with the fluid. In one embodiment, the contact angle of the fluid with one or more surfaces of fluid transfer film defining one or more channels is less than one or more selected from the group: 90, 80, 70, 60, 50, 40, 30, 20, 10, 5 and 1 degree. In another embodiment, the fluid transfer film comprises a material on one or more surfaces with a low degree of wettability with the fluid. In one embodiment, the contact angle of the fluid with one or more surfaces of fluid transfer film defining one or more channels is greater than one or more selected from the group: 90, 100, 110, 120, 130, 140, 150, 150, 170, 175, and 179 degrees. In one embodiment, one or more channels comprise alternating regions of high wettability and low wettability in the flow direction or a direction orthogonal to the flow direction.

Wettability Gradients

In one embodiment, one or more channels comprise alternating high and low wettability regions or wettability gradients smoothly or discretely varying in the flow direction or a direction orthogonal to the flow direction. Wettability gradients can assist with fluid flow by providing a self-propelling interaction between a surface and a fluid. For example, a channel with alternating hydrophobic and hydrophilic surface features along one or more of the inner fluid channel surfaces in the flow can promote fluid flow through the channel, thus requiring less energy for a fluid flow source such as a pump, for example. In another embodiment, surface gradient coatings (such as those made by precision laser cutting) or surface gradient features on one or more interior surfaces of the fluid channels may be used to control the rate and or flow resistance for one or more channels individually or cumulatively. Examples of gradient surface energy coatings and features that may be used on or in one or more layers or channels or inner surfaces of fluid channels may be found in U.S. Patent application publication Nos. US2016038940 and US2014295565, the entire contents of each are incorporated by reference herein.

Leidenfrost Effect

When a liquid drop is placed on a surface held at a temperature much higher than the liquid's boiling point (such as a drop of water in a very hot pan) it hovers on its own vapor cushion, without wetting the surface. This phenomenon is called film-boiling and occurs beyond a surface temperature called the Leidenfrost point (about 200-300° C. for water on flat surfaces, depending on surface quality). In one embodiment, the fluid transfer component comprises a fluid within a channel defined by surface relief features wherein when the surface temperature is at the Leidenfront point temperature or higher for the surface and fluid the flow resistance is reduced. In another embodiment, the fluid transfer component comprises a fluid within a channel defined by surface relief features asymmetrically shaped in the flow direction wherein when the surface temperature is at the Leidenfront point temperature or higher for the surface and fluid the fluid self-propels or a proportion of the fluid flow is derived from the Leidenfrost effect. In one embodiment, the asymmetrically shaped surface features are substantially continuous around the perimeter in the plane orthogonal to the fluid flow direction. For example, in one embodiment, the surface features of in inner surface of a fluid transfer component defining one or more channels comprises skewed triangular grooves in a cross-sectional view parallel to the fluid flow direction. In one embodiment, the asymmetrically shaped surface may be ratcheted to promote flow in the flow direction when the temperature of the surface reaches or exceeds the Leidenfrost temperature.

In one embodiment, the fluid transfer component comprises one or more gas channels operatively coupled to one or more liquid channels such that the vapor generated in the liquid channels may flow into the gas channel. In one embodiment, the ratio of the average inner dimension (such as a diameter of the circle if the channel has a circular cross-section) of the liquid channel to the average inner dimension of the gas channel is greater than one selected from the group: 1, 2, 4, 6, 8, and 10. Examples of channel geometries, methods of manufacturing, gas channel and liquid channel combinations, and using the Leidenfrost effect to propel a liquid are disclosed in WIPO patent application publication number (WO) 2006121534, the entire contents of which are incorporated by reference herein.

In one embodiment, the temperature of the surface of one or more channels of a fluid transfer component is increased to a temperature above the Leidenfrost temperature for the fluid and surface by solar absorption. For example, in one embodiment, the bottom surface relief profile defining the bottom of one or more channels in a fluid transfer component used in solar thermal heating system is absorbing to solar radiation (such as a black or IR absorbing material) such that the temperature of the bottom surface increases to a temperature at or above the Leidenfrost temperature and the liquid self-propels or a proportion of the fluid flow rate is derived from the Leidenfrost effect. In another embodiment, the entire or inner surface of the channel, or a portion thereof, absorbs a portion of solar radiation. In a further embodiment, the liquid in the channel absorbs solar radiation such that a vapor is generated between the liquid and the surface of the channel and in combination with the asymmetric shapes of the surface relief features defining the channel in the flow direction, the fluid is self-propelled or the flow rate is increased. In one embodiment, the fluid transfer component comprises a solar thermal powered non-mechanical pump employing the Leidenfrost effect.

Multiple Fluid Channel Layers

In one embodiment, the fluid transfer component comprises a plurality of fluid channels in two directions orthogonal to the flow direction of the fluid in the channels. For example, in one embodiment, a fluid transfer component comprises a film including an array of surface features defining a first linear array of channels and a second film layer beneath the first layer comprising a second array of surface features defining a second linear array of channels where the first plurality of channels and second plurality of channels are separated from each other in the thickness direction. In one embodiment, a first plurality of fluid channels is disposed adjacent a second plurality of channels in the thickness direction. In another embodiment, the first plurality of channels comprises a liquid or gas and the second plurality of channels comprises a liquid or gas. For example, in one embodiment, a fluid transfer component comprises a first plurality of channels comprising air are positioned to receive light and transmit the light to a liquid within a second plurality of channels beneath the first plurality of channels. In this example, the air in the first plurality of channels may provide thermal insulation for the fluid (and the material comprising the second plurality of channels) such that the heat can efficiently be maintained within the fluid for a solar thermal application, for example.

In one embodiment, one or more fluid channels in a layer may be oriented at an angle greater than 0 degrees to one or more fluid channels in a second layer. In one embodiment, the flow direction of one channel is at an angle greater than 0 degrees to the flow direction in one or more other channels in fluid transfer component. In one example, the flow direction of a fluid in a first layer comprising a first plurality of channels is in a flow direction oriented 180 degrees (opposite) the flow direction of the fluid in a second plurality of channels.

Dynamic Channel Features

In one embodiment, the dimensions of one or more channels changes in the flow direction or changes in time. In one embodiment, the cross-sectional shape of one or more channels in a fluid transfer component change from a first point to a second point in the active region, throughout the active region, or from the fluid input coupler input end to the fluid output coupler output end. In one embodiment, the width of the channel increases, decreases, or a combination thereof in the direction of the fluid flow in the channel. In one embodiment, the channel splits into two channels (such as in a Y shaped junction or a T shaped junction) or more channels (such as a 1 to 3 channel splitter, or 1 to 4 channel or larger splitter).

In one embodiment, the size of one or more dimensions of one or more fluid channels increases or decreases with time. In one embodiment, the size of one or more channels increases. For example, in one embodiment, a plurality of thermally insulating channels may inflate due to air being pumped through the channels to inflate the channel and improve thermal resistance. In another embodiment, one or more channels may increase or decrease in response to an increase or decrease in fluid pressure and change the optical, thermal, physical or mechanical properties of one or more regions of the fluid transfer component. In one embodiment, for example, channels comprising air in a fluid transfer component in the form of a pool cover may be inflated such that they increase in size to contain a larger volume of air and increase the buoyancy of the fluid transfer component. In another embodiment, the dimensions of one or more channels in a fluid transfer component increases and decreases in size at a frequency greater than 1 cycle per second. In one embodiment, the change in dimension of a dimension of one or more channels changes at a rate of an audio frequency such that the fluid transfer component functions as a speaker. In another embodiment, the size, shape, configuration of the channels, pump pressure or flow source pressure and the rate of change of pressure are controlled such that the ambient air pressure wavefront generated from the expansion and/or contraction from one or more channels are in phase with each other.

Channel Openings

In one embodiment, one or more channels comprise one or more openings that fluidly connect the channel to a different layer or the ambient environment. For example in one embodiment, the fluid transfer component is configured to deliver a liquid through an array of channel openings to an area of an object adjacent the active region of the fluid transfer region such as in the case of applying an array of chemicals to a substrate comprising biological or chemical reagents or assays. In another example, the fluid transfer component is configured to deliver warm and/or cool air through an area comprising a plurality of channel openings (or ports or tunnels fluidly connected to the channels) distributed across the area to provide more uniformly distributed warming and/or cooling to an environment. Similarly, a fluid may be collected across an area of the active region comprising channel openings by reducing the pressure in channels such that the fluid flows from the environment into one or more channels through one or more channel openings (or ports or tunnels fluidly connected to the channels). In one embodiment, a laser generates one or more openings in one or more channels by ablating one or more areas of material between a layer adjacent the one or more channels and the one or more channels or between the environment and the one or more channels. In one embodiment, the one or more openings are formed along one or more lines in a direction orthogonal to the fluid flow direction and orthogonal to the thickness direction in the active region. In another embodiment, one or more channel openings, ports, and/or tunnels are formed by a replication process, a perforation process, an etching process or other methods known to generate openings, perforations, or holes in polymers in the polymer processing industry.

Cross-Channel Openings

In another embodiment, the fluid transfer component comprises a plurality of channels in the active region wherein two or more channels have one or more openings between the channels (cross-channel openings). In this embodiment, the openings extend in a direction orthogonal to the fluid flow direction and orthogonal to the thickness direction of the film or layer or fluid transfer component (and may also be orthogonal to an array direction of an array of fluid channels). In one embodiment, these openings provide for fluid flow between the channels. For example, in one embodiment, the fluid transfer system comprising a fluid transfer component collects a fluid from an environment wherein only a first subset of channels comprise channel openings which extend in the thickness direction that are exposed to the fluid directly. In this embodiment, the flow rate (and potentially total volume) of the liquid from the environment is limited by the number of channels exposed to the liquid through the openings. In this embodiment, one or more channels comprise cross-channel openings that connect the first subset of channels to a second subset of channels that enable additional flow paths and higher flow rates (and potentially higher total volume) to flow through the channels by some of the fluid also flowing through the second subset of channels (which may not have openings in the thickness direction, or may not have openings in the thickness direction directly exposed to the fluid from the environment). For example, in one embodiment, a food package comprising a microcapillary film or sheet comprises fluid channels and openings in the thickness direction in order to collect fluid that drains onto the film or sheet. Examples of materials, configurations, and methods of manufacturing microcapillary films for food package are disclosed in US Patent Application Publication No. US20170253410, the entire contents of which are incorporated by reference herein. With only openings in the thickness direction, the ability to collect the fluid (and the maximum total fluid collected) is limited by the location of the fluid (such as a puddle on the film or sheet) and the length of the channels. In this embodiment, by adding cross-channel openings, the fluid could flow into channels it might not otherwise flow into from the external environment directly. In one embodiment, the cross-channel openings are created by extruding a microcapillary film with an internal film or layer that defines at least a portion of the inner surface of neighboring channels. In this embodiment, the internal film or layer may comprise, for example, infrared absorbing pigment, dye, or material (such as Lumogen® IR 765 from BASF Colors & Effects USA LLC or other infrared light absorbing dyes or pigments used for laser welding). In another embodiment, other pigments that absorb wavelengths such those in the visible or ultraviolet wavelength spectrum may be used along with light sources, such as lasers, emitting light in the visible or ultraviolet wavelength spectrum, respectively. For example, the fluid flowing through to a microcapillary die comprising microcapillary pins could be configured to be a layer of low-density polyethylene comprising an infrared light absorbing additive between two layers of low-density polyethylene that do not comprise the infrared light absorbing additive. When the film is extruded, and optionally drawn down, the inner layer comprising the infrared light absorbing additive may substantially centrally located in thickness direction of the film (and optionally centrally located between the dimensions of the fluid channels in the thickness direction such that when exposed to infrared radiation, the layer or region is selectively heated. For example, an infrared laser could scan across the active region of the fluid transfer film and illuminated in dots and/or lines or other patterns different regions between two or more channels such that at least a portion of the channel walls heat and collapse, withdraw, melt, flow into channels, ablate, vaporize, or otherwise open up cross-channel openings. In this embodiment, a pressure above ambient air pressure may be applied to air or fluid within the fluid channels and/or along an edge of the film or fluid transfer component such that when heated, the heated polymer does not block the channel. In one embodiment, the air and/or fluid may be heated to prevent fast cooling and/or aid in the localized heating by the laser by pre-heating, for example. In another embodiment, the fluid transfer component comprises a two layer region wherein one layer is continuous across the active region of the fluid transfer component orthogonal to the fluid flow direction and the thickness direction and this layer may optionally form an upper or lower surface of the fluid channel. In this embodiment, the fluid transfer component may optionally comprise additional layers on either side of the layer comprising the infrared-light absorbing material. In one embodiment, heating the layer using infrared radiation, such as from a laser, selectively heats the layer and cross-channel openings may form instead of, or in addition to openings in the thickness direction. In one embodiment, the average separation between the fluid channels in the active region of a fluid transfer component in a direction orthogonal to the direction of fluid flow and thickness direction of the film or component is less than one selected from the group 400, 300, 200, 150, 100, 75, 50, 25, 10, and 5 micrometers. In another embodiment, the average continuous material thickness (a thickness not separated by air gaps) of the fluid transfer component above or below (in the thickness direction) the fluid channels is greater than one selected from the group 700, 600, 500, 400, 300, 200, 150, 100, 75, 50, and 25 micrometers, and optionally greater than the average separation between the fluid channels in the active region of a fluid transfer component in a direction orthogonal to the direction of fluid flow and thickness direction of the film or component. In one embodiment, the cross-channel openings do not extend through an upper and/or lower surface of the film, layer, fluid transfer component, or region of the fluid transfer component comprising the fluid channels in the thickness direction of the film, layer, or component.

Bending or Looping Channels

In one embodiment, one or more channels in the fluid transfer component comprise a loop or curve in the channel. In another embodiment, one or more channels are angularly redirected by one or more curves such that the flow direction is rotated by about 90 degrees through a single 90 degree bend, two 45 degree bends, two non-45 degree bends combining to form a 90 degree change in flow direction, or three or more bends resulting in a 90 degree change in flow direction. In another embodiment, one or more channels are angularly redirected by one or more curves such that the flow direction is rotated by about 180 degrees through a single 180 degree bend, two 90 degree bends, two non-ninety degree bends combining to form a 180 degree change in flow direction, or three or more bends resulting in a 180 degree change in flow direction. By bending channels, the flow of the fluid can be directed to input couplers on adjacent sides of the active region of the fluid transfer element (such as in the case of channels with a total flow direction change of 90 degrees) or the fluid can be directed back to the same coupler or an output coupler along the same side of the fluid transfer component. In embodiments where the channels flow back to the same fluid coupler, a first portion of the fluid coupler may function as a fluid input coupler (such as the side of the coupler surface closer to the active region in a fluid channel geometry converter coupler) and a second portion of the fluid coupler may function as the fluid output coupler (such as the side of the coupler surface further from the active region in a fluid channel geometry converter coupler). Similarly, in some embodiments where the channels flow back to the same fluid coupler, a first portion of the fluid coupler may function as a fluid input coupler (such as the side of the coupler surface comprising the longer segment in a fluid channel geometry converter coupler) and a second portion of the fluid coupler may function as the fluid output coupler (such as the side of the coupler surface comprising the shorter segment in a fluid channel geometry converter coupler). In the embodiments where the channels loop back to the same coupler, first pipes, tubes, or fluid carrying members may be positioned adjacent (in a horizontal or vertical direction, for example) to second pipes, tubes, or fluid carrying members to provide fluid supply and fluid return. In this example, the supply and return lines may be advantageously positioned adjacent each other, which can provide reduced parts, sharing of common supply or return insulation or other plumbing benefits. In another embodiment, one or more channels comprise a 180 degree bend such that the channels from a first input coupler fluid channel geometry converter extend through the active region, bend, pass back through the active region and extend into the output end of a fluid channel geometry converter output coupler along the same side of the active region. In this embodiment, the fluid and supply lines may be positioned along the same side of the active region of the fluid transfer component which may enable a smaller volume or more compact configurations.

Separation Channels

In one embodiment, one or more channels may be configured to be separation channels that perform one or more of the functions: facilitate separation of the channels, maximize the yield, volume, or area of material comprising the channels, and guide the separation of segments of channels such that the separation does not extend into two channels where fluid could leak. In one embodiment, a separation channel is positioned between two channels and in a cross-section of the fluid transfer component, the dimension of the separation channel in a direction transverse to the direction of fluid flow is less than the dimension of the two channels in the same direction. For example, in one embodiment, fluid channels have relatively wide cross-sectional widths and in order to reduce the wasted volume of material and maximize coupling area in an input coupler, the cross-sectional width of a separation channel between two fluid channels is less than the cross-sectional width of the fluid channels. In one embodiment, a fluid transfer component comprises at least one separation channel comprising at least one separation feature such as a groove, perforation, or thinner side wall wherein separation of the segments of the fluid transfer component on either side of the separation feature is facilitated. For example, in one embodiment, a fluid transfer component comprises a plurality of channels with a cross-sectional profile in the shape of a standard multi-walled polycarbonate panel (though not necessarily made of polycarbonate nor of the same size scale as traditional multiwall polycarbonate panels) with substantially rectangular fluid channels and the fluid transfer component further comprises separation channels between the rectangular channels. In this embodiment, one or more top and/or bottom surfaces of the separation channels may be perforated such that strip segments extending from a film based fluid transfer component may be formed by readily tearing, cutting or separating regions of the film based fluid transfer component comprising pluralities of fluid channels. In another embodiment, the top and/or bottom walls of the separation channel are thinner than the top and/or bottom walls of the fluid channels such that the fluid transfer component may be more readily torn, cut, or have regions separated along the channel by tearing, cutting, or separating the fluid channels along the top and/or bottom surface of the separation channels. In one embodiment, the thickness of one or more walls, surfaces, or perforations of one or more walls or surfaces is generated by the microreplication or channel forming manufacturing step. For example, in one embodiment, a film used to create corrugated flutes in a film that define fluid channels comprises a perforation line parallel to the flow direction at a repeated or regular interval such that the film may be more readily torn, cut, or separated along the line. In another embodiment, the fluid transfer component comprises one or more separation channels configured along or near the peripheral edges of the active region of the fluid transfer element to facilitate extraneous material removal or define and/or separate a plurality of active regions.

Channel Defining Elements

In one embodiment, the channel supporting and/or defining elements comprise one or more surfaces or elements selected from the group: surface relief surface of a layer or component, cover layer, adhesive joining two or more components, a sealant between two surfaces, inner or outer walls of a surface relief component or hollow component (such as hollow fibers), a substrate layer, a protective layer, a coating, or other region, layer, or material within the fluid transfer element or system.

Channel Number and Thickness

In one embodiment, the fluid transfer component comprises a multitude of microstructured channels. In one embodiment, the fluid transfer component comprises a single channel or more than 1, 2, 3, 4, 5, 10, 20, 50, 100, 1,000, 10,000, 100,000, 1,000,000, or 10,000,000 channels. The more channels that are connected to a flow source allow the desired effect (such as optical or thermal) to be more highly distributed. Channels defined by one or more microstructured surfaces in accordance with one or more embodiments provide fluid transfer components in which the fluid volume of the system is highly distributed in the active region of the fluid transfer component. That is, the fluid volume that passes through channels in the active region of the fluid transfer component is distributed over a large area. In one embodiment, the fluid transfer component comprises a channel density at the fluid input coupler, fluid output coupler, or across the active region of the fluid transfer component in a first direction greater than one selected from the group 1, 2, 5, 10, 15, 20, 40, 60, 100, 200, 500, 1000, 10,000, 20,000, 50,000, and 100,000 channels per centimeter.

The number of channels may reduce or increase in one or more directions. For example one or more channels may merge or split together. For example, the channels could have varying cross-sectional widths along the channel length; that is, the channels could diverge and/or converge along the length of the channel. The channel sidewalls could also be contoured rather than being straight in the direction of extension of the channel, or in the channel height. Generally, any channel configuration that can provide at least multiple discrete channel portions that extend from the input side to the output side within the fluid transfer component are contemplated.

Channel Volume

In one embodiment, the percentage of the volume of the film (such as the microcapillary film) or layer comprising the channels of the fluid transfer component occupied by the channels (such as voidage volume) in the active region is greater or less than one selected from the group 1%, 5%, 10%, 15%, 20%, 25%, 30%, 35%, 40%, 50%, 55%, 60%, 65%, 70%, 75%, 80%, 90%, 95%, 97%, and 98%. In another embodiment, the percentage of the volume of the matrix (the material not including the voids or interior volume of the channels) of the film, fluid transfer component, or material defining the channels in the film (such as the microcapillary film) or layer comprising the channels of the fluid transfer component in the active region is greater or less than one selected from the group 1%, 3%, 5%, 7%, 10%, 15%, 20%, 25%, 30%, 35%, 40%, 50%, 55%, 60%, 65%, 70%, 75%, 80%, 90%, 95%, 97%, and 98%.

Coatings or Layers Surfaces or Regions within Component

In one embodiment, one or more selected from the group: the fluid, a surface defining a channel for the fluid, and the volume of the material defining one or more surfaces of a channel comprises a surfactant. In one embodiment, one or more surfaces defining one or more fluid channels are modified through vapor deposition or covalent grafting of functional moieties using ionizing radiation. Methods and techniques for graft-polymerization of monomers onto polypropylene, for example, by ionizing radiation are disclosed in U.S. Pat. Nos. 4,950,549 and 5,078,925, the entire contents of each are incorporated by reference herein. In one embodiment, a coating or layer surface, or a region within a fluid transfer component comprises a coating applied by co-extrusion, wet coating, gravure coating, chemical vapor deposition, plasma enhanced vapor deposition, vacuum deposition, lamination, or material transfer.

Any suitable known method may be utilized to achieve a desired wettability, such as a highly or superhydrophilic surface, on one or more surfaces of fluid transfer components in one or more embodiments. Surface treatments may be employed such as topical application of a surfactant, plasma treatment, vacuum deposition, polymerization of hydrophilic monomers, grafting hydrophilic moieties onto the film surface, corona or flame treatment, etc. Alternatively, a surfactant or other suitable agent may be blended with the resin as an internal characteristic altering additive at the time of film extrusion. It is typically preferred to incorporate a surfactant in the polymeric composition from which the fluid transfer component is made rather than rely upon topical application of a surfactant coating, since topically applied coatings may tend to fill in (i.e., blunt), the notches of the channels, thereby interfering with the desired liquid flow to which the embodiment is directed. When a coating is applied, it is preferably thin to facilitate a uniform thin layer on the structured surface. An illustrative example of a surfactant that can be incorporated in fluid transfer components comprising polyethylene is TRITON™ X-100 (available from Union Carbide Corp., Danbury, Conn.), an octylphenoxypolyethoxyethanol nonionic surfactant, e.g., used at between about 0.1 and 0.5 weight percent.

Other surfactant materials that are suitable for increased durability requirements for industrial applications of the present embodiment include Polystep® B22 (available from Stepan Company, Northfield, Ill.) and TRITON™ X-35 (available from Union Carbide Corp., Danbury, Conn.).

As discussed above, a surfactant or mixture of surfactants may be applied to the surface of the fluid transfer component or impregnated into the article in order to adjust the properties of the fluid transfer component or a region thereof. For example, it may be desired to make the inner surface of a surface relief feature defining one or more surfaces of a fluid channel in a fluid transfer component more hydrophilic than the surface would be without such a component.

Preferred embodiments of the present embodiment retain the desired fluid transfer properties throughout the life of the product into which the fluid transfer component is incorporated. In order to ensure the surfactant is available throughout the life of the fluid transfer component the surfactant preferably is available in sufficient quantity in the article throughout the life of the article or is immobilized at the surface of the fluid transfer component. For example, a hydroxyl functional surfactant can be immobilized to a fluid transfer component by functionalizing the surfactant with a di- or tri-alkoxy silane functional group. The surfactant could then be applied to the surface of the fluid transfer component or impregnated into the article with the article subsequently exposed to moisture. The moisture would result in hydrolysis and subsequent condensation to a polysiloxane. Hydroxy functional surfactants, (especially 1,2 diol surfactants), may also be immobilized by association with borate ion. Suitable surfactants include anionic, cationic, and non-ionic surfactants, however, nonionic surfactants may be preferred due to their relatively low irritation potential. Polyethoxylated and polyglucoside surfactants are particularly preferred including polyethoxylated alkyl, aralkyl, and alkenyl alcohols, ethylene oxide and propylene oxide copolymers such as "Pluronic" and "Tetronic", alkylpolyglucosides, polyglyceryl esters, and the like. Other suitable surfactants are disclosed in U.S. patent application Ser. No. 08/576,255, the entire contents are incorporated by reference herein.

As discussed above, a surfactant such as a hydrophilic polymer or mixture of polymers may be applied to the surface of the fluid transfer component or impregnated into the article in order to adjust the properties of the fluid transfer component or article. Alternatively, a hydrophilic monomer may be added to the article and polymerized in situ to form an interpenetrating polymer network. For example, a hydrophilic acrylate and initiator could be added and polymerized by heat or actinic radiation.

Suitable hydrophilic polymers include: homo and copolymers of ethylene oxide; hydrophilic polymers incorporating vinyl unsaturated monomers such as vinylpyrrolidone, carboxylic acid, sulfonic acid, or phosphonic acid functional acrylates such as acrylic acid, hydroxy functional acrylates such as hydroxyethylacrylate, vinyl acetate and its hydrolyzed derivatives (e.g. polyvinylalcohol), acrylamides, polyethoxylated acrylates, and the like; hydrophilic modified celluloses, as well as polysaccharides such as starch and modified starches, dextran, and the like.

As discussed above, a hydrophilic silane or mixture of silanes may be applied to the surface of the fluid transfer component or impregnated into the article in order to adjust the properties of the fluid transfer component or article. Suitable silane include the anionic silanes disclosed in U.S. Pat. No. 5,585,186, the entire contents are incorporated by reference herein, as well as non-ionic or cationic hydrophilic silanes. Cationic silanes may be preferred in certain situations and have the advantage that certain of these silanes are also believed to have antimicrobial properties.

Physical Coatings or Layers

In one embodiment, one or more surfaces defining one or more channels in the fluid transfer component comprises a substantially or completely amorphous film including carbon, and optionally including one or more additional components selected from the group of hydrogen, nitrogen, oxygen, fluorine, silicon, sulfur, titanium, and copper. Other elements may be present in certain embodiments. In one embodiment, the substantially or completely amorphous film is a "diamond like" film discussed in U.S. Pat. Nos. 6,749,813 and 6,696,157, the entire contents of each are incorporated by reference herein. For fluid handling surfaces, hydrophilic diamond-like films can provide hydrophilic surfaces that enhance fluid transfer. Furthermore, if desired, such films can include linking agents for affixing reactants or otherwise altering the surface chemistry. The films can also function as a barrier to liquid evaporation and transmission through the substrate of which the device is made. In one embodiment, the fluid transfer component comprises a class of interpenetrating diamond-like films. These diamond-like thin films are called DYLYN and are interpenetrating systems of two materials. These interpenetrating diamond-like thin films are disclosed in U.S. Pat. No. 5,466,431, the entire contents are incorporated by reference herein.

In one embodiment, one or more surfaces of the fluid transfer component defining a channel comprise one or more coatings that alter one or more selected from the group: surface tension, antibacterial properties, anti-algae properties, thermal conductivity, electrical conductivity, Young's modulus, heat deflection temperature, oxygen permeability, moisture permeability, and flexibility. In one embodiment, the fluid transfer component comprises a polymeric film substrate having a first major surface and a second major surface opposite the first major surface, and a protective structure provided on at least the first major surface of the substrate, wherein the protective structure comprises a layer of boron oxide and an inorganic barrier layer. A protective structure may also be provided on the second major surface of the substrate. Organic electronic components may be formed on or attached to the protected polymeric films. Examples of films and configurations with a boron oxide coating are disclosed in U.S. Pat. No. 7,468,211, the entire contents are incorporated by reference herein.

In one embodiment, one or more surfaces of the fluid transfer component comprises a hydrophilic coating comprising a transparent gel material including a polymerized monofunctional poly(alkylene oxide) macromonomer component and a surface modified nanoparticle component such as disclosed in U.S. patent application publication 2011/0245077, the entire contents are incorporated by reference herein.

Optical Coatings or Layers

Optical coatings or layers may be used with the fluid transfer component to affect the optical properties or performance of the fluid transfer component. In one embodiment, the fluid transfer component comprises one or more optical coatings selected from the group: ultraviolet light absorbing, ultraviolet light reflecting, infrared light absorbing, infrared light absorbing, visible light reflecting, visible light absorbing, anti-reflection, diffuse surface reflecting, optically clear hardcoating or scratch-resistant coating, black layer or coating, reflective metal foil layer or coating, coating or layer comprising reflective particles (such as aluminum or coated silver particles), titanium dioxide particles, or barium sulfate particles, coating or layer comprising light absorbing or reflecting flakes, coating or layer comprising one or more lenses, coating or layer comprising an array of linear lenses, coating or layer comprising an array of concave lenses, coating or layer comprising an array of convex lenses, coating or layer comprising diffractive features, coating or layer comprising refractive lenses, coating or layer comprising total internal reflection features, a birefringent coating or layer, and a birefringent coating or layer comprising birefringent particles.

Methods for applying the coatings include, but are not limited to spray deposition, chemical vapor deposition, plasma enhanced chemical vapor deposition, evaporation, sputtering, dipping, wet coating, inkjet coating, gravure coating, electroplating, or using other coating methods.

Spatially Varying Optical Coatings or Layers

In one embodiment the fluid transfer component comprises spatially varying optical coatings or layers. In one embodiment, the optical coating or layer varies in the fluid flow direction, or a direction orthogonal to the fluid flow direction. For example, in one embodiment, the fluid transfer component comprises an array of apertures in a layer with a flexible membrane beneath the layer. When fluid pressure is increased beneath the flexible membrane, the membrane expands and forms convex lenses that focus light.

Permanently Wet Slippery Surface Coating

In one embodiment the fluid transfer component comprises one or more surfaces on one or more layers and/or the inner surfaces of the fluid channels with a permanently wet, liquid impregnated surface which is designed to by "hyper slippery" such that the fluid sits on a layer of liquid. In one embodiment, the surface comprises highly textured surface with a matrix of features that stably contain an impregnating liquid that fills the spaces between the surface relief features. A liquid-impregnated surface includes a first surface having a first roll off angle. In another embodiment, a plurality of solid features are disposed on the first surface, such that a plurality of interstitial regions are defined between the plurality of solid features. In this embodiment, an impregnating liquid is disposed in the interstitial regions and the interstitial regions are dimension and configured such that that the impregnating liquid is retained in the interstitial regions by capillary forces. In this embodiment, the impregnating liquid disposed in the interstitial regions defines a second surface having a second roll off angle less than the first roll off angle. In one embodiment, the solid features, or surface relief features for one or more of the aforementioned surfaces define interstitial regions between the plurality of solid features. In some embodiments, the solid surface relief features can be posts, spheres, micro/nano needles, nanograss, pores, cavities, interconnected pores, inter connected cavities, any other random geometry that provides a micro and/or nano surface roughness. In some embodiments, the height of the solid surface relief features can be greater or less than 10 micrometers, 20 micrometers, 30 micrometers, 40 micrometers, 50 micrometers, 60 micrometers, 70 micrometers, 80 micrometers, 90 micrometers, 100 micrometers, 200 micrometers, 300 micrometers, 400 micrometers, 500 micrometers, 600 micrometers, 700 micrometers, 800 micrometers, 900 micrometers, up to about 1 mm, inclusive of all ranges therebetween, or any other suitable height for receiving the impregnating liquid. In some embodiments, the height of the solids features can be less than about 1 micrometer. For example, in some embodiments, the solid features can have a height of about 1 nanometer, 5 nanometers, 10 nanometers, 20 nanometers, 30 nanometers, 40 nanometers, 50 nanometers, 100 nanometers, 200 nanometers, 300 nanometers, 400 nanometers, 500 nanometers, 600 nanometers, 700 nanometers, 800 nanometers, 900 nanometers, or about 1,000 nanometers, inclusive of all ranges therebetween. Furthermore, the height of solid features can be, for example, substantially uniform. In some embodiments, the solid features can have a wenzel roughness "r" greater than about 1.01, 1.05, 1.1, 1.2, 1.3, 1.4, 1.5, 1.6, 1.7, 1.8, 1.9, 2.0, 2.5, 3, 5, or about 10. In some embodiments, the solid features can have an interstitial spacing, for example, in the range of about 1 micrometer to about 100 micrometers, or about 1 nanometer to about 1 micrometer. In some embodiments, the solid surface relief can have hierarchical features, for example, micro-scale features that further include nano-scale features thereupon. In some embodiments, the surface can be isotropic. In some embodiments, the surface can be anisotropic. Examples of permanently wet, liquid impregnated surfaces, properties of the features, liquids, and materials, suitable materials and liquids, methods of producing, methods of increasing the durability (durability enhancement) such as providing a supply of impregnating liquid, coatings or surface modification to enhance the adhesion of the impregnating liquid, additives for the liquid or surface material, and other features, configurations and embodiments are disclosed in International Patent Application Published under the Patent Cooperation Treaty (PCT) Publication No. WO 2014/145414 and U.S. Pat. No. 8,574,704, the contents of each are incorporated by reference herein. In one embodiment, a permanently wet, liquid impregnated surface coated is applied to one or more surfaces of one or more layers or one or more inner surfaces of the fluid channels and reduces the flow resistance of the fluid through the fluid channels.

Thermally Insulating Layers or Regions

In one embodiment, a fluid transfer component comprises a thermally insulating layer or region between the plurality of channels and the outer surface of the fluid transfer component in the active region. In another embodiment, a fluid transfer component comprises a thermally insulating layer or region between the plurality of channels and both outer surfaces of the fluid transfer component in the active region. A thermally insulating layer or region can reduce thermal losses in at least the active region due to thermal radiation, convection, conduction. For example, in one embodiment, a thermal transfer component comprises a first thermally insulating layer comprising a light transmitting porous material is positioned between the outer light receiving surface of a fluid transfer component and interior fluid channels. A second thermally insulating layer comprising a light reflective porous material is positioned between the opposite major surface of the fluid transfer component (the surface opposite the light receiving surface) and the interior fluid channels. In this embodiment, the first thermally insulating layer thermally insulates the fluid and/or the channels comprising the fluid from the ambient environment at the front of the fluid transfer component. In this embodiment, the first thermally insulating layer reduces thermal losses due to thermal convection and thermal conduction. In this embodiment, the second thermally insulating layer thermally insulates the fluid and/or the channels comprising the fluid from the ambient environment at the back of the fluid transfer component. In this embodiment, the second thermally insulating layer reduces thermal losses due to thermal convection, thermal conduction, and thermal radiation since a portion of the thermal radiation from the fluid and/or the material defining the channels is reflected back into the fluid and/or channel region of the fluid transfer component. In one embodiment, one or more thermally insulating layers comprises surface relief features that form regions wherein two surfaces are separated by an air gap. In one embodiment, the surface of a thermally insulating layer comprises surface relief structures separated by an air gap or other fluid gap from a planar surface or surface comprising surface relief features. In one embodiment, the thermally insulating layer is defined in the active region of the thermal transfer component by one or two substantially planar surfaces. For example, in one embodiment, the thermal transfer component comprises two glass sheets (such as window panes) between the outer surface of the thermal transfer component exposed to the outer ambient environment and a plurality of channels wherein the two glass window panes are separated and may comprise air or an inert gas between the glass sheets. In another embodiment, the fluid transfer component is positioned between two glass sheets such that an air or other fluid is positioned between the thermal transfer component and either glass pane and the air or other fluid functions as a thermally insulating layer.

In one embodiment, the thermal transfer component comprises one or more thermally insulating layers with a thermal conductivity less than one selected from the group: 100, 10, 5, 1, 0.5, 0.1, 0.05, 0.025, 0.02, and 0.01 $W \cdot m^{-1} \cdot K^{-1}$ at 298 degrees Kelvin.

In one embodiment, the thermally insulating layer comprises a silica aerogel; hollow beads (glass or polymeric); a mesh, collection, weave, or roving of fibers (solid or porous fibers); a porous material such as a film comprising pores generated through orientation and/or stretching of the film or a porous insulating material such as disclosed in U.S. patent application publication no. 20030129379, the entire contents are incorporated by reference herein; a nanostructured material; or a microstructured material. In one embodiment, the thermally insulating material, layer, or region is formed or the thermal conductivity is reduced by inflating the thermally insulating material, layer, or region. In another embodiment, the thermally insulating layer is inflated by pumping air or other gas through one or more channels in one or more layers of the fluid transfer component.

Active Region Area

The corresponding planar area of the active region of a fluid transfer component is the area of the plane defined by the outer edges of the active region when the active region of the fluid transfer component is shaped in a flat format (such as rolled out onto a flat surface or the fluid transfer film before thermoforming into a non-planar shape). In one embodiment, the fluid transfer component comprises an active region with a corresponding planar surface area greater than one selected from the group 0.01, 0.05, 0.1, 0.2, 0.4, 0.6, 0.8, 1, 1.2, 1.4, 1.6, 1.8, and 2 square meters. In one embodiment, the fluid transfer component comprises an active region with a corresponding planar surface area less than one selected from the group 0.01, 0.05, 0.1, 0.2, 0.4, 0.6, 0.8, 1, 1.2, 1.4, 1.6, 1.8, and 2 square centimeters.

Active Region Thermal Properties

In one embodiment, the active region of the fluid transfer component captures heat from its surroundings and transfers the heat through fluid flow. For example, in one embodiment, the fluid transfer component is operatively configured to conductively receive heat from an organic light emitting diode panel or an inorganic light emitting diode and transfer a portion of the heat to a fluid that transfers the heat away from the panel or diode. In one embodiment, one or more selected from the group: surface relief profile defining one or more fluid channels, fluid channel surface, layer thermally coupled to the fluid in the active region, substrate layer, optical layer, hollow component, fluid additives, coating, outer surface, and layer in a fluid transfer component comprises a first material with a thermal conductivity greater than one selected from the group: 0.1, 0.2, 0.5, 1, 2, 5, 10, 20, 30, 40, 50, 60, 70, 80, 100, 150, 200, 250, 300, 400, 500, 750, 1,000, 1,500, 2,000, 3,000, and 4,000 $W \cdot m^{-1} \cdot K^{-1}$.

In another embodiment, the active region of the fluid transfer component provides changing optical or other properties and insulates one or more regions of the component or a device or component proximate the fluid transfer component from heat. For example, in one embodiment, the active region of the fluid transfer transitions from a transparent state to a light absorbing black state. In this embodiment, the black fluid absorbs solar radiation and layers, regions, or coatings on one or both sides of the fluid channels insulates one or more layers or regions of the fluid transfer component from the heat in the fluid to reduce thermal degradation and/or maximize heat transfer. In one embodiment, one or more selected from the group: surface relief profile defining one or more fluid channels, fluid channel surface, layer thermally coupled to the fluid in the active region, substrate layer, optical layer, hollow component, fluid additives, coating, outer surface, and layer in a fluid transfer component comprises a first material with a thermal conductivity less than one selected from the group: 0.02, 0.025, 0.04, 0.05, 0.1, 0.2, 0.5, 1, 2, 5, 10, 20, 30, 40, 50, 60, 70, 80, 100, 150, and 200 $W \cdot m^{-1} \cdot K^{-1}$.

Active Region Optical Properties

In one embodiment, the optical properties of the active region of the fluid transfer component are dynamic and change from first optical state to a second optical state. Examples of optical state changes include, but are not limited to light reflecting state, light scattering state, light absorbing state, light transmitting state, and light emitting state. The active region may also change the degree or level of the property of the state. For example, the active region could change from a weakly scattering state to a strongly scattering state or from a strongly absorbing state to a weakly absorbing state. The active region could change from state with a first level of a first property to a second level of a second property, such as changing from a strongly reflecting state to a weakly absorbing state. In another embodiment, the active region may be multiple states and/or levels simultaneously, such as a diffuse light transmitting state and a forward light scattering state.

The optical properties may change based on internal or external stimulus, from a controller, a period of time, a specific time or event, response from a user, automatic conditions, feedback (electrical, optical, mechanical, thermal), response from a sensor and controller, response from a temperature sensor (such as a fluid temperature sensor or ambient air temperature) or other methods of control suitable for controlling electronic, optical, or thermal devices.

In another embodiment, the active region comprises multiple layers or regions, comprising optical states and levels that may be similar or different. For example, in one embodiment, the fluid transfer component comprises a fluid channel layer operatively configured to receive red fluid, a second fluid channel layer operatively configured to receive blue fluid, and a third layer operative configured to receive green fluid such that a specific color (transmitted or reflected) can be achieved. In another embodiment, the active layer comprises a plurality of channels (on the same or different layers) wherein the optical state and/or level or degree of the property or state is different in two or more of the channels. For example, in one embodiment, a fluid transfer component comprises an array of channels wherein a red channel is adjacent a blue channel which is adjacent to a green channel which is adjacent a red channel.

In addition to the dynamic optical properties of the active region, the active region may comprise one or more layers, coatings, regions, or spatially varying regions that have substantially static optical properties. These static optical properties may be light reflecting, light scattering, light absorbing, light transmitting, and light emitting. For example, in one embodiment, the surface relief profile defining surfaces of the fluid channels significantly scatters incident light when the fluid has a refractive index different from the surface by more than 0.01.

In one embodiment, for example, a fluid transfer component comprises a plurality of channels defined by one or more surface relief features in a film between a light transmitting thermally insulating layer and a white, light reflecting thermally insulating layer. In this embodiment, when the fluid transfer component is positioned on a roof of a building as part of a solar thermal system, a black, light absorbing fluid may be pumped or otherwise propelled by a flow source through the plurality of channels in the winter or times of cold ambient temperatures to absorb solar radiation and transfer the heat to a heat exchanger located in a building. In the summer or warm months, a substantially transparent liquid, substantially clear liquid, a liquid having a high solar transmittance, or a liquid that scatters or reflects solar radiation with significant absorption, or a gas may flow or substantially fill the plurality of channels. In this example, air may be pumped through the channels to permit the light reflecting rear thermally insulating layer to reflect ambient solar radiation from the fluid transfer component or a fluid that reflects (by scattering or reflective surfaces, for example) the solar radiation, transmits a significant portion of the solar radiation, or partially reflects and partially transmits the incident solar radiation may be pumped continuously through the channels or pumped to fill the channels for a period of time (for the entire winter season, for example).

Light Transmitting State

In one embodiment, the active region of the fluid transfer component transitions from a first state to a light transmitting state. The active region has a light transmitting state when it transmits more than a first average transmission percentage of the incident light in a first wavelength or first wavelength band incident from a first angle or first angular range. In one embodiment, the first transmission percentage is greater than one selected from the group 5%, 10%, 20%, 30%, 40%, 50%, 60%, 70%, 80%, 90%, 95%, 98%, 99%, and 99.5%. In one embodiment, the first wavelength or first wavelength band (in nanometers unless otherwise specified) is one or more selected from the group: 300-400, less than 400, 400-700, 450-650, 350-1750, 350-1000, 400-1000, 700-1000, 700-900, 900-1200, 900-2000, and greater than 700 nanometers. In another embodiment, the active region has an ASTM D1003-00 luminous transmittance greater than one than one selected from the group 5%, 10%, 20%, 30%, 40%, 50%, 60%, 70%, 80%, 90%, 95%, 98%, 99%, and 99.5%.

Light Reflecting State

In one embodiment, the active region of the fluid transfer component transitions from a first state to a light reflecting state. The active region has a light reflecting state when it reflects more than a first average reflection percentage of the incident light in a first wavelength or first wavelength band incident from a first angle or first angular range. In one embodiment, the first reflection percentage is greater than one selected from the group 5%, 10%, 20%, 30%, 40%, 50%, 60%, 70%, 80%, 90%, 95%, 98%, 99%, and 99.5%. In one embodiment, the first wavelength or first wavelength band (in nanometers unless otherwise specified) is one or more selected from the group: 300-400, 400-700, 450-650, 350-1750, 350-1000, 400-1000, 700-1000, 700-900, 900-1200, 440-490 (blue), 520-570 (green), 630-740 (red), 450-460 (NVIS blue), 505-560 (NVIS Green A), 560-590 (NVIS Yellow), 585-615 (NVIS red), laser wavelengths such as 632.8 (HeNe), 454.6, 488.0, 514.5, 351, 363.8, 457.9, 465.8, 476.5, 472.7, 528.7, 244, 257 (Argon including frequency doubled), 416, 530.9, 568.2, 647.1, 676.4, 752.5, 799.3 (Krypton), 337.1 (Nitrogen), 10.6 micrometers, 9.4 micrometers (Carbon dioxide), 2.6-4 micrometers, 4.8 to 8.3 micrometers (carbon monoxide), 193, 248, 308, 353 (Excimer), 2.7-2.9 micrometers (HF), 3800 (deuterium fluoride), 1.315 micrometers (chemical oxygen-iodine), 390-435 (stilbene dye), 460-515 (coumarin 102), 570-640 (rhodamine 6G), 441.56, 325 (HeCd), 567, 615 (HeHg), 224.3 (HeAg), 430.5 (Strontium vapor), 248.6 (Neon Copper), 510.6, 578.2 (Copper vapor), 627 (Gold vapor), 694.3 (Ruby), 1.064 micrometers, 1.32 micrometers (Nd:YAG), 2.94 micrometers (Er:YAG), 1.047 micrometers, 1.053 micrometers (Nd:YLF), 1064 (Nd:YVO$_4$), 1060, 530 (Nd:YCOB and harmonic), 650-1100 (Ti:Sapphire), 2000 (Tm:YAG), 1.03 micrometers (Yb:YAG), 1 micrometer (Ytterbium), 2.1 micrometers (Ho:YAG), 2.2-2.8 micrometers (Cr:ZnSe), 280-316 (Ce:LiSAF or Ce:LiCAF), 933, 1098 (Promethium 147 doped phosphate glass), 1.53-1.56 micrometers (Erbium doped and erbium-ytterbium codoped glass), 2.5 micrometer (U:CaF$_2$), 708.5 (Sm:CaF$_2$), 0.4-20 micrometer (Semiconductor laser diode), 0.4 micrometer (GaN), 630-900 (AlGaInP, AlGaAs), 1.0-2.1 micrometers (InGaAsP), 3-20 micrometers (lead salt), 850-1500 (VCSEL), 7.3 (Nickel-like" Samarium), 1-2 micrometers (Raman), and other lasing wavelengths known to be produced from semiconductor laser diodes, quantum cascade lasers, hybrid silicon lasers, free electron lasers, HeSe lasers, and Xenon lasers.

The first angle or first angular range in degrees may be one or more selected from the group comprising: 0, 30, 60, 45,−90 to +90,−5 to +5,−10 to +10,−20 to +20,−30 to +30,−40 to +40,−50 to +50,−60 to +60,−70 to +70,−80 to +80, 0 to +10, 0 to +20, 0 to +30, 0 to +40, 0 to +50, 0 to +60, 0 to +70, 0 to +80, 0 to +90, +80 to +90, +70 to +90, +60 to +90, +50 to +90, +40 to +90, +30 to +90, +20 to +90, +10 to +90, +30 to +60, and +40 to +50 in one or more planes of incidence.

In one embodiment, the degree or level of reflectance in the active region is a light reflecting state that reflects an average of one or more selected from the group 10%, 15%, 20%, 25%, 30%, 35%, 40%, 45%, 50%, 51%, 55%, 60%, 65%, 70%, 75%, 80%, 85%, 90%, 95%, and 99% of the incident light in a first wavelength or first wavelength band incident from a first angle or first angular range.

In one embodiment, the degree or level of reflection in the active region is a light reflecting state with a solar emissivity less than one selected from the group: 0.01, 0.05, 0.1, 0.2, 0.3, 0.4, 0.5, 0.6, 0.7, 0.8, and 0.9.

In another embodiment, the degree or level of reflection in the active region is a light reflecting state with a solar emissivity greater than one selected from the group: 0.01, 0.05, 0.1, 0.2, 0.3, 0.4, 0.5, 0.6, 0.7, 0.8, and 0.9.

In one embodiment the degree or level of reflectance in the active region is a light reflecting state that reflects an average of one or more selected from the group 10%, 15%, 20%, 25%, 30%, 35%, 40%, 45%, 50%, 51%, 55%, 60%, 65%, 70%, 75%, 80%, 85%, 90%, 95%, and 99% of the incident light polarized with a first polarization state selected from the group: unpolarized, linearly polarized, s-polarized, p-polarized at 45 degrees, linear polarized at 90 degrees, circularly polarized, left-handed circular polarization, right-handed circular polarization, elliptically polarized, left-handed elliptical polarization, right-handed elliptical polarization, in a first wavelength or first wavelength band incident from a first angle or first angular range.

In one embodiment, the active region has a light reflecting state and retroreflects an average of more than 5% of the incident light in a first wavelength or first wavelength band incident from a first angle or first angular range back toward the direction from which it arrived. Examples of retroreflective materials include without limitation, corner cubes, corner cube arrays, beaded arrays or films (such as those used for reflective sheeting for signs and vehicles).

The different degrees, levels, or reflecting properties of the light reflecting state include, but are not limited to shifting from a first reflecting wavelength or first reflecting wavelength band to a second reflecting wavelength or second reflecting wavelength band different from the first, shifting from a first reflecting incident angle or first reflecting incident angular range to a second reflecting incident angle or second reflecting incident angular range different from the first, increasing or decreasing the reflectance, and changing the polarization state of the light that is reflected.

For example, in one embodiment, a fluid transfer film comprises an active region comprising a white oriented PET film comprising Titanium dioxide disposed beneath a layer comprising channels defined by surface relief structures and a transparent cover film wherein the optical properties of the active region change from a black absorbing state when a black fluid comprising carbon black nanoparticles is flowing through the channels to a diffusely reflecting white state when a substantially clear fluid (that may be refractive index matched to the material of the surface defining the channels) is pumped through the channels.

Light Scattering State

In one embodiment, the active region of the fluid transfer component transitions from a first state to a light scattering state. The scattering may be forwardly scattering (diffuse transmission) or backward scattering (diffuse reflection). The active region has a light scattering state when it redirects incident light of a first wavelength or first wavelength band from a first angle or first angular range such that the light has one or more properties selected from the group: the light incident from a first angle or first angular range is redirected to a second angle or second angular range different from the first angle or first angular range; the light incident from a first angle is redirected to an angular range with a full angular width at half maximum intensity in degrees greater than one selected from the group: 0.5, 1, 2, 4, 5, 10, 15, 20, 25, 30, 450, 45, 50, 60, 70, 80, and 90 when measured using laser light of the first wavelength with a divergence less than 5 milliradians; and the active region of the fluid transfer component has an ASTM D1003-00 haze greater than one selected from the group of 0.3%, 0.5%, 1%, 3%, 5%, 10%, 20%, 30%, and 40%. The scattering may be due to interaction with surface features, interfaces, or materials with a size scale of tens of nanometers to a few centimeters or more and includes, without limitation, one or more selected from the group: forward or backward light scattering particles, domains, voids, interfaces, or features; guided mode optical elements; coupled mode optics; optical metamaterials; photonic crystals; diffractive elements; holographic elements; regular or irregular surface features or interfaces; refractive elements; and reflective elements reflecting light at a different angle than the angle of incidence.

In one embodiment, the first wavelength or first wavelength band for a light scattering state is a wavelength or wavelength band discussed previously in the light reflecting section. In another embodiment, the first incident angle or first incident angular range is one or more first angles or first angular ranges (discussed for a light reflection state previously in the light reflecting section) for a light scattering plane.

The different degrees, levels, or scattering properties of the light scattering state include, but are not limited to shifting from a first scattering wavelength or first scattering wavelength band to a second scattering wavelength or second scattering wavelength band different from the first, shifting from a first scattering incident angle or first scattering incident angular range to a second scattering incident angle or second scattering incident angular range different from the first, increasing or decreasing the haze, increasing or decreasing the full angular width at half maximum intensity of the scattered light, and changing the polarization state of the light that is scattered.

Clarity is method for measuring the narrow angle scattering of a light scattering element such as the active region of a fluid transfer component or a fluid for use in a fluid transfer component. In one embodiment of this invention, the clarity of the of the non-scattering region or element measured with a BYK Gardner Hazemeter is greater than one selected from the group of 40%, 50%, 60%, 70%, 80%, 90% and 95%.

A method of measuring the amount of scattering or diffusion of an element such as a fluid transfer component or a fluid flowing through the fluid channels of a fluid transfer component includes measuring the angular full width of the intensity profile at half maximum intensity by directing collimated visible laser light, at 650 nm for example, and measuring the full angular width at half maximum intensity of the light passing through the thickness direction of the fluid or fluid transfer component. In one embodiment, the full angular width at half maximum intensity of collimated 650 nm laser light after passing through a non-scattering region is less than on selected from the group of 20 degrees, 10 degrees, 5 degrees, 3 degrees, 2 degrees, and 1 degree when measured with a photodetector in a configuration with an angular resolution of at least 0.5 degrees.

For example, in one embodiment, a fluid transfer film comprises an active region comprising a birefringent polyethylene naphthalate film with grooves oriented along an axis of birefringence that define one or more surfaces of the fluid channels and the active region of the fluid transfer film changes from a polarization sensitive scattering state with less than 10% of the incident light scattered and polarized to greater than 10% of the incident light scattered forward for a first polarization state when fluid of a first refractive index is pumped through the channels. In one embodiment, the active region of the fluid transfer component transitions from a scattering polarizer to a scattering film.

For example, in one embodiment, a fluid transfer system comprises a fluid transfer component comprising a plain weave of hollow fibers is cut and extrusion coated on the top and bottom with an adhesive and carrier film to form a carrier film-adhesive-weave-adhesive-carrier film composite using an adhesive. In this example, fluid may flow through the hollow fibers from one weft end to the opposite weft end and/or one warp end to the opposite warp end. In one embodiment, the weft ends of the fluid transfer component are not cut such that the fluid flows from the first warp end to the second warp end. In this example, if a refractive index matching adhesive is used that substantially matches the fiber material and the carrier film and a fluid with the same refractive index is flowed through the hollow fibers, the composite will be substantially transparent with a full-angular width at half maximum intensity less than 0.4 degrees when fluid flows through the hollow fibers and will be light scattering with a full angular width at half maximum intensity of 10 degrees when air is pumped through the hollow fibers. In one embodiment, the fibers are formed from a substantially amorphous material and may be oriented or stretched to minimize fiber birefringence.

In another embodiment, the fluid transfer component comprises a porous layer between a first layer and second layer wherein a region between the porous layer and first layer and/or second layer comprises one or more fluid channels. In this embodiment, the thickness of the layer, refractive index of the porous material, density of the pores, and sizes of the pores in the porous material affect the reflective and transmissive properties of the porous layer. In one embodiment, the thickness of the porous layer is greater than one selected from the group: 10, 20, 50, 100, 150, 200, 250, 300, and 400 micrometers. In another embodiment, the percentage of volume of the porous layer occupied by the pores is greater than one selected from the group 40%, 50%, 60%, 70%, 75%, 80%, 90%, and 95%. Material suitable for use as the porous layer include materials disclosed elsewhere herein for the fluid transfer component and also include expanded or expandable polymers such as extruded open-cell expanded polystyrene, poly aerogel, polyisocyanurate, silicone, polyethylene, polycarbonate, polypropylene, and fluoropolymers such as polyvinylidenedifluoride (PVDF), polyvinylidenedifluoride-co-Hexafluoropropylene (PVDF-HFP), fluorinated ethylene-propylene (FEP), polytetrafluoroethylene (PTFE), perfluoroalkoxy polymer (PFA), ethylene-tretrafluoroethylene (ETFE), ethylene-chlorotrifluoroethylene copolymer (ECTFE), polychlorotrifluoroethylene (PCTFE), polyvinyl fluoride (PVF), amorphous fluoropolymers (AF), polytetrafluoromethylene, copolymers of an aforementioned polymer, or other materials disclosed herein and combinations thereof. In one embodiment a fluid transfer component comprises a porous PFTE layer comprising fluid channels formed within or in the surface positioned between a transparent cover layer and a black, light absorbing layer. In this embodiment, when a gas or air is between the cover layer and the black, light absorbing layer, and thus within the pores of the porous layer, the active region of the fluid transfer component has a has a white, reflective optical state. In this embodiment, when a liquid such as water or water with the addition of a surfactant flows through the channels in the porous layer and/or between the transparent layer and the black, light absorbing layer, the liquid will fill into the pores and substantially "refractive index-match out" (such that the refractive index difference between the pore material and the fluid is less than one selected from the group 0.1, 0.05, 0.04, 0.03, 0.02, 0.01, and 0.005) the porous regions and allow light from the exterior to pass through the porous layer and be absorbed by the black, light absorbing region as opposed to being reflected by a porous layer filed by air or gas voids. In this embodiment the optical state can transition from black, light absorbing to white, light reflecting by flowing air (such as warm, dry air) through the channels or between layers such that the liquid evaporates from the pores and the porous layer reflects incident light from the environment external to the device (such as sunlight). In this embodiment, the liquid could flow through or between the layers and/or fluid channels such that the pores fill or substantially fill with the liquid and the incident light propagates to the black, light absorbing layer which generates heat that is carried away by the liquid. Thus, in this embodiment, a solar thermal device comprising the active area of a fluid transfer component can transition from passive, white reflective optical state to a black light absorbing state by flowing a liquid between or through the layers and/or channels where the liquid carries the heat away from the black, light absorbing layer toward a heat exchanger, for example. In this embodiment as well as with other solar applications, the heat does not necessarily need to be transferred away from the component by a fluid and it may conduct and/or radiate into a building directly, for example. In another embodiment, the porous layer may be positioned between two light transmitting layers and the device may transition from a white, light reflecting layer to a clear, light transmitting layer by flowing water or other liquid (optionally with additives) between the layers and/or channels. In this embodiment, a smart window may transition from a clear state in cold weather (to warm the interior with sunlight) to a white, reflecting state in warm weather (to prevent solar warming of the interior).

In another embodiment, the porous layer of a fluid transfer component may be positioned between a light transmitting layer and a retroreflective layer (such as an embossed corner cube retroreflective layer) and the device may transition from a white, light reflecting layer to a clear, light transmitting layer by flowing water between the layers and/or channels. In this embodiment, a smart window may transition from a clear state in cold weather (to warm the interior with sunlight) to a white, reflecting state in warm weather (to prevent solar warming of the interior).

In another embodiment the porous layer of a fluid transfer component may be positioned between a light transmitting layer and a colored or patterned layer with different colors. For example, in one embodiment, the fluid is air and the porous layer reflects visible light and appears white, and when the fluid transitions to a liquid and the porous layer is index-matched out, the active region appears to be a red, green, blue, or other region or can be a patterned region showing an image, graphic, characters, indicia or other arrangement of color regions. Thus, in this embodiment, the fluid transfer component can switch from a light reflecting state to a graphic or image and become a sign, for example.

In another embodiment, the inner surface features of one or more layers or one or more inner surfaces of a fluid channel of a fluid transfer component are sufficiently small such that the features strongly diffuse or scatter light. In this embodiment, by flowing a liquid with a refractive index that substantially matches the refractive index of the material forming the surface features, the fluid transfer component may transition from a diffuse, light transmitting state (or diffusely scattering light reflecting state) to a substantially clear (or low scattering) light transmitting (or transparent) state. In this embodiment, the fluid transfer component may be used, for example as a smart window or privacy window.

Light Absorbing State

In one embodiment, the active region of the fluid transfer component transitions from a first state to a light absorbing state. The active region has a light absorbing state when it absorbs more than a first average absorption percentage of the incident light of a first wavelength or first wavelength band incident from a first angle or first angular range. In one embodiment, the first absorption percentage is greater than one selected from the group 5%, 10%, 20%, 30%, 40%, 50%, 60%, 70%, 80%, 90%, 95%, 98%, 99%, and 99.5%. In one embodiment, the first wavelength or first wavelength band for a light absorbing state is a wavelength or wavelength band discussed previously in the light reflecting section. In another embodiment, the first incident angle or first incident angular range is one or more first angles or first angular ranges (discussed for a light reflection state previously in the light reflecting section) for a light absorbing plane.

In one embodiment, the degree or level of absorption in the active region is a light absorbing state that has an average absorption of one or more selected from the group 10%, 15%, 20%, 25%, 30%, 35%, 40%, 45%, 50%, 51%, 55%, 60%, 65%, 70%, 75%, 80%, 85%, 90%, 95%, and 99% of the incident light at a first wavelength or in a first wavelength band incident from a first angle or angular range.

In one embodiment, the degree or level of absorption in the active region is a light absorbing state with a solar absorption greater than one selected from the group: 0.2, 0.3, 0.4, 0.5, 0.6, 0.7, 0.8, 0.9, 0.94, 0.96, 0.98 and 0.99.

In one embodiment, the active region of the fluid transfer component is a selective solar absorber. Selective solar absorber selectivity is defined as the ratio of solar radiation-absorption to thermal infrared radiation-emission. In one embodiment, the degree or level of absorption in the active region is a selected solar absorber with selectivity greater than one selected from the group: 1, 2, 3, 4, 5, 7, 10, 12, 15, 20, 30, 40, and 50.

In one embodiment the degree or level of absorption in the active region is an absorbing state that absorbs an average of one or more selected from the group 10%, 15%, 20%, 25%, 30%, 35%, 40%, 45%, 50%, 51%, 55%, 60%, 65%, 70%, 75%, 80%, 85%, 90%, 95%, and 99% of the incident light polarized with a first polarization state selected from the group: unpolarized, linearly polarized, s-polarized, p-polarized at 45 degrees, linear polarized at 90 degrees, circularly polarized, left-handed circular polarization, right-handed circular polarization, elliptically polarized, left-handed elliptical polarization, right-handed elliptical polarization, in a first wavelength band or wavelength incident from a first angle or angular range.

The different degrees, levels, or absorbing properties of the light absorbing state include, but are not limited to shifting from a first absorbing wavelength or wavelength band to a second absorbing wavelength or wavelength band different from the first, shifting from a first absorbing incident angle or angular range to a second absorbing incident angle or angular range different from the first, increasing or decreasing the absorption, increasing or decreasing the selective solar absorber selectivity, increasing or decreasing the solar absorption, and changing the polarization state of the light that is absorbed.

For example, in one embodiment, a fluid transfer film comprises an active region comprising fluid channels defined by surfaces comprising a black nickel oxide coating on an stainless steel sheet and a transparent cover film wherein the optical properties of the active region change from a black absorbing state when transparent water is flowing through the channels to a diffusely reflecting white state when a white, diffusely reflecting liquid comprising titanium dioxide nanoparticles and/or microparticles with a dispersing agent is pumped through the channels.

In another example, the active region of the fluid transfer component changes from a first absorbing state with the channels comprising a liquid comprising a red dye to a second absorbing state by flowing a fluid comprising a blue dye into and/or through the channels. In one embodiment, the user, a controller based on sensor information, or the system itself automatically adjusts the level of absorption or color of the active region of the fluid transfer component. In another example, the color of the fluid transfer component or the active region of the fluid transfer component is chosen to match the color a specific surrounding element, such as asphalt shingles for example. In another embodiment, the active region comprises static structures, regions, or areas with a static optical property. In one embodiment, the fluid transfer film comprises lines and/or rectangular sections with a fixed color (such as black, for example) that can resemble a feature in the environment or provide a graphic, image, or other representation in the active region. For example, in one embodiment, a fluid transfer component in a solar thermal system comprises dark lines formed into a material (such as by printing, dyeing, or lamination of a dark or black material) that create the appearance of the edges of shingles such that when the fluid transfer component is positioned on a roof of a home with shingles, the appearance substantially matches the appearance of the roof. In another embodiment, the color of the fluid in one or more channels and/or the visible pattern of the lines or outlines of the shingles is chosen or modified on-site or during production of the fluid transfer component to match the color and appearance of the shingles of roof on the home to which it will be applied.

Light Emitting State

In one embodiment, the active region of the fluid transfer component transitions from a first state to a light emitting state. The active region has a light emitting state when it emits an average of more than 0.5 mW/cm$^2$ at a first wavelength or in a first wavelength band at a first angle or in a first angular range. In one embodiment, the first wavelength or first wavelength band for a light emitting state is a wavelength or wavelength band discussed previously in the light reflecting section. In another embodiment, the first incident angle or first incident angular range is one or more first angles or first angular ranges (discussed for a light reflection state previously in the light reflecting section) for a light emitting plane.

In one embodiment, the active region of a fluid transfer component emits light within an angular range with a full angular width at half maximum intensity in degrees greater than one selected from the group: 0.5, 1, 2, 4, 5, 10, 15, 20, 25, 30, 450, 45, 50, 60, 70, 80, 90, 100, 110, 120, 130, and 140.

In one embodiment, the degree or level of emittance in the active region is a light emitting state that emits a total flux (in Watts) greater than one or more selected from the group: 0.01, 0.1, 1, 5, 10, 20, 30, 40, 50, 75, 100, 200, 300, 500, 1,000, 1,500, 2,000, 3,000, 5,000, and 10,000 in a first wavelength or first wavelength band in a first angle or first angular range.

In one embodiment, the degree or level of emittance in the active region is a light emitting state that emits a total flux (in Lumens) greater than one or more selected from the group: 1, 5, 10, 20, 30, 40, 50, 75, 100, 200, 300, 500, 800, 1,000, 2,000, 3,000, 5,000, 7,000, and 10,000.

In another embodiment, the degree or level of emittance in the active region is a light emitting state that emits an average flux density (in Watts/cm2) greater than one or more selected from the group: 0.01, 0.1, 1, 5, 10, 20, 30, 40, 50, 75, 100, 200, 300, 500, and 1,000 in a first wavelength or first wavelength band.

In another embodiment, the degree or level of emittance in the active region is a light emitting state that emits light such that the outer surface of the fluid transfer component has an average luminance (in Cd/cm$^2$) greater than one or more selected from the group: 0.01, 0.1, 1, 5, 10, 20, 30, 40, 50, 75, 100, 200, 300, 500, 750, 1,000, 1,500, 2,000, 3,000, and 5,000 at a first angle or in a first angular range.

In one embodiment the degree or level of emittance in the active region is a light emitting state that emits an average of one or more selected from the group 10%, 15%, 20%, 25%, 30%, 35%, 40%, 45%, 50%, 51%, 55%, 60%, 65%, 70%, 75%, 80%, 85%, 90%, 95%, and 99% of the light in a first polarization state selected from the group: unpolarized, linearly polarized, s-polarized, p-polarized at 45 degrees, linear polarized at 90 degrees, circularly polarized, left-handed circular polarization, right-handed circular polarization, elliptically polarized, left-handed elliptical polarization, right-handed elliptical polarization, in a first wavelength or first wavelength band into first angle or first angular range.

The different degrees, levels, or emitting properties of the light emitting state include, but are not limited to shifting from a first emitting wavelength or first emitting wavelength band to a second emitting wavelength or second emitting wavelength band different from the first, shifting from a first emittance angular range or first emittance angular range to a second emittance angle or second emittance angular range different from the first, increasing or decreasing the full angular width at half maximum intensity in degrees of the emitted light, increasing or decreasing the total emitted flux, increasing or decreasing the average emitted flux density, increasing or decreasing the luminance at a first angle or in a first angular range, and changing the polarization state of the light that is emitted.

In one embodiment, the light emitted from the active region is due to one or more selected from the group: chemiluminescence, electroluminescence, light emitting diode, semiconductor light emitting devices, organic light emitting diodes, fluorescence, phosphorescence, cathodoluminescence, photoluminescence, bioluminescence, triboluminescence, incandescence, sonoluminescence, mechanoluminescence, radioluminescence, electron stimulated luminescence, and gas discharge. In one embodiment, the fluid comprises a phosphorescent material such as a phosphorescent pigment, the phosphorescent material receives excitation energy in an area outside of the active region, and the fluid flows to the active region such that it emits light in the active region of the fluid transfer component. In one embodiment, an ultraviolet, violet, or blue light source (such as a light emitting diode) excites the phosphorescent material (in the pump or region near the pump, for example) in a fluid transfer system comprising the fluid transfer component and the phosphorescent material emits visible light in the active region of the fluid transfer component when flowed into or while within the fluid channels of the fluid transfer component. In this embodiment, for example, a large, thin light emitting panel can be generated using a fluid transfer component and a fluid comprising a phosphorescent material such as microparticles or nanoparticles of zinc sulfide or strontium aluminate.

Light Refracting State

In one embodiment, the active region of the fluid transfer component transitions from a first state to a light refracting state. The active region has a light refracting state when it refracts more than a first average refracting percentage of the incident light in a first wavelength or first wavelength band incident from a first angle or first angular range to a second angle or second angular range different from the first angle or angular range. In one embodiment, the first refracting percentage is greater than one selected from the group 5%, 10%, 20%, 30%, 40%, 50%, 60%, 70%, 80%, 90%, 95%, 98%, 99%, and 99.5%. In one embodiment, the fluid channels comprise one or more inwardly facing surface relief features that provide refraction when the refractive index of the surface relief features is greater than or less than the refractive index of the fluid in the channel by a refractive index difference greater than one selected from the group 0.001, 0.005, 0.01, 0.05, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, and 2.0 at a first wavelength. In one embodiment, the refraction directs light of a first wavelength range and angular range to a second angular range different from the first angular range. For example, in one embodiment, the fluid channel comprises linear prism running lengthwise along the channel such that when the fluid channel is filled with air, a first portion of the incident light refracts to a larger first angle (a high refracting state), where the angle is measured from the normal to the active region outer surface or to the direction perpendicular to the flow of fluid through the channels, and when the fluid channel is filled with a liquid (such as silicone), the first portion of light refracts to a second angle smaller (low refracting state) than the first angle due to a lower refractive index difference. In another embodiment, the refractive index difference is sufficiently small such that the angle of refraction is less than 10, 5, 4, 3, 2, or 1 degree.

Light Diffracting State

In one embodiment, the active region of the fluid transfer component transitions from a first state to a light diffracting state. The active region has a light diffracting state when it diffracts more than a first average diffracting percentage of the incident light in a first wavelength or first wavelength band incident from a first angle or first angular range to a second angle or second angular range different from the first angle or angular range. In one embodiment, the first diffracting percentage or the total the diffraction efficiency for non-zero orders, is greater than one selected from the group 5%, 10%, 20%, 30%, 40%, 50%, 60%, 70%, 80%, 90%, 95%, 98%, 99%, and 99.5%. In one embodiment, the fluid channels comprise one or more inwardly facing surface relief features that provide diffraction when the refractive index of the surface relief features is greater than or less than the refractive index of the fluid in the channel by a refractive index difference greater than one selected from the group 0.001, 0.005, 0.01, 0.05, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, and 2.0 at a first wavelength. In another embodiment, the average pitch, separation, and/or height of the diffraction features is less than one selected from the group 5, 4, 3, 2, 1, 0.8, 0.7, 0.6, 0.5, 0.4, and 0.3 micrometers. In one embodiment, the diffraction directs light of a first wavelength range and angular range to a second angular range different from the first angular range. For example, in one embodiment, the fluid channel comprises linear grating structures with a rectangular (or triangular) cross-section running lengthwise along the channel such that when the fluid channel is filled with air, a first portion of the incident light diffracts to a larger first angle (a high diffracting state), where the angle is measured from the angle of incidence (undeviated 0-order light), and when the fluid channel is filled with a liquid (such as silicone), the first portion of light diffracts to a second angle smaller (low diffracting state) than the first angle due to a lower refractive index difference. In another embodiment, the refractive index difference is sufficiently small such that the angle of diffraction is less than 10, 5, 4, 3, 2, or 1 degree and/or the diffracting percentage or the total the diffraction efficiency for non-zero orders, is less than one selected from the group 10%, 9%, 8%, 7%, 6%, 5%, 4%, 3%, 2% and 1%.

Transition Speed

In one embodiment, the transition from the first optical state to the second optical state occurs over a duration less than one selected from the group: 100, 50, 20, 10, 5, 2, 1, 0.5, 0.1, 0.05, 0.01, 0.005, and 0.001 seconds. In one embodiment, the average thickness of the channels in the active region is less than 100 micrometers and the volume of fluid required to flow through the active region to transition from the first optical state to the second optical state is less than one 1 liter. In one embodiment, the average thickness of the channels in the active region of the fluid transfer component is less than 20 microns and the transition duration from a first optical state to a second optical state is less than one second. In another embodiment, the average thickness of the channels in the active region of the fluid transfer component is less than 10 microns and the transition duration from a first optical state to a second optical state is less than 0.5 seconds. In another embodiment, the average thickness of the channels in the active region of the fluid transfer component is less than 5 microns and the transition duration from a first optical state to a second optical state is less than 0.1 seconds.

Supporting Members for Fluid Transfer Film

In one embodiment, the fluid transfer film comprises supporting members including without limitation, protrusions, standoffs, supports, or a surface relief layer that provides support for maintaining separation between two or more surfaces sufficient to enable fluid flow between the surfaces or within a channel at least partially defined by the surfaces. In one embodiment, the supporting members are one or more selected from the group: fibers, protrusions from a surface structured film, spacers, beads, spheres, and flowing solid material disposed within the fluid.

In one embodiment, the supporting members have a high yield strength. In another embodiment, the supporting members are very flexible. In one embodiment, the supporting materials are a thermoplastic, thermoset, or inorganic material.

In one embodiment support members are used to keep a space between two flat-sheet membranes to provide for conveyance of fluid to or from the space between the membranes via a manifold connected to the flat-sheet membrane modules. Support members may be in the form of a permeable mesh designed to keep the membrane module from collapsing under any internal vacuum or external pressure. Alternatively, support layers can be in the form of a paper mesh, a non-woven or a woven-fiber based material. Some examples of support layers are disclosed in U.S. Pat. Nos. 4,701,234, 3,679,059, 4,871,456, 4,264,447, and European Pat. No. 0,602,560-B1, the entire contents of each is incorporated by reference herein.

Fluid Input and Output Couplers

In one embodiment, the fluid transfer component comprises one or more fluid input couplers positioned on an input side of the fluid transfer component disposed to input the fluid into the active region of the fluid transfer component. In one embodiment, the fluid transfer component comprises one or more fluid output couplers positioned on an output side disposed to receive the fluid from the active region of the fluid transfer component. In one embodiment, the input side or output side is along one or more edges of a fluid transfer film or component. In another embodiment, the input edges and output edges are disposed on opposite sides or edges of the fluid transfer component. The fluid input couplers and fluid output couplers are in fluid communication with one or more channels and one or more fluid flow sources. In another embodiment, the fluid input couplers and fluid output couplers are positioned on the same side of the active region of the fluid transfer component. In this embodiment, the fluid channels may turn around, or curve or be connected at the opposite end such that fluid can flow across the active region through a first fluid channel and return across the active region through a second fluid channel (or second region of a single channel). In one embodiment, the input coupler is combined with an output coupler where one or more channels for input are adjacent one or more channels for output at the input and output end (such as a fluid channel geometry converter where one or more channels at the end of the strips for input may be adjacent one or more channels for output).

In one embodiment, the fluid input coupler or the fluid output coupler may take on essentially any adaptation that enables the fluid to flow to or from the flow source to one or more channels. Fluid input and output couplers include without limitation, manifolds, fluid channel geometry converters, compression couplings, and seals and gaskets that fluidly join a conduit to the fluid channels and permit the isolation or partition of regions of higher and lower flow from the surrounding environment. In one embodiment, the input output couplers comprise one or more capillary fibers, for example, less than 10 micrometers in inner diameter, each in fluid communication with an individual channel to allow individual fluids to flow discretely through separate channels. The input or output coupler could also be a molded chamber(s), a microstructured fluid conduit integrally or non-integrally disposed relative to the discrete fluid channels, or a system or mechanism that allows the discrete microstructured fluid channels to be seated in a centrifuge or that allows a flow stream such as a jet to be directed at channel inlets or outlets.

Manifold Coupling

In one embodiment, the fluid input coupler or the fluid output coupler comprises a manifold coupler. In one embodiment, the manifold coupler is in fluid communication with one or more fluid channels and is in fluid communication with one or more flow sources.

In one embodiment, the manifold coupler comprises a plenum that is defined internally therein and which is in fluid communication with fluid channels. In one embodiment, the plenum may simply comprise a chamber within the manifold that is operatively connected to at least a plurality of the channels. The manifold coupler may be flexible, semi-rigid, rigid, or have substantially the same flexibility (or Young's modulus) as the fluid transfer component or active region of the fluid transfer component. In one embodiment, the manifold coupler comprises a pipe or tube with a slit or one or more discrete openings along at least one edge through which one or more edges of the fluid transfer component extend into the pipe, film, or tube, and an adhesive or sealant between or covering the seam between fluid transfer component and the tube or pipe wall.

Fluid Channel Geometry Converter

In one embodiment, the fluid transfer system comprises one or more fluid channel geometry converter input or output couplers. A fluid channel geometry converter coupler comprises one or more segments or regions of the fluid transfer component comprising fluid channels (into strips, for example) that are physically separated, folded or bent, and stacked to form a fluid input end comprising a plurality of layers comprising fluid channels in a geometry different from within the active region of the fluid transfer component. In one embodiment, the fluid channel geometry converter input or output coupler converts a geometrical arrangement of channels arranged in a first and second direction to a second geometrical arrangement with less channels in the first direction and more channels in the second direction. In one embodiment, the first direction is parallel with the transverse direction or machine direction of a web-based manufactured film and the second direction is the thickness direction of the film wherein the film comprises surface relief features that define one or more surfaces of one or more channels or supporting members in a fluid transfer component.

In one embodiment, a fluid transfer system comprises a fluid channel geometry converter wherein the total cross-section of the area of the channels comprising a fluid (or operatively configured to comprise a fluid during operation) is the same as the cross-sectional area of the channels at the input end or output end of the fluid channel geometry converter. In another embodiment, a fluid transfer system comprises a fluid transfer component comprising a fluid channel geometry converter and the flow path through one or more channels from a supply line (such as a tube or pipe) to the active region of the fluid transfer component or the flow path through one or more channels from the active region to the return line (such as a tube or pipe) does not comprises any right angle bends, elbows, or angled planar surface bends in the flow path. In another embodiment, a fluid transfer system comprises a fluid transfer component comprising a fluid channel geometry converter and the flow path through one or more channels from a supply line (such as a tube or pipe) to the active region of the fluid transfer component or the flow path from the active region to the return line (such as a tube or pipe) does not comprise an expanding and/or contracting cross-section. In another embodiment the cross-sectional dimension of the flow path channels does not expand or contract in a first cross sectional plane. In another embodiment, the cross-sectional plane is orthogonal to the direction of the fluid flow. In a further embodiment, the cross-sectional plane is parallel to the direction of the fluid flow.

For example in one embodiment, a fluid transfer film 1 meter by 1 meter in size comprises fluid channels formed from a surface relief profile in the form of a linear array of 10,000 prismatic lenses with the length of the prisms in the x direction. A cover sheet is adhered to the top surface of the prismatic lenses and the surface of the cover sheet or adhesive in combination with the top surface of the prismatic lenses defines individual channels within the regions between the intersection of adjacent prisms and the cover sheet (or adhesive) to form a fluid transfer film with a thickness of 200 micrometers and an array of about 1×10,000 fluid channels. The fluid transfer film is cut near an input side and near an output side into 50 strips parallel to the x axis that are each 10 centimeters long and 2 centimeters wide extending from the active region of the fluid transfer film on the input side and output side of the film and contain about 200 channels each. The input strips are folded 90 degrees such that their ends are aligned to form an input region with a fluid channel geometric arrangement different from the fluid channel geometric arrangement of the active region of the fluid transfer film and cut in the thickness direction to form an input end. In this example, the input region is 2 centimeters wide in the x direction (since the strips are folded 90 degrees the prisms are now oriented orthogonal to the x direction) and has a dimension of 10 millimeters in the transverse flow direction (thickness direction of the film) and comprises a fluid channel geometric arrangement of 50×200 channels. Similarly, the output strips are folded and aligned to create an input region 2 centimeters wide in the x direction and has a dimension of 10 millimeters in the transverse flow direction (thickness direction of the film) comprising geometric arrangement of 50×200 fluid channels. In this simplified example, the possible loss of definition of one or more channels at the edges of the film or at the edges of the strips due to cutting are not taken into account for simplicity. It is understood that in some embodiment, the cutting or separating of the strip regions or segments of the film and/or fluid transfer component may open up one or more channels such that they are not well defined and/or not usable for effective fluid flow for the application.

By using continuous fluid channels without sharp corners, bends or sharp radii of curvature, the flow resistance or drag of a fluid channel geometry converter input or output coupler is reduced relative to a manifold input or output coupler. Furthermore, using channels with a constant cross-sectional shape in the direction of the flow from the input to the active region and/or from the active region to the output end, spurious currents, flows, or vortices that increase the resistance of the flow can be reduced or eliminated. The level of flow resistance can be calculated based on the coefficient of flow resistance. The channel contraction coefficient of flow resistance, $K_{cont}$, is defined herein by the equation:

$$K_{cont} = k_1 \left(1 - \frac{A_a}{A_i}\right)^{.75}$$

where $k_1$ is a geometry coefficient and may be for example 0.5, $A_i$ is the cross-sectional input area of a channel in at the input end of a fluid input coupler and $A_a$ is the cross-sectional area of the corresponding channel in the active region. One can see that for the case of a fluid channel geometry converter type fluid input coupler where one or more cross-sectional dimensions of the channel can be constant, (i.e. the cross-sectional dimension in a plane does not change from the input end of the fluid input coupler and the active region for a channel) the channel cross-sectional shape can be continuous, and not change in size (in a plane such as a plane orthogonal to the direction of fluid flow) as the collective geometric arrangement of the channels changes. Since in this example, the channel size does not change, the ratio $$\frac{A_a}{A_i}$$

is 1 and the channel contraction coefficient of flow resistance is 0. In the case of a manifold-based fluid input coupler, where a there are smaller channels fluidly coupled to a single larger channel or pipe or tube, the channel contraction coefficient of flow resistance is greater than 0 as the channel geometry is converted from a single channel to 1 by 500 channels, for example and the cross sectional area of a channel decreases from the input end to the active region. Similarly, the average channel contraction coefficient of flow resistance for a plurality of channels may also be zero for a fluid channel geometry converter fluid input coupler and the average channel contraction coefficient of flow resistance for a plurality of channels in a manifold-based fluid input coupler is greater than zero.

In one embodiment, a fluid transfer system comprises a fluid transfer component and a fluid channel geometric converter fluid input coupler with a geometry coefficient of 0.5, and the coefficient of flow resistance, $K_{cont}$, due to the change in geometry of the channels (or absence thereof) is zero, or less than one or more selected from the group: 0.5, 0.4, 0.3, 0.2, 0.1, 0.05, and 0.01.

The channel expansion coefficient of flow resistance in one plane, $K_{exp}$, is defined herein by the equation:

$$K_{exp} = k_1 \left(1 - \frac{A_a}{A_o}\right)^2$$

where $k_1$ is a geometry coefficient and may be for example 0.5, $A_o$ is the cross-sectional output area of a channel at the output end of a fluid output coupler, and $A_a$ is the total cross-sectional area of the corresponding channel in the active region. One can see that for the case of a fluid channel geometry converter type fluid output coupler where one or more cross-sectional dimensions of the channel can be constant, (i.e. the cross-sectional dimension in a plane does not change from the active region to the end of the fluid output coupler for a channel) the channel cross-sectional shape can be continuous, and not change in size (in a plane such as a plane orthogonal to the direction of fluid flow) as the collective geometric arrangement of the channels changes. Since in this example, the channel size does not change, the ratio $$\frac{A_a}{A_o}$$

is 1 and the channel expansion coefficient of flow resistance is 0. In the case of a manifold-based fluid output coupler, where a there are smaller channels fluidly coupled to a single larger channel or pipe or tube, the channel expansion coefficient of flow resistance is greater than 0 as the channel geometry is converted from 1 by 500 channels to a single larger channel, for example, and the cross sectional area of a channel increases from the active region to the output end of the fluid output coupler. Similarly, the average channel expansion coefficient of flow resistance for a plurality of channels may also be zero for a fluid channel geometry converter fluid output coupler and the average channel expansion coefficient of flow resistance for a plurality of channels in a manifold-based fluid output coupler is greater than zero.

In one embodiment, a fluid transfer system comprises a fluid transfer component and an output coupler with a geometry coefficient of 0.5, and the coefficient of flow resistance, $K_{exp}$, due to the change in geometry of the channels is zero, or less than one or more selected from the group: 0.5, 0.4, 0.3, 0.2, 0.1, 0.05, and 0.01.

In one embodiment, a fluid transfer system comprises a fluid transfer component, an input coupler, and an output coupler wherein there are zero or less than one selected from the group of 6, 5, 4, 3, 2, and 1 right angle bends in the fluid path between the input region and the output region.

In one embodiment, a fluid transfer system comprises a fluid transfer component, an input coupler, and an output coupler wherein the total coefficient of flow resistance from the input region to the output region is less than one selected from the group: 0.9, 0.8, 0.7, 0.6, 0.5, 0.4, 0.3, 0.2, 0.1, 0.05, and 0.01.

In one embodiment, the fluid channel geometry in a fluid transfer system comprising an array of (1×N) channels in the active region of a fluid transfer component is converted to a (M×P) geometry at the input region or output region (corresponding to the channels in the active region of the fluid channel geometry converting input coupler or output coupler, respectively) where M×P=N; and M and P are greater than 1. In another embodiment, the fluid channel geometry in a fluid transfer system comprising an array of (1×N) channels in the active region of a fluid transfer component is converted to geometric arrangement of (N/C×C) channels where C is an integer at the input or output region of a fluid channel geometric converter input coupler or output coupler, respectively. In a further embodiment, the fluid channel geometry in a fluid transfer system comprising an array of (M×N) channels in the active region of a fluid transfer component (where M and N are integers) is converted to geometric arrangement of (C·M×N/C) channels where C is an integer greater than 1 at the input or output region of a fluid channel geometric converter input coupler or output coupler, respectively. For example, in one embodiment, the fluid channels are arranged in a 4×100 matrix in the active region and at the input end of a fluid channel geometry converter the fluid channels are arranged in a 20×20 matrix.

In another embodiment, the fluid channel geometric converter spatially transforms the positions of the one or more ends of two or more channels of a fluid transfer component. In another embodiment, the fluid channel geometry converter is an integrally formed extension of the channels in the active region configured to convert the geometric arrangement of the fluid channels. For example, in one embodiment, the fluid channel geometry converter is integrally formed from a region of a film comprising fluid channels where along one side of the film a portion of the film is separated into strips that are folded and stacked.

In one embodiment, the edges along the sides of the strips are sealed to prevent fluid from escaping from the edges. In another embodiment, the rear surface of one strip forms the top surface for one or more channels in the strip regions. In another embodiment, the surface relief profile of the fluid transfer film does not extend into the strip regions. In another embodiment, the sides (lateral edges) of the strips are sealed (welded together) during the cutting process (such as by using a carbon dioxide laser to cut the strips).

In another embodiment, the radius of curvature of the bend in the strips for the input coupler and/or output coupler is less than one selected from the group: 5 cm, 2 cm, 1 cm, 5 mm, 2 mm, 1 mm, 0.5 mm, 0.2 mm, and 0.1 mm.

In one embodiment, the fluid in one channels mixes with the fluid in one or more other channels in one or more selected from the group: the active region, the input coupler, the output coupler, the flow source, a component between the flow source and the input coupler, and a component between the output coupler and the flow source. In another embodiment, a fluid transfer system comprises a fluid transfer component, a fluid input coupler, and a fluid output coupler wherein the flow from the channels within the active region do not mix with each other from the input region of the fluid input coupler to the output region of the fluid output coupler.

In one embodiment, the channels near the strip cuts in the input region and/or output region are sealed at the input region surface or the output region surface. By sealing channels (such as one or two columns of channels) near the cut edges on the input end, the fluid does not flow through these outer fluid channels and does not leak out the lateral sides of the strips (thus alleviating the need to seal the edges of the strips). The channels near the cut edges at the input or output region of the input our output coupler may be sealed by one or more selected from the group: adhering a sealant covering the channels, adding an epoxy covering the channels, adhering a blocking gasket to the region, thermally sealing the channel entrances by melting, plugging with a component, and backfilling and sealing from within the channels with a curable or thermoset material.

In another embodiment, a fluid transfer system comprises one or more fluid connectors, such as a tube or pipe transferring the fluid from the flow source to one or more input or output couplers. In one embodiment, the fluid connectors comprise an exit area that is smaller than the area comprising the channels extending into the active region and when in fluid communication with the input or output region does not transfer fluid into the channels near the edges of the input region or output region.

In one embodiment, the fluid connector is coupled to the input region and/or output region of the fluid channel geometry converting input coupler or output coupler, respectively and the seal for fluid is provided by a heat shrink tubing around the fluid connector and the coupler or by placing the input region and/or output region within the fluid connector (such as a pipe or tube) and sealing and/or adhering with a sealant, epoxy, or adhesive. In one embodiment, the width of the strips cut for fluid channel geometry converter vary such that when the strips are stacked with their centers aligned or an edge aligned, the shape of the cross-section of the stack substantially fills an non-rectangular supply or return pipe, line, tube, or hollow material. For example, in one embodiment, the strips are cut with their width increasing from an edge toward the center and decrease from the center to the opposite edge along the input side and/or output side of the active region of the fluid transfer component. In this embodiment, when the strips are stacked and folded, they can form a stack with an outer cross-section in the form of a polygon with more than 4 sides that occupies more area of the circular flow path in a pipe with a circular inner surface cross-section.

In one embodiment, the pressure of the fluid in a channel remains substantially constant from the input coupler, through the active region and through the output coupler. In another embodiment, the input coupler and output coupler of a fluid transfer component are fluid channel geometry converters and the pressure of the fluid flowing through the fluid transfer component is substantially constant.

In one embodiment, the ratio of the pressure of the transfer fluid after having just entered a channel (say less than 5 millimeters from the input end, for example) at the entrance to a fluid channel geometry converter fluid input coupler to the pressure of the fluid in the same channel in the active region of the fluid transfer component is one selected from the group 0.5 to 1, 0.6 to 1, 0.7 to 1, 0.8 to 1, 0.9 to 1, 0.95 to 1, 0.98 to 1, 0.99 to 1 and 1 at 25 degrees Celsius or a first operating temperature or temperature range. In another embodiment, the ratio of the pressure of the transfer fluid in a channel in the active region of the fluid transfer component to the pressure of the fluid in the same channel just before exiting the fluid channel geometry converter fluid output coupler (say less than 5 millimeters from the output end, for example) is one selected from the group 0.5 to 1, 0.6 to 1, 0.7 to 1, 0.8 to 1, 0.9 to 1, 0.95 to 1, 0.98 to 1, 0.99 to 1 and 1 at 25 degrees Celsius or a first operating temperature or temperature range. In a further embodiment, the ratio of the pressure of the transfer fluid after having just entered a channel (say less than 5 millimeters from the input end, for example) at the entrance to a fluid channel geometry converter fluid input coupler to the pressure of the fluid in the same channel just before exiting the fluid channel geometry converter fluid output coupler (say less than 5 millimeters from the output end, for example) is one selected from the group 0.5 to 1, 0.6 to 1, 0.7 to 1, 0.8 to 1, 0.9 to 1, 0.95 to 1, 0.98 to 1, 0.99 to 1 and 1 at 25 degrees Celsius or a first operating temperature or temperature range.

In one embodiment, using input and output fluid channel geometry converters reduces the pressure required to couple from a single supply line, pipe, or tube fluid into multiple channels within an active region, flow the fluid through the channels in the active region, and couple the fluid out of the channels into a single return line, pipe, or tube. In addition, the surface feature defining the channel and/or coatings affecting the wettability of the surfaces of the channels can reduce the pressure require for fluid flow and transfer. By reducing the pressure required, the walls of the channels may be made thinner while avoiding rupture. By making the walls thinner, the input coupling efficiency and output coupling efficiency can be increased in a fluid channel geometry converter since the fluid from a supply line, pipe, or tube encounters a lower surface area cross-section of the channel-defining walls, and the flow resistance due to contraction of the fluid flow at the fluid input coupler is less than it would be with larger wall thickness. Similarly, the fluid flow resistance due to expansion would be less with thinner walls at the fluid output coupler.

Coupling to Other Layers or Components

In one embodiment, the fluid transfer component or a layer thereof is operatively coupling to a light absorbing layer, a light reflecting layer, a support, a film, a housing, a membrane, a foil, a device, or another component of the fluid transfer system, by lamination, co-extrusion, insert molding, film insert molding, vacuum forming, thermoforming, coating, adhering or physical bonding.

Physical Connectors

In one embodiment the fluid transfer component comprises one or more physical connectors to physically couple the fluid transfer component to one or more other fluid transfer components, components of the fluid transfer system, components of a different fluid transfer system, a device, a structure such as a building, a component of a building, roof of a building, an inner wall surface of a building, an outer surface of a building, a vehicle or a component of a vehicle (such as a roof, dash, upholstery, seat, fender, hood, outer surface, or inner surface of a land craft, aircraft, spacecraft, car plane, tank, helicopter, armored vehicle, etc.). In one embodiment, the physical connector comprises one or more selected from the group: pipe with a clamp, tube with a clamp, anchor bolt, batten, brass fastener, buckle, button, cable tie, captive fastener, clamp (or cramp), hose clamp, clasps, Bocklebee Clasp, lobster clasp, cleko, clips, circlip, hairpin clip, paper clip, terry clip, clutch, drawing pin (thumbtack), flange, frog, grommet, hook-and-eye closure, latch, nail, pegs, clothespin, tent peg, PEM nut, pins, bowtie cotter pin, circle cotter, clevis fastener, cotter, dowel, linchpin, R-clip, split pin, spring pin, tapered pin, retaining rings, circlip, e-ring, rivet, rubber band (or bands of other materials), screw anchor, snap fastener, staple, stitches, strap, threaded fastener, captive threaded fasteners, nut, screw, threaded insert, threaded rod, tie, toggle bolt, treasury tag, twist tie, hook-and-loop strips, wedge anchor, and zipper.

Piping or Fluid Flow Connectors or Couplers

In one embodiment, the fluid transfer component comprises one or more input or output connectors, pipes, hoses, tubes, fluid conveyors, or fluid carrying extensions that connect the fluid flow in one or more channels of the first fluid transfer component to one or more channels in a second fluid transfer component. For example in one embodiment, a first roofing shingle comprises a first fluid transfer component and an output pipe to connect into an input pipe connector of a second fluid transfer component of a second roofing shingle to create a fluid transfer system with two or more fluidly connected roofing shingles comprising two or more fluidly connected channels within fluid transfer components of the two or more roofing shingles. In another embodiment, a first fluid transfer component comprises two or more fluid input couplers or two or more fluid output couplers and the first fluid transfer component comprises two or more connectors to fluidly couple the two or more fluid input couplers or two or more fluid output couplers to the corresponding input or output couplers of a second fluid transfer element. In one embodiment, a fluid transfer component comprises a first input coupler fluidly coupled to the active region and a second input coupler fluidly connected to a channel that flows through the fluid transfer element to the output coupler without passing through the active region. For example, in one embodiment, a roofing shingle or solar thermal device comprises a fluid transfer component with three fluid input couplers and three fluid output coupler. In this example, the first fluid input coupler is fluidly connected to the channels in the active region of the fluid transfer component and the second and third input couplers are positioned to receive a fluid supply from a first and second side of the four sided shingle and direct fluid flow to the second and third fluid output coupler on the third and fourth sides of the shingle without passing through the active region. In this example, the shingle can be fluidly coupled and/or attached to shingles with other similar fluid transfer components on all four sides and if the shingle is damaged in the active region, the fluid can still pass through the damaged shingle to supply the other shingles (above it, below it, or further along the fluid path from it, for example) without requiring the fluid to flow in a pipe exterior to the shingle. In this embodiment, the fluid transfer components are effectively daisy chained or fluidly connected to other fluid transfer components in a serial and/or parallel fashion and can be analogous to holiday light strings where when one light bulb goes out, the others remain active and working. In this example, the fluid transfer component in the damaged shingle may optionally have a fluid safety valve operatively coupled to a detector that detects the damaged shingle (such as by optical, electrical, fluid pressure, or other means) and shuts off the liquid flow to the active region to prevent leakage. In one embodiment, the shutoff can be automatic and controlled by a fluid transfer system controller or powered and/or controlled by the shingle (such as with a shingle comprising a photovoltaic cell) or is automatic using pressure valves within the fluid transfer component without using electricity.

Transfer Fluid

In one embodiment, the fluid transfer system comprises one or more fluids in fluid communication with the fluid transfer component.

In one embodiment, one or more of the transfer fluids comprises one or more selected from the group: liquid, gas, air, nitrogen, carbon dioxide, helium, oxygen, oil, liquid state polymer, liquid crystalline polymer, gel, water, silicone fluid, heat transfer fluids, glycol, ethylene glycol, propylene glycol, ethanol, salt brine, sodium chloride water, calcium chloride solution, halocarbon, methylene chloride, trichloroethylene, hydrofluoroether, perfluoropolyethers, low molecular weight perfluoropolyether (PFPE), perfluorocarbon ether, diethyl benzene, alkylated benzene, Paraffinic type aliphatic hydrocarbons, iso-paraffinic aliphatic hydrocarbons, terpenes, d-limonene, dimethyl polysiloxane, silicone oil, R-11, colloids, organic solutions, emulsions, organic solvents, PFC, PFHC, liquid-state epoxy resin, glycerin, propylene carbonate, petroleum based heat transfer fluids, synthetic heat transfer fluids, naphthalene, proprionic acid, and xylene.

In one embodiment, the transfer fluid comprises one or more fluids selected from the group: include DOW 200, a polydimethylsiloxane polymer available from Dow Corning, polydimethylsiloxane fluids available from Gelest Corporation such as trimethylsiloxy terminated fluids DMS-T00, DMS-T01, DMS-T01.5, DMS-T02, DMS-T03, DMS-T05, DMS-T07, DMS-T11; cyclomethicone such as SI06700.0, SID2650.0, SID4625.0 (also known as D4, D5, and D6 fluids, respectively); phenylmethylsiloxanes such as PMM-0011, PDM-7040; fluorosilicones such as SIB1816.0; polydiethylsiloxanes such as DES-T03, DES-T11; branched and low viscosity phenyltris(trimethylsiloxy)silane fluids such as SIP6827.0, phenethyltris(trimethylsiloxy)silane fluids such as SIP66722.8, and the like.

In another embodiment, the transfer fluid comprises one or more fluids selected from the group: Dupont Syltherm XLT, General Electric SF-96-50, Fluka UV-grade mineral oil, phenyl-xylyl-ethane (PXE), linear alkylbenzene (LAB), isopropyl-biphenyl (IPB), aqueous solutions of inorganic salts, polyhydric alcohols such as ethylene glycol and glycerine, silicone oils such as polydimethylsiloxane and polyphenylmethylsiloxane, hydrocarbons such as polyethers, polyesters, and liquid paraffin, halogenated hydrocarbons such as trifluorinated ethylene chloride oil, phosphates such as tris(chloroethyl) phosphate and trioctyl phosphate, solutions of polymers diluted with suitable solvents, tetrachloroethylene, bromoform, bromo-trichloromethane, α-fluoronaphthalene, α-bromonaphthalene, para-isopropylaniline, methyl diphenyl phosphate, dimethyl phthalate, diethyl phthalate, clorotrifluoroethylene (such as fluorolube, daifloil, voltalef, halocarbon CTFE), dichloromethane (methyline dichloride), hexachlorobutadiene, methyl butyl carbonate, hyvis (polybutene), mineral oil such as Marcol 82, therminol D-12 or VP-1, trimethyl propane polyol ester, butylated terphenyl, penta arithritol polyol ester, combed long chain polyol, tri xylyl phosphate ester, isopropyl phosphate ester, dimethylpolysiloxane, polyphenylmethylsiloxane (phenyltrimethacone), silicone glycol copolymer (dimethacone copolyol), methyl alkyl polysiloxane, silicone elastomer, polychlorophenylmethylsiloxane, fluorosiloxane, esters such as polyols, silahydrocarbons phthalate esters, phosphazenes, phosphate esters, dialkylcarbonates, polyalkylene glycols, cycloaliphatics, alkylated aromatics, polybutenes, perfluoroalkylpolyethers, a methylcyclohexane/trimethylpentane mixture, a synthetic hydrocarbon, an alkyl substituted aromatic hydrocarbon, an isopropyl biphenyl mixture, a modified terphenyl, a terphenyl/quaterphenyl mixture, a biphenyl/diphenyl oxide (DPO) eutectic mixture, a phenylcyclohexane and bicyclohexyl mixture, a white mineral oil, sodium chloride solution, calcium chloride solution, potassium chloride solution, ammonium chloride solution, and sodium nitrate solution.

In one embodiment, a transfer fluid in a fluid transfer system comprises two or more compatible liquids mixed to produce a liquid with a required refractive index or transmission band. For example, dimethylpolysiloxane is soluble in tetrachloroethylene in all proportions, so a core liquid may be produced from any combination of these two fluids.

In some embodiments, silicone fluids are used as they are very stable, transmit a wide range of wavelengths, and, in most cases, are not toxic or have very low toxicity. The fluids named above are examples only. There are a large number of other materials in the abovementioned categories that may have the right combination of properties to be selected for specific purposes.

Other suitable liquids may include liquids developed in recent years for such purposes as heat transfer fluids, hydraulic fluids, etc. These fluids are collectively called Synthetic Lubricants and High-Performance Functional Fluids, and each class can contain large numbers of individual members.

Transfer Fluid Properties

In one embodiment, the transfer fluid has a viscosity less than one selected from the group: 5, 4, 3, 2, 1.5, 1.4, 1.3, 1.2, 1.1, 1, 0.95, 0.9, 0.85 and 0.8 centistokes at 20 degrees Celsius. In another embodiment, the transfer fluid has a viscosity less than one selected from the group: 5, 4, 3, 2, 1.5, 1.4, 1.3, 1.2, 1.1, 1, 0.95, 0.9, 0.85 and 0.8 centistokes at 50 degrees Celsius. In one embodiment, the fluid transfer system comprises a first transfer fluid with a first density and a second transfer fluid with a second density higher than the first density. In this embodiment, for example, using valves in fluid communication with a reservoir comprising the first and second fluids, the fluids will separate themselves naturally and depending on the desired fluid, the fluid may be pumped from the top or bottom of the reservoir. In this embodiment, only one reservoir may be needed. For example, in one embodiment the first fluid is air and the second fluid is water. In another example, the first fluid is silicone fluid and the second fluid is water. In one embodiment, the first and second fluids are immiscible.

In one embodiment, the fluid transfer system comprises sealed channels in fluid communication wherein when the fluid within the channels in the active regions absorbs heat it undergoes a phase change. In one embodiment, the fluid transfer component is the heat exchange or heat receiving element of a heat pipe type heat transfer system. In one embodiment, the fluid flows by capillary action in one or more selected from the group: to the active region, within the active region, within the channels, away from the active region, to the flow source, away from the flow source, within the input coupler, within the output coupler, and within the strips of a fluid channel geometry converter input or output coupler. Examples of micro-fluid heat pipes are disclosed in U.S. Pat. Nos. 7,334,630 and 7,331,378, the entire contents of each are incorporated by reference herein. In one embodiment, the fluid is a phase change fluid that absorbs heat and/or radiation from its environment (such as through the surfaces defining the fluid channels) and changes its phase such that the energy may be stored (such as in a solar thermal storage device) for release at a later time. In another embodiment, solar radiation incident on the fluid within the active region of the fluid transfer component causes the photoactive molecules to change shape wherein the energy is stored within the chemical bonds. In this embodiment, fluid may flow through the fluid channels and out one or more fluid output couplers to a heat exchanger, for example. Alternatively, the energy may be released at a later time via a trigger. The trigger, such as chemical or radiation exposure, can convert the stored energy into heat and/or convert it into electricity. In the release process, the molecules would change back into their original shape and recharged again via solar radiation or thermal radiation, for example. In one embodiment, the transfer fluid is a magnetic fluid. In another embodiment, the magnetic transfer fluid flows by magnetic propulsion.

Transfer Fluid Thermal Properties

In one embodiment, the thermal expansion coefficient of the material forming one or more of the inner surfaces of one or more channels substantially matches the thermal coefficient of expansion of the transfer fluid. In another embodiment, the ratio of the thermal expansion coefficient of the material forming one or more of the inner surfaces of one or more channels to the thermal coefficient of expansion of the transfer fluid is one or more selected from the group 0.5 to 1.5, 0.6 to 1.4, 0.7 to 1.3, 0.8 to 1.2, 0.9 to 1.1, 0.95 to 1.05, 0.98 to 1.02 0.99 to 1.01 and 1 over a first temperature range. In one embodiment, the temperature range is one selected from the group −195 to 300,−100 to 200,−100 to 150,−50 to 100, 0 to 100, and −20 to 150, 0, 23, and 100 degrees Celsius at a pressure of 101.325 kilopascals.

In one embodiment the vapor pressure of the transfer fluid is less than one selected from the group 6 MPa, 1 MPa, 500 kPa, 100 kPa, 50 kPa, 10 kPa, 5 kPa, 1 kPa, 500 Pa, 200 Pa, and 100 Pa at 20 degrees Celsius. In another embodiment the vapor pressure of the transfer fluid is greater than one selected from the group 6 MPa, 1 MPa, 500 kPa, 100 kPa, 50 kPa, 10 kPa, 5 kPa, 1 kPa, 500 Pa, 200 Pa, and 100 Pa at 20 degrees Celsius.

In one embodiment, the freezing point of the transfer fluid is less than or equal to one selected from the group 0,−10,−20,−30,−40,−50,−60,−80,−90,−100,−120,−130,−140,−150,−160,−170,−180,−190,−200,−210,−220, and −230 degrees Celsius at a pressure of 101.325 kilopascals.

In one embodiment, the fluid is a salt solution with a high specific heat capacity. In another embodiment, the fluid comprises one or more salts or materials selected from the group: lithium bromide, calcium chloride, magnesium chloride, sodium chloride, potassium acetate, potassium formate, potassium carbonate, and betaine. In another embodiment, the fluid comprises one or more fluids selected from the group: methanol, ethanol, ethylene glycol, propylene glycol, 1,3-propanediol, glycerin, mineral oil, and synthetic oil.

Transfer Fluid Optical Properties

In one embodiment, the optical properties of the transfer fluid is one or more selected from the group: light reflecting, light scattering, light absorbing, light transmitting, and light emitting. These optical properties are discussed with respect to the active region in the active region optical properties section and the optical properties, levels, and degrees of the optical properties discussed with respect to the active region may be the properties of the transfer fluid. For example, in one embodiment, the degree or level of reflectance of the transfer fluid is one or more selected from the group 10%, 15%, 20%, 25%, 30%, 35%, 40%, 45%, 50%, 51%, 55%, 60%, 65%, 70%, 75%, 80%, 85%, 90%, 95%, and 99% of the incident light in a first wavelength or first wavelength band incident from a first angle or first angular range. In another embodiment, the transfer fluid redirects incident light of a first wavelength or first wavelength band from a first angle or first angular range such that the light has one or more properties selected from the group: the light incident from a first angle or first angular range is redirected to a second angle or second angular range different from the first angle or first angular range; the light incident from a first angle is redirected to an angular range with a full angular width at half maximum intensity in degrees greater than one selected from the group: 0.5, 1, 2, 4, 5, 10, 15, 20, 25, 30, 450, 45, 50, 60, 70, 80, and 90 when measured using laser light of the first wavelength with a divergence less than 5 milliradians; the transfer fluid has an ASTM D1003-00 haze greater than one selected from the group of 0.3%, 0.5%, 1%, 3%, 5%, 10%, 20%, 30%, and 40%. In another example, the transfer fluid absorbs an average of more than 5% of the incident light of a first wavelength or first wavelength band incident from a first angle or first angular range when it is a thickness at the average channel thickness within the film transfer component.

In one embodiment the refractive index of the transfer fluid is one selected from the group: 1-1.3, 1.3-2.9, 1.3-1.7, 1.33-1.7, 1.5-1.7, 1.6-1.7, and 1.7-2.9.

In one embodiment, the fluid comprises a mixture of two materials that are immiscible in a first temperature range and miscible in a second temperature range. In one embodiment, the mixture of fluids are a single phase at a first temperature range and the phases separate at second temperature range. For example, in one embodiment, the transfer fluid is a mixture of cyclohexane and aniline. Aniline and cyclohexane are immiscible over a wide range of compositions below about 35 degrees Celsius. At temperatures below about 35 degrees Celsius, the phases can separate and scatter light. The scattering can increase such that the mixture becomes opaque. This phenomenon is called critical opalescence. Similarly, binary fluid mixtures of methanol and cyclohexane; perfluorotributylamine and isopentane; a saturated paraffin and beta, beta'-dichloroethyl ether or chlorex as the other liquid also exhibit this property. This dynamic optical property can be utilized, for example, in application where the one desires a component comprising the fluid mixture to become more cloudy, hazy, or reflectively scatter light below a first indication temperature. In another embodiment, the fluid is light absorbing and comprises a solvent such propylene carbonate or propylene carbonate and a light absorbing dye such as a 1,2-chrome complex dye or a phthalocyanine dye. The fluid may also comprise a UV stabilizer.

Transfer Fluid Additives

In one embodiment, the transfer fluid comprises one or more additive selected from the group: monohydroxy and polyhydroxy compounds, thixotropic agents, plasticizers, toughening agents, pigments, fillers, abrasive granules, stabilizers, light stabilizers, antioxidants, flow agents, bodying agents, flatting agents, colorants, dyes, pigments, binders, blowing agents, fungicides, bactericides, surfactants, glass and ceramic beads, organic and inorganic fibers, flakes, particles, microspheres, nanospheres, hollow microspheres, hollow nanospheres, non-biodegradable surfactant, fluorescent dyes or pigments, phosphorescent dyes or pigments, quantum dots, viscosity modifiers, solvents, corrosion inhibitors, pH buffers, and hydrocarbons.

In one embodiment the fluid comprises flakes that comprises multiple layers of coatings or nanostructured materials that provide constructive interference (such as multilayer dichroic coatings) to highly reflect light incident at a first angular range and a first wavelength range. Suitable wavelength ranges and angular ranges for the flakes for reflection may be the same as those described herein for the light reflecting state. In one embodiment the fluid comprises flakes that comprises multiple layers of coatings that provide destructive interference to highly absorb light incident at a first angular range and a first wavelength range. Suitable wavelength ranges and angular ranges for the flakes for absorption may be the same as those described herein for the light absorbing state.

In one embodiment, the fluid comprises a nanostructured photonic material that is a broadband mirror for solar radiation and emits radiation very efficiently. In one embodiment, flakes of a broadband mirror for solar radiation that emits radiation very efficiently are added to the first liquid such that when the first liquid flows through the fluid transfer component, solar radiation is reflected back into the environment in the active region. In this mode, the fluid transfer component is an effective cooling technology for cooling a roof, home, or other device such as in the summertime or hot days. In this embodiment, when a second fluid that does not comprise the flakes of a broadband mirror for solar radiation that emits radiation very efficiently (optionally comprising a light absorbing material (such as nanoparticles of carbon)) flows through the fluid channels, the fluid transfer component (and the fluid transfer system comprising the same) can function as a solar thermal device that captures solar radiation and heat and transfers the heat via the fluid flow to a heat exchanger or other location (such as a thermal storage device for use at a later time). In this embodiment, the fluid transfer system comprising the fluid transfer component can switch from an efficient radiative cooler to a solar thermal collector by changing the fluid that flows through the fluid channels. Examples of materials that can be processed into flakes and methods of producing the materials, and configurations providing cooling or thermal transfer that comprise a nanostructured photonic material that is a broadband mirror for solar radiation and emits radiation very efficiently are found in U.S. Patent Application Publication No. US2015338175, the entire contents of which are incorporated by reference herein. In another embodiment, the fluid comprises particles or domains that reflect and/or transmit specific wavelength bandwidths. For example, in one embodiment, a photovoltaic cell comprises a fluid transfer component that has a transmittance greater than 80% over a first infra-red light wavelength range positioned receive incident solar radiation (concentrated or non-concentrated) and generate electricity. In this embodiment, the fluid transfer component could be in the form of a film laminated to a glass cover, protective cover or layer, or directly to the photovoltaic cell. In another embodiment, the fluid transfer component reflects or absorbs greater than 50% of a second infra-red wavelength range. In this embodiment, the second wavelength range may provide reduced or no substantial photo-electric conversion in conjunction with the photovoltaic cell and the fluid transfer component reflects light of the second wavelength range to reduce the temperature of the photovoltaic cell to increase its efficiency. Alternatively, a fluid of the fluid transfer component positioned with its active area above the active area of the photovoltaic cell may absorb light of the second wavelength range and transfer the energy In another embodiment, the light transfer component, or fluid therein, comprises a plurality of gold nanospheres, gold nanorods, indium tin oxide nanoparticles, or other nano-scale size material that reflects or absorbs light in specific wavelength ranges visible and/or infrared wavelengths bands of the electromagnetic spectrum. In one embodiment, the second wavelength range includes wavelengths greater than 1200 nanometers.

In one embodiment, the fluid comprises air bubbles within the volume of the fluid in the active region of the fluid transfer component. The air bubbles may have an average diameter less than one selected from the group of: 500, 400, 300, 200, 100, 50, 30, 20, 10, 5, 4, 2, 1, 0.5, 0.4, 0.3, 0.25, 0.2, and 0.15 micrometers. In one embodiment, the air bubbles reduce the effective viscosity of the fluid such that the flow rate is increased. In another embodiment, the bubbles provide light scattering to achieve a light scattering state in the active region of the fluid transfer component In another embodiment, the average diameter of the bubbles is less than 300 nanometers and the bubbles are not visible and/or they lower the effective refractive index of the liquid to achieve an optical state. In another embodiment, the refractive index of the fluid comprising nanoscale bubbles (such as bubbles with a mean diameter less than 300 nanometers) is less than the same fluid without the nanoscale bubbles under the same conditions. In a further embodiment, the refractive index ($n_D$) of the fluid comprising nanoscale bubbles (such as bubbles with a mean diameter less than 300 nanometers) is less than 1.33 at 25 degrees Celsius.

Methods of achieving nanoscale gas bubbles that may be used include using atomizing spray head, electrolysis, introducing gas into a liquid at a high shear rate, forming fluorocarbon droplets, clathrate hydrate dissociation, saturation at higher pressures followed by pressure drop, saturation at low temperatures followed by fast temperature increase jump, high water flow creating cavitation, mixing $CO_2$ gas and water, decomposition of $H_2O_2$, or by a combination of one or more of these processes. In another embodiment, a gas-liquid mixture is created by pressuring a fluid stream that includes a mixture of a gas and liquid, subjecting the fluid stream to at least 5 of alternating flow regions that include a plurality of laminar flow regions and turbulent flow regions; wherein the laminar flow regions and turbulent flow regions are distinguished by their respective calculated Reynolds numbers which differ by at least 500. Methods and configurations for creating nano-scale bubbles in a liquid are disclosed, for example, in U.S. Pat. No. 9,586,186, the entire contents of which are incorporated by reference herein. In one embodiment, the gas fluid mixture comprises one or more gasses selected from the group: oxygen, carbon dioxide, hydrogen, nitrogen, In another embodiment, the gas-fluid mixture with bubbles further comprises one or more surfactants to stabilize the bubbles. In another embodiment, the fluid comprises an insoluble gas and/or a soluble gas that may be in the form of bubbles. In one embodiment, the fluid transfer component comprises nanobubbles with average dimensions less than 1 micrometer coated on one or more sides of one or more fluid channels in the active region of the fluid transfer component and the slip length is increased versus the same fluid without the nanobubbles. In another embodiment the fluid comprises bubbles (such as nanobubbles) and the mass flow rate through the fluid channels is increased relative to the same fluid without the nanobubbles under the same conditions. In another embodiment the fluid comprises bubbles (such as nanobubbles) and the dynamic viscosity of the fluid through the fluid channels is reduced relative to the same fluid without the nanobubbles under the same conditions.

In one embodiment, the average length of the additive particles, domains, or flakes in one or more direction is less than one selected from the group 2 millimeters, 1 millimeter, 0.5 millimeter, 0.25 millimeter, 0.1 millimeter, 50 micrometers, 25 micrometers, 20 micrometers, 15 micrometers, 10 micrometers, 5 micrometers, 2 micrometers, 1 micrometer, 0.5 micrometer, 0.2 micrometer, 0.1 micrometer, and 50 nanometers. In one embodiment, the shape or a component of the shape of the additive particles, domains, or flakes is one or more selected from the group: planar, spherical, ellipsoidal, cylindrical, tubular, hollow, fibrous, asymmetric, randomly shaped, pyramidal, and polyhedral. In one embodiment the concentration of the additive is less than one or more selected from the group of 0.001, 0.01, 0.1, 0.5, 1, 2, 5, 7, 10, 15, 20, 25, 30, 35, 40, and 50 percent by volume or weight. In one embodiment the concentration of the additive is greater than one or more selected from the group of 0.001, 0.01, 0.1, 0.5, 1, 2, 5, 7, 10, 15, 20, 25, 30, 35, 40, and 50 percent by volume or weight. In one embodiment, the average largest dimension or average size of the particles within the transfer fluid is less than one selected from the group 70%, 60%, 50%, 40%, 30%, 20%, 10%, 5%, and 2% the smallest or average channel dimension through which the transfer fluid flows. By having particles that are significantly smaller than the channels, the likelihood of one or more particles clogging a channel is reduced.

In one embodiment, the fluid transfer component comprises additives that increase the thermal transfer or thermal conductivity of the fluid. In one embodiment, the fluid comprises a ceramic material that is at least partially translucent in its sintered state. Examples of such ceramic materials include poly crystalline alumina ($Al_2O_3$), aluminium nitride (AlN), yttrium aluminium garnet ($Y_3Al_5O_{12}$, also called YAG) and luminescent ceramic materials like cerium doped yttrium aluminium garnet ($Y_3Al_5O_{12}$:Ce). These ceramic materials are translucent to transparent materials that additionally have a high thermal conductivity, which provides good heat transfer properties.

In one embodiment, the transfer fluid, a coating on a surface of the fluid transfer component or a layer thereof, the material defining one or more channels, or a surface of one or more channels comprises a surfactant. In one embodiment, the surfactant is selected from the group: potassium palmitate, oleate, stearate blend, cetyl pyridinium chloride, coconut oil derivative, and a surfactant such as disclosed in U.S. patent application publication no. US20050084681, the entire contents are incorporated by reference herein.

In one embodiment, the transfer fluid is a salt-bearing solution and comprises salts such as chlorides or phosphates. For example, in one embodiment, the transfer fluid is a liquid comprising $CaCl_2$ in water or $NaH_2PO_4$ in water.

In one embodiment, the transfer fluid comprises one or more luminescent materials selected from the group: bioluminescent materials, chemiluminescent materials, electroluminescent materials, crystalloluminescent materials, cathodoluminescent materials, chemiluminescent materials, electrochemiluminescent materials, crystalloluminescent materials, electroluminescent materials, cathodoluminescent materials, mechanoluminescent materials, triboluminescent materials, fractoluminescent materials, piezoluminescent materials, photoluminescent materials, fluorescent materials, phosphorescent materials, radioluminescent materials, sonoluminescent materials, and thermoluminescent materials. For example, in one embodiment, the transfer fluid comprises a luminescent material and emits light when exposed to solar radiation. In another embodiment, the transfer fluid comprises wavelength conversion dyes or particles such as fluorescing dyes or pigments, fluorophores, quantum dots, phosphors, phosphorescent materials, photon upconversion materials, and photonic bandgap materials.

In one embodiment, the transfer fluid comprises particles that absorb a specific wavelength range of incident light. For example, in one embodiment, the transfer fluid comprises carbon black particles at a concentration of 0.1-40% by weight per the solution. In this example, the transfer fluid may comprise surfactants from 0.5-50% by weight of the total weight of the carbon black particles or other particles. The transfer fluid may comprise light absorbing particles that absorb more than a first average absorption percentage of incident light in the first wavelength or the first wavelength band as discussed previously in the light reflecting section, except in this context for absorbing particles. Similarly, the transfer fluid may comprise light reflecting particles that reflect an average first reflection percentage of incident light in the first wavelength or the first wavelength band as discussed previously in the light reflecting section, except in this context for reflecting particles instead of the fluid transfer component. In another embodiment, the transfer fluid comprises light scattering particles with a refractive index such that the refractive index difference between the particles and the fluid at a first wavelength greater than one selected from the group 0.01, 0.05, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, and 2.0. For example, in one embodiment, the transfer fluid is a silicone fluid with a refractive index of about 1.38 and the particles are titanium dioxide particles with a refractive index of about 2.6. In another embodiment, the fluid is air with a refractive index of about 1.0 and the particles dispersed in the air are titanium dioxide particles, resulting in a refractive index difference of about 1.6.

In one embodiment, the fluid comprises a chemical or additive to prevent algae growth or the growth of other bio-fouling organisms. For example, in one embodiment, the transfer fluid comprises copper sulfate. In one embodiment, the transfer fluid comprises additives that increase the heat adsorption. In one embodiment, the transfer fluid comprises one or more zeolites.

In one embodiment, the fluid in one or more fluid channels of the fluid transfer film or the matrix or material defining the one or more fluid channels comprises dielectric microparticles, such as glass microspheres with an average diameter (or largest dimension) from 1 to 20 micrometers, 5 to 20 micrometers, 5 to 10 micrometers, 1 to 500 micrometers, and 5 to 15 micrometers. In one embodiment, the concentration of the dielectric microparticles is less than one selected from the group: 40%, 35%, 30%, 20%, 15%, 10%, 5%, and 2%. In one embodiment, the dielectric microparticles are dispersed in a visible and IR light transmitting polymer matrix film with fluid channels disposed within the polymer matrix film, optionally with the film comprising a rear reflective material. For example, in one embodiment, glass microspheres with a diameter of about 8 microns (optionally encapsulated for dispersion or other optical effects) are dispersed into a matrix of a visible light and infra-red light transmitting polymer. In this example, the polymer is extruded into a microcapillary film, is combined with a rear reflective surface, and the film with the glass microspheres has a high light reflectance and infrared emissivity due to phonon-enhanced Frohlich resonances of the microspheres (optionally including higher order Frohlich resonances of polar dielectric microspheres). Thus, a microcapillary film comprising fluid channels with a fluid flowing through the microchannels and glass or dielectric microparticles the polymer defining the fluid channels (and/or the in the fluid) can be more effective at radiatively cooling the fluid flowing through the fluid channels. In this embodiment, the polymer comprising the microparticles of the dielectric material may provide strong absorption in both infrared and solar radiation while providing increased infrared emissivity which radiatively cools the film and/or the fluid flowing through the microcapillary film (or other fluid transfer film).

In this embodiment, the fluid transfer film comprising the dielectric particles within the polymer may provide increased radiative cooling when applied to a surface and/or provide increased radiative cooling to the fluid. In one embodiment, a thermal transfer device comprises a fluid transfer film comprising dielectric microparticles dispersed in a polymer such that the fluid transfer film has a high emissivity in one or more wavelength ranges (spectral ranges). In one embodiment, the average or minimum emissivity of the polymer defining the plurality of fluid channels (or microcapillary film/matrix material), fluid transfer film such as a microcapillary film (with optionally a reflective surface or coating applied to one side), or fluid flowing through a fluid channel is greater than one selected from the group: 0.5, 0.6, 0.7, 0.8, 0.9, and 0.95 in one or more of the solar spectrum, infrared spectrum, from wavelengths between 1 and 15 micrometers, and visible spectrum. In one embodiment, the radiative cooling power of the polymer defining the plurality of fluid channels (or microcapillary film or matric material) or the fluid transfer film (or microcapillary film) optionally with a reflective surface, coating, or additional film applied to one side (such as a side opposite solar incidence) is greater than one selected from the group: 30, 40, 50, 60, 70, 80, 90, 100, 120, and 150 Watts per square meter in one or more spectral bands selected from the group: 1 and 50 micrometers, 1 and 20 micrometers, 5 and 30 micrometers, 0.5 and 30 micrometers, the solar spectrum, the infrared spectrum, and visible light spectrum. In one embodiment, the fluid and/or polymer has a high emissivity such that it may absorb and emit thermal radiation into the environment for thermal applications (such as a fluid transfer film used on a roof to collect heat for solar thermal applications, or a fluid transfer film used underground to transfer heat into the ground to cool the fluid for cooling a building in a geothermal heat pump (ground source heat pump) or other thermal application) or heating applications. In some embodiments, the average or maximum emissivity of the polymer defining the plurality of fluid channels (or microcapillary film/matrix material), fluid transfer film such as a microcapillary film (with optionally a reflective surface or coating applied to one side), or fluid flowing through a fluid channel is less than one selected from the group: 0.5, 0.4, 0.3, 0.2, 0.1, and 0.05 in one or more of the solar spectrum, infrared spectrum, from wavelengths between 1 and 15 micrometers, and visible spectrum. In one embodiment, the fluid and/or fluid transfer film has a low emissivity (and optionally a high UV, visible, and infrared light absorption) such that the fluid can absorb and hold the heat while the fluid is transferred to a separate location. For example, in one embodiment, a microcapillary fluid transfer film comprises particles, such as microparticles or nanoparticles, with a low emissivity wherein the emissivity of the fluid is reduced relative to the fluid alone, and the fluid is more efficient at transferring heat from the active area of the fluid transfer film to an environment external to the active area of the fluid transfer film.

Flow Source

In one embodiment, the fluid flow source is one or more selected from the group: inherent with the structure of the film-based fluid transfer component, comprised within or adjacent the film-based fluid transfer component, and in fluid communication with the film-based fluid transfer component. In one embodiment, the flow source actuates the fluid flow by one or more selected from the group: pressure sources, external mechanical pumps, integrated mechanical micropumps, capillary forces, electrokinetic mechanisms, phase transfer mechanisms, piezoelectric actuators, pneumatic actuators, magnetic actuators, thermoelastic actuators, mechanical actuators, linear actuators, rotary (screw-type) actuator, electroosmotic flow mechanisms, positive flow pump, rotary-type positive displacement pump, reciprocating-type positive displacement pump, linear-type positive displacement pump, rotary lobe pump, progressive cavity pump, rotary gear pump, piston pump, diaphragm pump, screw pump, gear pump, hydraulic pump, vane pump, regenerative (peripheral) pump, peristaltic pump, microfluidic peristaltic pump, rope pump, impulse pump, velocity pump, centrifugal pump, radial flow pump, axial flow pump, mixed flow pump, eductor-jet pump, gravity pump, steam pump, valveless pump, wicking, magnetic propulsion, phase change, microelectromechanical systems (MEMS) propulsion, synthetic jet, convection, thermosiphon, vacuum generator, light exposure and surface plasmons, dielectrophoretic pump, electrowetting pump or driven flow, pondermotive force due to electric field, and the Marangoni effect.

MEMS type pumps include those driven by electrostatic forces such as those discussed in U.S. Pat. No. 6,485,273, MEMS structures that may provide MEMS oscillatory flap devices such as those are described in U.S. Pat. Nos. 6,057,520; 6,229,683; 6,236,491; 6,373,682; 6,396,620; and 6,456,420, all to Goodwin-Johansson, the disclosures of all of which are incorporated by reference herein. In one embodiment, the flow source is a micropump such as disclosed in WIPO patent application publication number (WO) 2012084707, the entire contents are incorporated by reference herein.

In another embodiment, the fluid flow source comprises one or more electro-mechanical polymer actuators that vibrate or deform to propel the fluid by movement as a micro-pump due to an electrostrictive effect when an electric field is applied. In one embodiment, the fluid flow source comprises one or more materials or layers of materials selected from the group: poly(vinylidene fluoride) (PVDF) or copolymers thereof; P(VDF-TrFE-CFE) (poly(vinylidene fluoridetrifluoroethylene-chlorofluoroethylene)); carbon nanotubes-P(VDF-TrFE-CFE) composite; P(VDF-TrFE-CTFE) (poly(vinylidenefluoride-trifluoroethylene-chlorotrifluoroethylene)); Poly(vinylidene fluoride-trifluoroethylene); Electron-Irradiated Poly(vinylidene fluoride-trifluoroethylene) Copolymer; and ferroelectric materials. In one embodiment, the polymer actuators are positioned within the active region or outside of the active region. In one embodiment, each fluid channel comprises a polymer actuator or fluid flow source. In another embodiment, each fluid channel comprises a plurality of polymer actuators or fluid flow sources.

In one embodiment, the fluid flow source propels the fluid by low energy light illumination and either a doped semiconductor surface or a surface-plasmon supporting surface in combination that manipulating a fluid on the surface in the absence of or in addition to any applied electric fields or fluid channels. Precise control of fluid flow can be achieved by applying focused or tightly collimated low energy light to the surface-fluid interface. In one embodiment, with an appropriate dopant level in the semiconductor substrate, optically excited charge carriers are made to move to the surface when illuminated. In a second embodiment, with a thin-film noble metal surface on a dispersive substrate, optically excited surface plasmons are created for fluid manipulation. This electrode-less optical control of the Marangoni effect provides re-configurable manipulations of fluid flow, thereby paving the way for reprogrammable microfluidic devices. Examples of fluid flow control by the Marangoni effect are disclosed in U.S. Pat. No. 7,939,811, the contents of which are incorporated by reference herein.

The flow source is in fluid communication with the fluid transfer component and may be located in one or more a regions selected from the group: within the fluid transfer system, external to the fluid transfer system, separately from the fluid transfer component and in fluid communication with the fluid transfer component via a fluid input coupler or a fluid output coupler, separately from the fluid transfer component and in fluid communication with the fluid transfer component via one or more fluid connectors, internal to the fluid transfer component, and internal to the channels within the active region of the fluid transfer component.

Mass Flow Rate of the Fluid

In one embodiment the mass flow rate of the fluid through one or more fluid channels in the active region is greater than or less than one selected from the group: 0.00001, 0.0001, 0.001, and 0.01 kg/s. In another embodiment, the mass flow rate of the fluid through a single layer fluid transfer element comprising a plurality of fluid channels in the active region is greater than or less than one selected from the group: 0.00001, 0.0001, 0.001, 0.01, 0.1, and 1 kg/s. In another embodiment, the mass flow rate of the fluid through a multiple layer fluid transfer element, each layer comprising a plurality of fluid channels in the active region is greater than or less than one selected from the group: 0.00001, 0.0001, 0.001, 0.01, 0.1, 1, and 10 kg/s. In one embodiment, multiple fluid films with an array of 1×N fluid channels (such as an array of 1×10,000 channels) are combined (such as laminated) to increase the total mass flow rate in the active region. In a further embodiment, one or more fluid films with an array of M×N with N and M greater than 1 are combined, such as laminated to increase the total mass flow rate of the fluid in the active region.

Volumetric Flow Rate of the Fluid

In one embodiment the volumetric flow rate of the fluid through one or more fluid channels in the active region is greater than or less than one selected from the group: 0.00001, 0.0001, 0.001, and 0.01 cubic centimeters per second. In another embodiment, the total volumetric flow rate of the fluid through a single layer fluid transfer element comprising a plurality of fluid channels in the active region is greater than or less than one selected from the group: 0.00001, 0.0001, 0.001, 0.01, 0.1, 1, and 10 cubic centimeters per second. In another embodiment, the total volumetric flow rate of the fluid through a multiple layer fluid transfer component (such as a multi-layer capillary film or corrugated film), each layer comprising a plurality of fluid channels in the active region is greater than or less than one selected from the group: 0.00001, 0.0001, 0.001, 0.01, 0.1, 1, 10, 100, and 1000 cubic centimeters per second. In one embodiment, multiple fluid films with an array of 1×N fluid channels (such as an array of 1×10,000 channels) are combined (such as laminated) to increase the total volumetric flow rate in the active region. In a further embodiment, one or more fluid films with an array of M×N with N and M greater than 1 are combined, such as laminated to increase the total volumetric flow rate of the fluid in the active region.

Reynolds Number of the Fluid in the Fluid Channels

In one embodiment the Reynolds number for fluid flow in one or more fluid channels of the fluid input coupler is greater than or less than one selected from the group: 1; 5; 10; 50; 100; 500; 1,000; 5,000; 10,000; 50,000; 100,000; 500,000; 1,000,000; 5,000,000; 10,000,000; and 100,000,000.

Flow Regulation of Fluid Transfer Component

In one embodiment, the fluid transfer system comprises one or more valves, switches, connectors, flow modifiers, restrictors, or gates to control direction and/or flow rate of the fluid in one or more fluid connectors, input couplers, output couplers, fluid transfer components, flow sources, or fluid channels.

The flow rate or direction may be adjusted automatically, manually, by a controller, by a controller based on feedback from one or more sensors, based on environmental conditions, or based on thermal or optical performance. In one embodiment, reservoirs comprising transfer fluids of different colors are used to adjust the color of the active region of the fluid transfer component. More than one fluid and/or reservoir comprising a fluid can permit one to "dial in" the optical, thermal or other property, level or state. Examples of fluid valves are discussed in U.S. Pat. No. 6,681,788, the entire contents are incorporated by reference herein. In one embodiment, the fluid transfer system comprises one or more one-way valves to prevent fluid from flowing in a specific direction.

Self Regulation

In one embodiment, the fluid transfer system configured to be self-regulating under specific conditions. For example, in on embodiment, when the transfer fluid reaches a specific high temperature, the flow source may be stopped such that the fluid flows, such as by gravity, away from the active region and into a different component of the system such as a reservoir. In another embodiment the fluid flow is regulated based on direct input or analysis of sensor information. For example, in one embodiment, the fluid flow may be stopped or reduced due to a drop or increase in pressure, temperature, optical property of the liquid, thermal property of the liquid, physical property of the liquid, chemical property of the liquid, optical property of the fluid transfer component, thermal property of the fluid transfer component, physical property of the fluid transfer component, environmental conditions, or other internal or external information received (such as information received and processed by a microprocessor) beyond a safe operating range.

In one embodiment, the fluid transfer system comprises a thermal overload protection feature or configuration by connecting a valve to the supply line such that with loss of fluid flow, the valve opens and the fluid in the fluid transfer component automatically drains into a reservoir (such as draining due to gravity, for example). In another embodiment, the transfer fluid is chosen such that it's boiling temperature is below and near or at the maximum safe operating temperature for the transfer fluid in the system such that when the fluid turns into a vapor, the flow of the liquid through the fluid transfer component stops, is reduced and may drain automatically.

Reservoirs

In one embodiment, the fluid transfer component comprises one or more reservoirs that comprise one or more transfer fluids in one or more optical states, thermal states, or other conditions. The reservoir may advantageously comprise an access opening to empty its contents or may be otherwise connected to conventional drainage systems. In one embodiment, more than one fluid is stored in the same reservoir.

Expansion Mechanism

In one embodiment, the fluid transfer system comprises an expansion mechanism that receives a volume of liquid from the system due to thermal expansion of the liquid. For example, in one embodiment, the fluid transfer system comprises a bladder that expands due to the volumetric expansion of the transfer fluid. In another embodiment, the fluid transfer system comprises an overflow chamber that receives the fluid overflow due to thermal expansion. Other expansion mechanisms such as those known in the fluid control industry may be used.

Manufacturing the Fluid Transfer Component

The method of making of structured surfaces, surface relief profiles, and in particular microstructured surfaces that may define one or more channels, on a polymeric layer such as a polymeric film that may be suitable for a fluid transfer component are disclosed in U.S. Pat. Nos. 5,069,403 and 5,133,516, both to Marentic et al, the contents of which are incorporated by reference herein. Structured layers may also be continuously microreplicated using the principles or steps described in U.S. Pat. No. 5,691,846 to Benson, Jr. et al. and other patents that describe microstructured surfaces include U.S. Pat. No. 5,514,120 to Johnston et al., U.S. Pat. No. 5,158,557 to Noreen et al., U.S. Pat. No. 5,175,030 to Lu et al., and U.S. Pat. No. 4,668,558 to Barber, the entire contents of each are incorporated by reference herein.

Hollow fibers maybe be manufactured by hollow fiber spinning machines, extrusion, gas assisted extrusion, injection molding, and other methods known to those in the filtration industry. Hollow fibers can also be made by spinning or other fiber making techniques. For example, methods of making hollow fibers have been described in U.S. Pat. Nos. 2,999,296 and 4,234,431, which are hereby incorporated herein in their entireties by reference.

In one embodiment, the fluid transfer component comprises surface features or layers that may comprise micro size or nano size features, corrugated microlayers, channels within the film, or high aspect ratios and their description and method of manufacture may be described in U.S. Pat. Nos. 7,531,120, 7,303,642, and U.S. patent application publication nos. 20040050532 and 20110192233, the entire contents of each are incorporated by reference herein.

In one embodiment, the fluid transfer film comprises walls such as a polycarbonate multiwall glazing sheet. In one embodiment, a fluid transfer films comprises one or more walls defining channels and the channels are prevented from collapsing in a manufacturing step (such as extrusion or stretching) by flowing air or other gas through the channels from a manufactured end of the article or the extrusion die or apertures in the channel forming device. In one embodiment, the temperature of the gas is kept lower than the temperature of the polymer or other material forming the wall or surface by 5, 10, 20, 30, 40, 50, or 60 degrees Celsius at a forming or stretching point. In one embodiment, the fluid transfer film is a multi-walled corrugated film formed by extruding one or more resins through a multi-wall dye adapted for film extrusion. In one embodiment, the fluid transfer film is a double or triple walled corrugated film formed by stretching a larger multiwall sheet. In one embodiment, a film or sheet comprising channels forms a preform that is stretched to form a thinner film or sheet with smaller channel cross-sections. In one embodiment, the preform is a collection of objects comprising channels (such as a bundle of hollow fibers) that are stretched such that the channels are reduced in size and form fluid channels for a fluid transfer component. In one embodiment, the preform is a corrugated, fluted, hollow, impregnated, embossed, or laminated film or sheet. In another embodiment, the preform comprises surface that define one or more channels or channel surfaces after stretching.

In another embodiment, the method of manufacturing a fluid transfer component comprises grouping together a plurality of hollow tubes or hollow extensions of a material with a geometric or polygonal cross-section continuous with the extension into a bundle, and stretching the bundle while applying heat. In one embodiment, the method further comprises flowing an air or liquid through the openings within the tubes or extensions.

In one embodiment, the fluid transfer component is sufficiently flexible to be used in situations that require intimate contact to irregular surfaces. In one embodiment, the fluid transfer component has a flexibility such that it can be conformed about a mandrel that has a diameter of approximately one inch (2.54 cm) or greater without significantly constricting the fluid channels or the structured polymeric layer. In another embodiment, the fluid transfer component is fashioned from polymeric materials, inorganic materials, or a combination thereof, that allow the fluid transfer component to be non-detrimentally conformed about a mandrel that is approximately 1 cm in diameter when the component is at a temperature higher than one selected from the group of 35, 50, 70, 100, 120, 140, and 160 degrees Celsius.

Substrate or Support Layer

In one embodiment, the fluid transfer component comprises a substrate, superstrate, or support layer. In one embodiment, one or more substrate, superstrate, or support layer comprises one or more selected from the group: thin glass, ultra-thin glass, acrylic, fluoropolymer, glass reinforced polymer, polycarbonate, polyethylene terephthalate, polyethylene naphthalate, a composite, ethylene vinyl acetate, silicone layer, tie layer, PFA, FEP, laminate, fabric, weave, a sheet, curtain, blinds, drapes, window, door, panel, shingle, house, and building siding.

In one embodiment, the substrate, superstrate, or support layer for the fluid transfer component or a component thereof such as a surface relief layer has a thickness less than one selected from the group: 4, 3, 2, 1, 0.5, 0.4, 0.3, 0.2, 0.1, 0.075, 0.05, and 0.025 millimeters.

In another embodiment, the substrate, superstrate, or support layer for the fluid transfer component or a component thereof such as a surface relief layer comprises a barrier layer the inhibits in flow of oxygen, gas, moisture, water, or the transfer fluid from the channels to the environment or from the environment into the channels. Barrier films are known in the plastic packaging, polymer processing, polymer film processing, and solar industry and can be used with embodiments of the fluid transfer component. Barrier films can, for example, include coatings such as oxide coatings, multilayer extrusions of polymers (including films extruded with hundreds of layers) and other barrier technologies for gases or liquids.

In one embodiment, the substrate, superstrate, or support layer for the fluid transfer component or a component thereof is a reinforced layer, such as a fiber reinforced film or includes one or more domains, webs, meshes, weaves, layers (such as metal layers), that reinforce or increase the flexural or tensile modulus of the fluid transfer component.

Adhesive

In one embodiment, an adhesive is used to physically couple two or more components in the fluid transfer component. In another embodiment, a layer or region of the adhesive forms a surface of one or more fluid channels. For example, in one embodiment, a linear array of lines of adhesive may be printed (such as screen printed, inkjet printed, or microgravure printed) on a substrate followed by lamination of a cover film onto the adhesive materials. In one embodiment, spacers such as microspheres of a specific diameter or range of diameters (such as beads with a mean diameter less than 10, 20, 30, 40, 50, 60, 70, 80, 90, 100 micrometers) may be added to the adhesive or regions between the adhesives to substantially maintain film separation during the bonding process. In another embodiment, the adhesive is cured such that the bond and spacing is fixed. In this embodiment, the adhesive material forms the lateral side walls of the fluid channels and the top and bottom films or substrates define the upper and lower surfaces of the channels. In one embodiment, the width, size, or direction of one or more channels changes by an angle of about 10, 20, 30, 40, 45, 50, 60, 70, 80, 90, 100, 110, 120, 130, 135, 140, 150, 160, 170, and 180. In another embodiment, the fluid channels flow in one direction along a first half of the fluid transfer component and return on a second half of the fluid transfer component. In this embodiment, the supply flow channels may comprise a first fluid channel geometry converter fluidly connected to a first fluid flow connector (such as an inlet pipe), and the return flow channels may comprise a second fluid channel geometry converter fluidly connected to a second fluid flow connector (such as an outlet pipe).

Power Supply or Powering Means

In one embodiment, the fluid transfer system is powered by one or more selected from the group: alternative current, direct current, battery, photovoltaic, thermoelectric, stored energy material, petroleum source, and combustion source. In one embodiment, the fluid transfer system transitions from a first state (optical, thermal, etc.) to a second state or a first level or degree of a first state to a second level or degree of a first state and only consumes power during the transition. In one embodiment, the fluid transfer system comprises a photovoltaic panel or region that generates electrical power to supply the flow source of the fluid transfer system.

Light Redirecting and Reflecting Features

In one embodiment, the fluid transfer component comprises at least one light redirecting and light reflecting feature, region, or component selected from the group: diffractive optical elements, diffusely reflecting elements, off-axis specularly reflecting elements (such as, for example without limitation, prismatic films that have been coated with a reflective coating or embossed 3M ESR film), flakes of reflective material not parallel with the high refractive index region, holographic optical elements, holograms, prismatic features, totally internally reflecting features, refractive and reflective features, reflectively coated features (such as, for example without limitation) hemispherical concave features in the high refractive index material with a reflective coating, corner cube reflectors, bead-based retroreflector, hollow microspheres, hollow or gas filled cavities (such as, for example without limitation, grooves, pits, hemispheres, etc. that can cause light to totally internally reflect), reflecting elements combined with angularly sensitive light scattering materials (such as angle dependent light control film Lumisty from Sumitomo Chemical Co., Japan), reflective polarizers, non-planar reflective features formed in reflective polarizer films, dispersed phase diffusers or reflecting films, oriented films comprising titanium dioxide or other scattering domains, and voided films.

Light Transmitting and Redirecting Features

In one embodiment, the fluid transfer component comprises at least one light redirecting and transmitting feature, region, or component selected from the group: diffractive optical elements, diffusely transmitting elements, off-axis specularly transmitting elements (such as, for example without limitation, prismatic films), flakes of transmitting materials material not parallel with the high refractive index region, holographic optical elements, holograms, prismatic features, refractive features, microspheres, beads, particles, hollow or gas filled cavities (such as, for example without limitation, grooves, pits, hemispheres, etc. that can cause light to transmit at different angles), angularly sensitive light scattering materials such as angle dependent light control film Lumisty from Sumitomo Chemical Co., Japan), dispersed phase diffusers, oriented films comprising titanium dioxide or other scattering domains, voided films, beaded films, coated films comprising microlens, or other refractive, diffractive, holographic, or scattering features.

Housing

In one embodiment, the fluid transfer system comprises at least one of a cover, housing, based that provides at least one of a fluid sealed environment, isolation from the external environment, heat conduction surface for heat extraction, and a window for light transmission.

Attachment Regions

In one embodiment, the fluid transfer component comprises one or more attachment regions for attaching the fluid transfer component to an object. In one embodiment, the attachment regions extend from or are located near the periphery of the fluid transfer component in a first direction such as the fluid flow direction. In one embodiment, for example, the fluid transfer film comprises attachment guides (such as holes or eyelets) extending from a metal foil, insulating layer, or film surface on the back of the fluid transfer film for nailing or otherwise affixing the fluid transfer film to a roof or support structure such as a wall, mount, beam, or window. In another embodiment, for example, the fluid transfer film comprises a pressure sensitive adhesive layer on the back of a metal foil, insulating layer, or film surface on the back of the fluid transfer film for affixing the fluid transfer film to an object such as a roof. In one embodiment the attachment region has a high thermal conductivity, such as an epoxy with a high thermal conductivity. In another embodiment the attachment region has a very low thermal conductivity, such as a thermally insulating layer. In one embodiment the fluid transfer component or fluid transfer film comprises a physical connector, fastener, grommet, clip, hook, or an adhesive for physically coupling it to a building, structure, device, object, or vehicle. For example, in one embodiment, the fluid transfer component comprises an adhesive that bonds to roof shingles with a first peel strength 24 hours immediately after installation at a temperature less than 30 degrees Celsius and after operating the fluid transfer component the temperature of the adhesive increases to a temperature beyond 50 degrees Celsius and the peel strength is increased over the installation peel strength. In another embodiment, the attachment mechanism or region of material comprises one or more holes in the material or pathways between the fluid transfer component and a structure for ambient air or wind to flow.

Orientation of the Fluid Transfer Component

In one embodiment, the fluid transfer component in a fluid transfer system is oriented such that the fluid channels in the active region are oriented horizontally, vertically, at an angle to the horizontal and/or vertical, in a plane parallel to the structure (such as a roof) to which the component is mounted, at a range of orientations (such as the case when the film is wrapped around a non-planar object such as a pipe), perpendicular to the solar azimuth angle, or perpendicular to the solar zenith angle. In another embodiment, the orientation of the fluid transfer component is dynamic, reconfigurable, user reconfigurable, or automatically adjusted. In one embodiment, the fluid transfer component is retractable, rollable and/or unrollable. For example, in one embodiment, a solar thermal fluid transfer system comprises a fluid transfer component with one or more fluid input and/or fluid output couplers oriented along a horizontal edge of the fluid transfer component when oriented on a tilted roof and the fluid transfer component may be manually, or automatically rolled up on the roof (such as for increased protection during high winds or a hailstorm, for example).

Surface Relief on Outer Surface

In one embodiment, the fluid transfer component comprises a light receiving surface with a surface roughness, Ra, greater than one selected from the group: 0.25 micrometers 0.5 micrometers, 1 micrometer, 2 micrometers, 5 micrometers, 10 micrometers, 20 micrometers, 25 micrometers, 50 micrometers, 100 micrometers, 200 micrometers, and 500 micrometers. By making the outer surface have a surface relief profile, more light can transmit into the fluid transfer element (such as in the case of a moth-eye type antireflection surface) and the glare or reflection from the outer surface can be reduce (the fluid transfer film could appear more like the diffusely reflecting and absorbing shingles on a house, for example).

Filters

In one embodiment, the fluid transfer system comprises one or more filters. Filters may remove particles that could clog, block, or partially obstruct one or more channels. Other filters may remove water, moisture, or water vapor that could cause problems when freezing or problems of material degradation. In one embodiment, the filter is service replaceable or replaceable by the user. In another embodiment, the filter is positioned in fluid communication and between the flow source and the input coupler.

Other Components

In one embodiment, the fluid transfer component includes one or more microelectronic, microoptical, and/or micromechanical elements as well. Examples of microelectronic elements include conductive traces, electrodes, electrode pads, microheating elements, electrostatically driven pumps and valves, microelectromechanical systems (MEMS), and the like. Examples of microoptical elements include reflective elements (e.g., prisms), beam splitters, lens elements, solid state light sources and detectors, and the like. Examples of micromechanical elements include filters, valves, pumps, pneumatic and hydraulic routing, and the like. The microelements may be incorporated in the cover layer, either surface of the fluid transfer component, an additional polymeric substrate bonded to the fluid transfer component, or a combination thereof. dd Sensors In one embodiment, the fluid transfer system comprising a fluid transfer component comprises one or more sensors selected from the group: acoustic sensor, microphone, chemical detector, carbon dioxide sensor, electrochemical gas sensor, hydrocarbon dew point analyzer, water sensor, moisture sensor, oxygen sensor, light sensor (sensitive to light of a first wavelength or first wavelength band as disclosed above for the light reflecting state), imager, photodetector, smoke detector, current sensor, voltage sensor, galvanometer, hall effect sensor, magnetometer, accelerometer, metal detector, radio wave detector, antenna, snow gauge, rain gauge, precipitation gauge, solar detector for tracking, air flow meter, flow sensor, mass flow sensor, water meter, gas pressure gauge, liquid pressure gauge, scintillator, altimeter, depth gauge, compass, gyroscope, magnetic compass, yaw rate sensor, auxanometer, capacitive displacement sensor, gravimeter, gyroscopic sensor, piezoelectric sensor, linear encoder, odometer, position sensor, tilt sensor, charge-coupled device, colorimeter, image sensor, electro-optical sensor, flame detector, infra-red light sensor, ultraviolet light sensor, a light emitting diode as a light sensor, fiber optic sensor, optical position sensor, photodiode, photoresistor, photoswitch, pressure sensor, pressure gauge, tactile sensor, hydrometer, force gauge, piezoelectric sensor, strain gauge, torque sensor, bolometer, heat flux sensor, thermometer, infrared thermometer, resistance temperature detector, thermistor, thermocouple, motion detector, occupancy sensor, proximity sensor, passive infrared sensor, refractive index sensor, refractometer, radiometer, spectrometer, and photospectrometer. For example, in one embodiment, the fluid transfer system comprises a snow detector that reverses the flow of the fluid transfer system or turns on a heating element thermally coupled to the fluid to warm the fluid to melt the snow in the active region of the fluid transfer component.

Safety Valve

In one embodiment, the fluid transfer system comprises one or more safety valves that close one or more fluid paths, supply lines, return lines, or channels, when the system is operating in an unsafe condition, the environmental conditions change to unsafe condition, based on information or feedback from one or more sensors, based on a microprocessor analyzing the data from one or more sensors, or a component ceases to function or function efficiently. In one embodiment, for example, the fluid transfer system comprises a fluid transfer component within a plurality of roofing shingles and when the system detects a leak in the active region of the fluid transfer component of a shingle, the fluid flow to that shingle is stopped or the fluid flow to the active region is stopped while the fluid flow through channel remains open.

Metal or Other Absorber Layer

In one embodiment, the fluid transfer system comprises a metal or other light absorber layer positioned behind the thermal transfer component or between two thermal transfer components. For example, in one embodiment, a solar thermal fluid transfer device comprises a thermal transfer component with fluid channels above a metal light absorbing foil, sheet, or film and a thermal transfer component with fluid channels below the metal light absorbing foil, sheet, or film such that heat may be transferred to the fluid from both sides of the metal, light absorbing foil, sheet, or film. In another embodiment, the metal light absorbing foil, sheet, or film forms the inner surface of one or more fluid channels on one or both side of the metal light absorbing foil, sheet, or film such that efficient heat transfer to the fluid may be achieved. In this embodiment, the surface of the metal light absorbing foil, sheet, or film facing the fluid in the fluid channel may be embossed, coated, or otherwise modified as in configurations disclosed herein, such as those to reduce the flow resistance.

Applications for the Fluid Transfer System

In one embodiment, the fluid transfer system performs one or more fluid transfer operations, thermal transfer operations, or optical operations or transitions.

Fluid Transfer Applications

In one embodiment, the fluid transfer system comprises films or capillary materials to move or transfer fluid by capillary action such as those disclosed in U.S. Pat. No. 6,290,685, the contents of which are incorporated by reference herein. In one embodiment, a fluid transfer system or fluid transfer component comprises a channel structures, device configuration, layer, film, material, adhesive, coating, method of manufacturing a microstructured film, assembly, module, device, separation membrane or device, active or passive heat exchange device, fluid dispenser, absorbing device, detection article, or is used in an applications as disclosed in U.S. Pat. Nos. 6,290,685; 6,514,412; 7,422,911; 6,986,428; 5,728,446; 6,381,846; U.S. patent application publication numbers 20100318072, 20070212266, 20050123727, 20040226886, 20030211291, 20020011330; and WIPO patent application publication numbers (WO) 2005052270, (WO)2006043181, (WO)2008070048, the entire contents of each are incorporated by reference herein.

Medical

In one embodiment, the fluid transfer system provides fluid flow for medical applications such as drapes, suction matts, films, or tapes that wick away a fluid to a reservoir or pouch. Examples of fluid transfer devices and configuration using fluid transfer films are disclosed in U.S. Pat. Nos. 6,420,622 and 6,746,567, the entire contents of each are incorporated by reference herein. In another embodiment, the fluid transfer system is a device that warms or cools parenteral fluids such as disclosed in U.S. Pat. No. 5,245,693, the entire contents are incorporated by reference herein. In one embodiment, a first fluid transfer component is removable and/or disposable and a second fluid transfer component may be operatively coupled to the fluid transfer system in place of the first fluid transfer component to replace a removed first fluid transfer component. In another embodiment, the fluid transfer system comprises a patch with a fluid transfer component and the fluid transfer component delivers a medicine, drug, or other fluid to a person through a patch, or component applied or positioned proximate the skin of an individual. In this embodiment, the fluid transfer component may have transfer holes (in the thickness direction) that lead from the interior of one or more fluid channels through an exterior surface of the fluid transfer component in an active region. In another embodiment, the fluid transfer component comprises one or more transfer holes passing entirely through the device and the fluid channels.

Chemical or Biological Analysis

In one embodiment, the fluid transfer system provides fluid transfer for a biological or chemical analysis system. In one embodiment, the fluid transfer component permits the sensing or detecting of a passing fluid where the active region acts as the fluid interface component in a sensor or detector system. A fluid detection or analysis system might, for example, monitor fluid conductivity, pH, temperature, or composition, provide observation through an analytical device such as a microscope or spectrometer, and analyze fluid as it passes in a thin film through the channels.

In one embodiment, the fluid transfer system comprises a microfluidic fluid transfer component that provides fluid transfer for a biological or chemical analysis. Examples of microfluidic devices and applications are disclosed in U.S. Pat. No. 6,761,962, the contents of which are incorporated by reference herein.

Other applications for fluid management that may utilize the fluid transfer system or fluid transfer component include industrial applications which benefit from fluid management, such as aerospace (i.e., reduction of corrosion by evaporative and collective mechanisms for fluid), turbine air compressors (from improvement in condensation knockout efficiency), oil separation in industrial processes, condensate removal in refrigeration, condensate collection efficiency in appliance applications, spill control in electronic applications (i.e., computer keyboards), deicing by means of continuous fluid removal, removal and/or collection of hazardous fluids (i.e., solvents, hydraulic fluids, acidic media or basic media), delivery of fluids with increased efficiency (e.g., inks, coatings, fuels, fragrances, etc.), removal of specific liquids (e.g., water, inks or other fluid sprays) from a surface, and detection of hazardous or non-hazardous fluids by combination with detection devices.

In one embodiment, the fluid transfer component comprises a sensor, reagent, or analyte on a surface of the component (such as an outer surface or inner surface of a channel, for example), within the component, or exterior to the component such that an analysis can be made (such as for example by optical imaging, using microstructures for biological assays and reactions, liquid chromatography, analyzing polynucleotide sequences, or other sequencing) as disclosed for example, in U.S. Pat. Nos. 6,091,502, 6,585,939, U.S. patent application publication number 20010045358 and WIPO patent application publication number (WO)2001032930, the entire contents of each are incorporated by reference herein. In other embodiments, the fluid transfer component transfers fluid in a microfluidic manner for molecular biology procedures for enzymatic analysis (e.g., glucose and lactate assays), DNA analysis (e.g., polymerase chain reaction and high-throughput sequencing), proteomics, point-of-care diagnosis of diseases, continuous sampling and real-time testing of air/water samples for biochemical toxins and other dangerous pathogens, or an always-on "bio-smoke alarm" for early warning.

In another embodiment, the fluid transfer component may comprise a plurality of fluid channels that may be used as flow cells for a flow cytometry device. In this embodiment, by using a plurality of channels, the analysis of the cells or objects/materials in the fluid may be accomplished in an efficient, parallel measurement device (as opposed to a single flow cell (serial measurement) flow cytometer) for increased throughput, accuracy (redundancy), numerous types of simultaneous measurements.

Membrane for Flow Battery

In one embodiment, the fluid transfer system comprises a fluid transfer component with a plurality of fluid channels (and optionally layers with arrays of fluid channels) that transfer fluids to the active region where the inner surface of one or more fluid channels is a membrane that only allows ions not involved in chemical reactions to pass between the liquids while keeping the active ions physically separate as in a flow battery.

Semipermeable Membrane

In one embodiment, one or more inner surfaces of one or more layers or the inner or outer surfaces of one or more fluid channels comprises a polymeric semipermeable membrane that allows certain molecules or ions to pass through it by diffusion or by facilitated diffusion, passive transport, or active transport. In one embodiment, the fluid transfer system is a desalination system for water where the polymeric semipermeable membrane is used for a reverse osmosis process.

Microchannel Reactor

In one embodiment, the fluid transfer component is a microchannel reactor (MCR) to synthesis organic materials. The MCR may have a catalyst in one or more fluid channels and a reactant in one or more fluid channels where the laminar flow profile along with the potentially uniform distribution of reactant concentration across the cross-section of the fluid channel can result in low residence times that can result in high selectivity of the reaction and/or products. In one embodiment, a fluid transfer system comprises a microchannel reactor and one or more fluid channel geometry converters for inputting or outputting one or more fluids from the fluid transfer component.

Gas Collection or Emission Device

In one embodiment, the fluid transfer system transfers a gas to the fluid transfer component or receives a gas from the fluid transfer component. In one embodiment, the fluid transfer system can be employed as a smoke or gas evacuator. The flexible aspirator, for example, could be used in applications where smoke plumes from laser surgery might be encountered. It could also be used to recover methane gases and permeating fluids or gases from landfills, acting as a geosynthetic membrane. In one embodiment, the fluid transfer system is used to collect methane gas from operational or closed wells (such as natural gas wells, oil wells, coalbed methane well, deep water wells, or other wells), the ocean floor, or well operating equipment such as compressors. In this embodiment, the active region of the fluid transfer component could be laid across and fixed in place, or buried around the well or equipment to collect the escaping methane gas. In another embodiment, the fluid transfer system is used to distribute a gas or liquid from one or more channels or apertures in fluid communication with the channels out of the fluid transfer component. In one embodiment, the fluid transfer component captures one or more gasses or liquids when placed on or under the ground. For example, in one embodiment, the fluid transfer component collects water and methane when placed over a landfill or when buried under the surface of a landfill by passive flow of the liquid and/or gas into the fluid channels or active flow by applying a vacuum or lower pressure to the fluid channels. In one embodiment, the liquid and/or gas may be captured through apertures or holes from the exterior surface of the fluid transfer component to the interior of the fluid channels. In another embodiment, the liquid and/or gas may permeate into the fluid channels through the polymer or other material forming the channel and/or fluid transfer component. For example, in one embodiment, the fluid transfer component may comprise one or more layers or materials on the ground side of the fluid channels that has a high methane permeation rate and low water permeation rate such that methane permeates into the fluid channels and may be remove naturally due to a build up of pressure or a vacuum may be applied to pull the methane out from the channels. Alternatively, a carrier fluid such as air or nitrogen may flow through the channel to assist in collecting the methane. In another embodiment, the fluid transfer component may comprise one or more layers or materials of the fluid channels or fluid transfer component on the side of the fluid transfer component opposite of the ground side (or on the side closest to the air environment when the fluid transfer component is located underground) that has a low methane permeation rate and low water permeation rate such that methane permeating from the decomposing material below the fluid transfer component is effectively trapped, collects, or may be transported away by fluid flow since it does not readily permeate through the upper surface. In another embodiment, the fluid transfer component has a transmission greater than 70% over one or more of the following wavelength ranges: 300-400, less than 400, 400-700, 450-650, 350-1750, 350-1000, 400-1000, 700-1000, 700-900, 900-1200, 900-2000, and greater than 700 nanometers. In another embodiment, the fluid transfer component is position on the ground such that the transmission of solar energy over one or more wavelength ranges facilitates decomposition.

In one embodiment, the fluid transfer component comprises transverse holes or openings in the thickness direction of the film or component that pass through to the fluid channels. In this embodiment, the transverse holes may have an average diameter or largest dimension less than one selected from the group of 50, 30, 20, 10, 5, 4, 3, 2, 1, 0.5, 0.1, and 0.05 micrometers. In another embodiment, the transverse holes are of sufficiently small size such that water does not naturally wick into the holes at an equalized pressure between the water and the interior of the fluid channels. In this embodiment, the fluid channels may capture methane or other gases naturally (such as for a cover placed over or buried within a landfill) without water directly flowing into the fluid channels. In another embodiment, one or more layers of the fluid transfer component comprise a porous film or layer that permits gas, such as methane, to permeate through the film or layer while preventing one or more liquids, such as water, to permeate through the film. In another embodiment, the fluid transfer component comprises holes penetrating the entire thicknesses of the fluid transfer component (such as holes in the film that pass completely through the film) in the active region or on one or more sides of the active region. In this embodiment, the holes may function as drainage holes for rainwater to permeate through the fluid transfer component. In another embodiment, one or more layers or surfaces of the fluid transfer component comprises nonwoven spunbond olefin fibers (such as flashspun high-density polyethylene fibers) that prevent liquid water from passing through the layer or surface, but do not prevent water vapor from transmission through the layer or surface. These layers or films may be disposed above and/or below the fluid channel or may form an upper or lower film or layer that defines an upper and/or lower surface of the fluid channel (such as in the case of a corrugated film where one or more channels are defined by the corrugation). In one embodiment, more than one gas type (such as Nitrogen, oxygen, and methane) and/or a gas and a liquid is collected by the fluid transfer system and the system further comprises a filter, compressor, or other device to separate one gas from another (such as separating methane gas from the other gases) and/or a gas from a liquid (such as water and methane).

In one embodiment, the fluid transfer component comprises at least one layer in at least the active region comprising reinforcing materials to increase the strength of the fluid transfer component. For example, in one embodiment, a substrate or carrier layer for at least the active region of the fluid transfer component comprises fibers of glass (fiberglass reinforced), fibers of a material with a higher Young's modulus than the matrix material, carbon fibers, or other fibers or materials. For example, in one embodiment, a methane capture system comprises a fluid transfer component comprising a fiberglass layer to provide tear resistance and strength compared to the same component without the fiberglass layer.

Gas Transmission Rates

In another embodiment, one or more layers, films, or materials defining one or more fluid channels in the fluid transfer component has first gas (such as oxygen, methane, carbon dioxide, nitrogen, or other gas) and/or second gas equal pressure transmission rate (at 73 degrees Fahrenheit, 0% relative humidity) greater than one selected from the group: 0.01, 0.05, 0.1, 0.5, 1, 2, 5, 10, 50, 75, 100, 200, and 500 cubic centimeters (cc) per 100 square inches per 24 hours. In one embodiment, the active region of the fluid transfer component or one or more layers, films, or materials defining one or more fluid channels in the fluid transfer component has a first gas (such as oxygen, methane, carbon dioxide, nitrogen, or other gas) and/or second gas equal pressure transmission rate, at 73 degrees Fahrenheit, 0% relative humidity, less than one selected from the group: 0.01, 0.05, 0.1, 0.5, 1, 2, 5, 10, 50, 75, 100, 200, and 500 cubic centimeters (cc) per 100 square inches per 24 hours. In one embodiment, the gas transmission rate is for a material with a thickness of 25 micrometers or for a film comprising a coating, or a multilayer film. For example, in one embodiment, a methane gas collection system comprises a fluid transfer component with an upper layer and a lower layer where the lower layer has a methane gas transmission greater than 500 cc per 100 square inches per 24 hours and the upper layer has a methane gas transmission rate less than 2 cc per 100 square inches per 24 hours. In one embodiment, one or more layers or films of the fluid transfer component is a microperforated film with a high transmission rate for a gas such as oxygen, methane, carbon dioxide, nitrogen, or other gas. In another embodiment, one or more layers or films of the fluid transfer component is a modified atmosphere packaging polymer or material.

Moisture Vapor Transmission Rates

In one embodiment, the active region of the fluid transfer component or one or more layers, films, or materials defining one or more fluid channels in the fluid transfer component has an equal pressure moisture vapor transmission rate, at 100 degrees Fahrenheit, 95% relative humidity, less than one selected from the group: 0.0005, 0.001, 0.005, 0.008, 0.01, 0.05, 0.1, 0.5, 1, 2, 100, 200, and 500 grams per 100 square inches per 24 hours. In another embodiment, one or more layers, films, or materials defining one or more fluid channels in the fluid transfer component has an equal pressure moisture vapor transmission rate (at 73 degrees Fahrenheit, 0% relative humidity) greater than one selected from the group: 0.01, 0.05, 0.1, 0.5, 1, 2, 100, 200, 500, 1000, 1500, 2000, and 2500 grams per 100 square inches per 24 hours. In one embodiment, the moisture vapor transmission rate is for a material with a thickness of 25 micrometers or for a film comprising a coating, or a multilayer film. For example, in one embodiment, a methane gas collection system comprises a fluid transfer component with an upper layer and a lower layer where the lower layer has a methane gas transmission greater than 10 or 500 cc per 100 square inches per 24 hours and the upper layer has a methane gas transmission rate less than 2 or 0.1 cc per 100 square inches per 24 hours.

Microfluidic Display

In one embodiment, the active region of the fluid transfer component or a plurality of fluid transfer components define one or more pixels, images, or graphics, of a microfluidic display. Embodiments of fluid transfer components may be used to transfer or supply fluids microfluidic display such as disclosed in European patent application publication number (EP)2116987 or a large format microdisplay such as disclosed in WIPO patent application publication number (WO) 2008070048, the entire contents of each are incorporated by reference herein.

Air Circulation Device

In one embodiment, the fluid transfer system is an air circulation device wherein air is circulated in a closed or open loop fashion through the fluid transfer component. For example, in one embodiment, the air circulation device of one embodiment flows air through a fluid transfer film to oxygenate, provide air circulation, provide heated air, provide air conditioning for a vehicle, building, room, outdoor area, or garden, for example. In this example, the air can be emitted or drawn in from a large emitting or receiving area and function as supply or return vents or openings.

Liquid Transfer Device

In one embodiment, the fluid transfer system transfers a liquid to the environment through the fluid transfer component. For example, in one embodiment, the fluid transfer component may emit water through channel openings in the active region to water a garden (from above or below) or provide water and/or water vapor to increase the humidity in an environment. In another embodiment, the fluid transfer component may be a membrane. The membrane construction of one or more embodiments comprising a fluid transfer component can be used as part of a membrane module in a fluid filtration system as disclosed in U.S. Pat. Nos. 5,639,373; 5,204,001; 6,406,629; 5,192,456, 6,375,848, and 6,303,035, the entire contents of each are incorporated by reference herein. In another embodiment, the fluid transfer component membrane can be: (1) used in a wastewater treatment or water treatment facility as part of a membrane bioreactor such as membrane bioreactors as disclosed in U.S. Pat. Nos. 6,277,209 and 5,451,317, the entire contents of each are incorporated by reference herein, (2) sparged with air bubbles of varying sizes to reduce biological fouling as disclosed in European Pat. No. 0,510,328, U.S. Pat. No. 6,193,890, U.S. Pat. App. Publication No. 20010047962, U.S. Pat. No. 5,192,456, European. Pat. No. 0,700,713-B1, U.S. Pat. No. 5,451,317, European Pat. App. 0,510,328-A2, U.S. Pat. No. 6,224,766, WIPO patent application no. (WO) 00/37369, and U.S. Pat. No. 5,944,997, the entire contents of each are incorporated herein by reference, (3) cleaned using chemicals and/or by back-washing of the membrane constructions as disclosed in U.S. Pat. App. Publication No. 20010052494, E.P. 1,166,859-A2, and European. Pat. No 0,322,753-B1, the entire contents of each are incorporated herein by reference, and (4) operated with a pressure gradient across the membrane construction either caused by pressure from water outside of a submerged membrane module, a hydrostatic pressure difference, or a vacuum or pressure source connected to a manifold.

In one embodiment, the fluid transfer component is a submerged membrane filter. A number of factors affect the performance of a submerged membrane filter device, such as the way the membrane modules are mounted in the filtering or bioreactor unit, the spacing of the membrane modules, the pore size, the membrane materials and the operating conditions of the actual filtering or bio-reactor unit. These performance factors are well known in the art and are disclosed in U.S. Pat. No. 5,192,456, and European Pat. App. 0,937,494-A3 the entire contents of each are incorporated herein by reference.

In one embodiment, the fluid transfer system comprises an absorptive (light and/or thermal radiation) fluid or liquid for thermal related processes. In another embodiment, the transfer fluid is exposed to electromagnet radiation or solar radiation and fluid transfer component performs photo chemical, photoelectrical, photoelectrochemical or photobiological processes. In another embodiment, the fluid transfer system may include active or passive control of fluid transfer. In another embodiment, the fluid transfer system, fluid transfer component, or a component or layer thereof is one or more selected from the group: diaper, pad, absorbent mat, bandage, wound management device, drain, drape, vacuum device, filter, separation media, heat exchanger, liquid dispensing devices, and other microfluidic devices for the testing and/or handling of fluid samples. Such applications may be usable with physiological fluids as described above, and/or with other fluids.

In one embodiment, the fluid transfer system is a component of a diaper wherein the active region collects a liquid that flows to a reservoir outside of the active region. In this embodiment, for example, one or more channels of the fluid transfer component may be defined by a liquid permeable polymer. In another embodiment, one or more channels of the fluid transfer component may be defined by a liquid impermeable polymer such that the liquid does not pass through the channel on the side opposite from where the liquid comes into contact with the channels. In this embodiment, the fluid may flow at least in part due to capillary action and/or a flow source. In this embodiment, unlike traditional diapers, the fluid may be collected in an area further from the skin or in a pouch or other reservoir. In one embodiment, the channels are not interconnecting throughout the active region, through the fluid transfer component, through the fluid transfer system up to the input fluid input coupler and/or fluid output coupler, or through the fluid transfer system up to the output and/or input ends of the fluid channel geometry converter.

In another embodiment a vehicle (such as an aircraft, water craft, land craft and space craft) comprises the fluid transfer system or components thereof. For example, in one embodiment, the fluid transfer component of a fluid transfer system functions as a radiator to cool or heat a liquid or air flowing toward an engine in a closed or open loop. In another embodiment, a vehicle, device, object, or person is operatively coupled to a fluid transfer component that cools one or more of its surfaces by evaporative cooling. For example, in one embodiment, an electric or electronic-combustion hybrid vehicle comprises one or more fluid transfer components. In this example, a fluid transfer component may be positioned on the exterior of the vehicle (on the roof of a car, for example) or positioned to receive air from the vehicle exterior where water exiting one or more channels (such as through channel openings) evaporatively cools the active region of the fluid transfer component and the same channels or neighboring channels transfer water cooled (such as conductively cooled) from the active region to the interior of the vehicle, a heat exchanger, or one or more fluid transfer elements to distribute air cooled by the cooled water from the active region to the interior of the vehicle.

Similarly, a vehicle could comprise a fluid transfer component positioned to receive solar radiation such that the solar heated fluid flows out of the active region to the interior of the vehicle, a heat exchanger, or one or more fluid transfer elements to distribute air warmed by the heated fluid from the active region to the interior of the vehicle.

In another embodiment, a fuel cell comprises a fluid transfer component that delivers or receives a fluid (such as a gas, air, oxygen, hydrogen, natural gas, methanol, ethanol, electrolyte, solution, acid, water, hydrocarbon, microbial material, or other liquids or gases known to be supplied or emitted from fuel cells or fuel cell reactions). In another embodiment, the fuel cell comprises a fluid transfer component proton exchange membrane. In one embodiment, the fluid transfer component supplies fuel and/or electrolytic material to the cell, removes or supplies water, or supplies air for the evaporation of water for the cell. In one embodiment, the fluid transfer component is a membrane or a component of a fuel cell such as those disclosed in U.S. Pat. No. 4,758,481, the entire contents are incorporated by reference herein.

In one embodiment, a cleaning or processing device comprises a fluid transfer component that supplies hot water, steam, or other hat liquid, gas, or vapor to a cleaning pad or to the environment for cleaning or processing an object with the emitted liquid, gas, or vapor. In this embodiment, for example, the fluid transfer component may be used to uniformly distribute, randomly distribute, or non-uniformly distribute in a defined pattern a liquid or gas onto an area or region of object (such as a large 1 meter by 1 meter area or a very small area less than 1 centimeter by 1 centimeter) or into an environment. In one embodiment, the fluid transfer component spreads a volume of fluid into and out of an area such that the fluid may treated or processed in a large area. For example, in one embodiment, water flows through the channels in an active region of the fluid transfer component where it is exposed to ultraviolet light to kill bacteria or other organisms.

Filtration and Desalination

In one embodiment, the fluid transfer system or film transfers a first fluid or material through the matrix or polymer defining the fluid channels into the fluid in the fluid channels such that the fluid flows away and may be collected or transferred. In one embodiment, a membrane for a reverse osmosis or forward osmosis process comprises a fluid transfer film (such as a microcapillary film), wherein a fluid (such as water) from a feed solution is drawn into the fluid channel. In one embodiment, the polymer defining the fluid channels allows a solvent (such as water or purified water) to pass through the polymer to the fluid channels (such as those in a microcapillary film), to be collected or transferred to a different location due to selectivity of the polymer, matrix, or layer due to pore size, differences in solubility, diffusivity, or other methods used in reverse osmosis, forward osmosis, or membrane filtration technologies. In one embodiment, the fluid transfer film comprises an asymmetric membrane or skin layer in contact with a feed solution or draw solution. In one embodiment, the draw solution flows through the fluid channels. In another embodiment, the feed solution flows through the fluid channels. In one embodiment, the polymer defining the fluid channels comprises an ion exchange membrane and electrodeionization or electrodialsysis is used to remove ions from the feed supply to the draw, such as removing salt from water, for example. In one embodiment, the polymer defining the fluid channels (or a second layer adjacent the polymer layer defining the fluid channels) is a porous or foam material wherein the polymer may collect solids and/or large molecules (microfiltration and/or ultrafiltration) and allow the filtered water or solvent to pass through into the fluid channels for collection or transfer. In one embodiment, the feed source fluid is a vapor and the polymer defining the fluid channels (or a layer adjacent the polymer layer) is a porous, hydrophobic polymer such that the pores are not wetted by water in liquid form and allow vapor to permeate through the pores into the fluid channel. In one embodiment, a fluid transfer system comprises a rolled fluid transfer film (such as a microcapillary film) wherein the fluid channels of the fluid transfer film are oriented parallel to the axis around which the film is rolled. In this embodiment, the fluid transfer system may be filtration system, reverse osmosis system or forward osmosis system wherein the permeate or filtered fluid may be collected in the axial direction. In another embodiment, a fluid transfer system comprises a rolled fluid transfer film (such as a microcapillary film) wherein the fluid channels of the fluid transfer film are oriented orthogonal to the axis around which the film is rolled wherein the fluid may be collected by a tube, region, manifold, or fluid channel geometry converter in the central (or exterior) region of the rolled fluid transfer film. In this embodiment, the fluid transfer system may be filtration system, reverse osmosis system or forward osmosis system wherein the permeate or filtered fluid may be collected from the central region (or exterior region) of the rolled fluid transfer film. In one embodiment, the fluid flows through the fluid channels at least in part by capillary action such that less energy is required for the fluid to flow through the fluid channels. In one embodiment, the fluid flows through the polymer into the fluid channels at least in part by capillary action such that less energy (and/or pressure) is required to filter the fluid flowing into the fluid channels.

Thermal Transfer Device

In one embodiment, the fluid transfer system transfers heat energy from a first location to a second location different from the first. In one embodiment, the fluid transfer component receives heat (or light) through conduction, emission, or convection and transfers the heat to second location (such as a heat exchanger). In another embodiment, heat from a first location is transmitted by fluid flow to the fluid transfer component where it is distributed to the active region of the fluid transfer component or a surface of the fluid transfer component. In another embodiment, heat transferred to the fluid in the active region of the fluid transfer component may be used to generate electrical power in a generator, such as a steam-based generator or Stirling engine or it may be used for sterilization, distillation, or desalination.

In one embodiment, the fluid transfer component comprises a thermally conductive material (such as a thin metal foil) where heat may be efficiently transferred to or from the transfer fluid in channels within the active region of the fluid transfer component. In one embodiment, the channels are defined by the surface structure (such as a channel with a rectangular, elliptical, polygonal cross-section or channel defined by surface relief features) of one or more metallic materials. For example, in one embodiment, a fluid transfer component comprises a copper foil comprising fluted, corrugated channels. In this example, the fluid transfer component may transfer heat to or from the environment to or from a fluid in the channels, such as a radiator, heat sink, or heat pipe. In one embodiment, the fluid transfer component is placed within, disposed upon, or disposed adjacent a surface to be warmed or cooled. For example, the fluid transfer component could be a fluid transfer component (that may comprise metal layers and/or polymer layers) that can be positioned under, on top of, or within a floor (as a radiant floor heating element, for example); a mattress; a rug or carpet; an item of furniture or a fixture (such as a chair, couch, countertop, light fixture, or swimming pool, sauna, or hot tub) concrete (such as a sidewalk, driveway, or foundation); a roof or roofing component such as a shingle; a ceiling; a wall; a floor; a window (such as adhered to a window or positioned between two panes glass in a window); a door; a vehicle; a refrigerator; a freezer; a fireplace; a flame; a building; a home; a heater; a humidifier; a dehumidifier; an air conditioner; a fan; a furnace; a HVAC unit; a garment, accessory or article of clothing such as a shirt, fireman's coat, a hat, a sock; a semiconductor chip or electronic component (such as a microprocessor, CPU, GPU, light emitting diode, computer chip, or amplifier); or a device, object, structure, or environment known to be heated, cooled, or known to supply heating or supply cooling.

In one embodiment, the fluid transfer component can be changed from a reflecting state to a light absorbing or thermal emission state. For example, in one embodiment, a garden or farm comprises a fluid transfer film comprising light transmitting channel defining material positioned above a specularly reflective film. In this example, in the summer, the reflective film can reflect a portion of the solar radiation that would have otherwise missed the plant back toward the plant. In this state, the fluid transfer component has a reflective state due to the presence of a clear or light transmitting fluid or gas within the channels and the light passing through the material defining the channels is reflective by the reflective film. In cooler weather, the fluid transfer element may transition to a light absorbing state, for example, by flowing a light absorbing fluid into the channels to absorb the solar radiation during the day and warm the environment (such as the air and/or the ground to which it may be thermally coupled). This warmer environment may increase crop yield, production, and/or prevent frost. Alternatively, a warm fluid may be transferred through the channels to warm the environment (such as a fluid heated remotely using a boiler). The warm fluid in this alternative state may be light absorbing, light reflecting, light scattering, transparent, or a combination thereof and may transition the fluid transfer element from the light reflecting state to a different optical state.

Solar Applications

In one embodiment, the transfer fluid in the fluid transfer component receives solar radiation, absorbs a portion of the solar radiation, and transfers the heat to a heat exchanger (such as for a hot water heater) or a ground source heat pump system (such as to cool the liquid such that it could cool the roof).

In one embodiment, the fluid transfer system provides cooling (by transferring heat away from) one or more surfaces of a building or structure. In another embodiment, the fluid transfer system provides heating (such as by transferring the heated fluid to a heat exchanger where it heats water). Examples of solar heating and architectural applications for thermal transfer using fluids are disclosed in U.S. Pat. Nos. 4,327,706, 4,270,517, 4,167,934, 4,056,094, 4,521,442, and 4,055,163 the contents of each are incorporated by reference herein.

In one embodiment the fluid transfer component comprises a film and is positioned conformably on the angled roof of a building and the optical axis of the corner cubes formed on the inner surface of one or more channels in a fluid transfer film are oriented at a first angle theta, where theta is greater than zero degrees and less than 90 degrees, to the normal of the film such that solar incident radiation may be optimally retroreflected during the summer months when the refractive index of the fluid is significantly higher than that of the outer material forming the surface of the corner cube elements. Alternatively, inverted corner cube elements (where the sides of the retroreflecting surfaces of the cubes protrude into the channel) defining one or more surfaces of one or more channels may be used. In this example, a low refractive index fluid such as air may be pumped or flow into the channels such that the corner cube elements are highly retroreflective (in the summer months, for example). In the winter months, in this example, a higher refractive index fluid (such as silicone fluid comprising carbon black particles) may be pumped or flow through the channels such that solar radiation is absorbed and the heat is used in a building after the liquid passes through a heat exchanger. Alternatively, the transfer liquid could be transparent and the solar radiation in the winter months may pass through the channels and be absorbed by a light absorbing film or material behind the channels and the heat from the absorbing material conducts through the channel defining material and into the fluid. In one embodiment, the black light absorbing material forms the rear surface of the channel.

Concentrating Solar Power

In one embodiment, the fluid transfer system is used to transfer fluid in a concentrating solar power application. In one embodiment, the fluid transfer component is positioned to receive concentrated light from lenses such that one or more fluid channels receive a higher flux density solar radiation that it would without the lenses. In one embodiment, the lenses are physically and optically coupled to the fluid transfer component. In another embodiment, the lenses are external to the fluid transfer component. In one embodiment, an array or arrangement of channels are positioned to receive light from a 1:1 corresponding array or arrangement of lenses that focus light onto the channels and/or the fluid in the channels of the fluid transfer component. In another embodiment, the fluid transfer component is operatively coupled to a tracking system that orients and/or positions the fluid transfer component to receive more light on the channels as the sun moves across the sky. In one embodiment, the fluid transfer element is a variable light redirecting element for a concentrating solar power system.

Cooling Solar Panels

In one embodiment, the fluid transfer system is positioned on the light receiving side or the opposite side of a photovoltaic material (such as a photovoltaic panel, film, etc.) and the fluid flow through the active region of the fluid transfer component removes heat from the photovoltaic material through conduction and/or absorption of light at wavelengths at which the photovoltaic cell has a low spectral response. The spectral response can be evaluated by dividing the current generated by the photovoltaic cell by the incident power on the photovoltaic cell. In one embodiment, the fluid (which may include nanoparticles that absorb radiation) in the fluid transfer component absorbs more than 10%, 20%, 30%, 40%, 50%, 60%, 70%, 80%, 85%, 90%, and 95% of incident light at a wavelength at which the photovoltaic cell has a spectral response less than 10%. In another embodiment, the fluid (which may include nanoparticles that reflect radiation) in the fluid transfer component reflects more than 10%, 20%, 30%, 40%, 50%, 60%, 70%, 80%, 85%, 90%, and 95% of incident light at a wavelength at which the photovoltaic cell has a spectral response less than 10%. In this embodiment, the reflected light may keep the photovoltaic cell cooler since less of this light is absorbed by the fluid transfer component and/or the photovoltaic cell. In one embodiment, a fluid transfer system for a photovoltaic device comprises a light transmitting fluid transfer component on the front side of the photovoltaic cell (light receiving side) comprising a fluid and/or particles in the fluid that one or more of the following properties: reflect light of wavelengths for which the photovoltaic cell has a low spectral response (to prevent unnecessary heating of the photovoltaic cell); absorbs light of wavelengths for which the photovoltaic cell has a low spectral response (such that the heat may flow away from the active region of the photovoltaic cell by the flow of the fluid); absorbs and re-emits light at different wavelengths for which the photovoltaic cell has a higher spectral response (such as through photoluminescence, phosphorescence, a quantum dot, a quantum rod, a quantum based light wavelength conversion materials, a fluorophore, a down-conversion materials, an up-conversion materials, etc.); and efficiently conduct heat from the front side of the photovoltaic cell such that the heat may flow away from the active region of the photovoltaic cell using fluids and/or particles or additives with high specific heat capacity (including phase change materials, ceramics, diamond nanoparticles).

In another embodiment, a fluid transfer system for a photovoltaic device comprises a fluid transfer component on the back side of the photovoltaic cell (opposite the light receiving side of the photovoltaic side) comprising a fluid and/or particles in the fluid that absorbs light of wavelengths that the photovoltaic cell transmits to the fluid transfer component such that the captured energy in the form of thermal may flow away from the active region of the photovoltaic cell to keep it cooler and/or efficiently conducts heat from the back side of the photovoltaic cell such that the heat may flow away from the active region of the photovoltaic cell, such as using fluids and/or particles or additives with high specific heat capacity (including phase change materials, ceramics, and diamond nanoparticles).

In one embodiment, a photoelectric device comprises one or more light transmitting fluid transfer components on a front, light receiving side and one or more fluid transfer components on the back side opposite the light receiving side wherein each or all of the one or more light transmitting fluid transfer components on the front side comprises one or more fluid channel geometry converter on one or more lateral sides (including input and/or output couplers) that are serially or parallel connected with the same fluid flow source (using the same fluid) or one or more are connected to separated fluid flow sources (using the same or different fluids). In another embodiment, each or all of the one or more fluid transfer components on the back side comprises one or more fluid channel geometry converter on one or more lateral sides (including input and/or output couplers) that are serially or parallel connected with the same fluid flow source (using the same fluid) or one or more are connected to separated fluid flow sources (using the same or different fluids). In another embodiment, the one or more light transmitting fluid transfer components on the front side are fluidly connected to one or more fluid transfer components on the back side in a parallel and/or serial fluid flow geometry using the same fluid and optically using fluid channel geometry converters (that may optionally be connected to each other directly without substantial lengths of piping between them).

Evaporative Cooling Device

In one embodiment, the fluid transfer system comprises a fluid transfer component with small holes passing from the exterior environment into the fluid channels of the fluid transfer component. In this embodiment, fluid flow through the fluid channels causes a small volume of fluid to pass from within the fluid channel to the exterior such that when it evaporates from the outer surface, the device cools. In this embodiment, one or more of the films, layers, or materials comprises a high thermal conductivity so that the heat from the active area on one side of the fluid transfer component may conduct through to the cooler, opposite side cooled by evaporative cooling. In one embodiment, the evaporative cooling device comprising the fluid transfer component may be built into an article of clothing, blanket, suit (such as a fire suit), or clothing accessory (such as a hat, glove, belt, shoe, or sock, etc.) such that the wearer is cooled by the device.

Concentrating Photovoltaics

In one embodiment, the fluid transfer system comprises a fluid in a first fluid channel of a fluid transfer component that functions as an optical element to focus light such as solar radiation onto a photovoltaic element (functioning as a Concentrated PhotoVoltaic (CPV) system) or onto a second fluid channel smaller than the first fluid channel comprising a second fluid (functioning as a Concentrated Solar Power (CSP) system). In one embodiment, one or more properties of the fluid or the fluid flow in the active region of the fluid transfer component can be changed in a predetermined, automatic, and/or user controlled manner. For example, in one configuration the pressure of the fluid or the composition of the fluid is changed to change the horizontal or vertical location of the focal point of the incident light. In this example, the pressure or composition of the fluid could be changed to track the sun across the sky. The pressure change could, for example, increase or decrease the thickness of an optical element formed from a channel defined by one or more flexible materials. By oriented one or more flexible materials or structures defining or within a channel off-axis the angle of light leaving the channel can change or the focal point of light can change due to pressure. In one embodiment, the fluid transfer element is a variable light redirecting element for a concentrating photovoltaic system. In one embodiment, the change in pressure of the fluid, the change in composition of the fluid, or the change in refractive index of the fluid changes the optical properties of the fluid transfer component such that the focus of solar radiation is maintained on one or more channels or photovoltaic elements as the sun traverses the sky. In one embodiment, the fluid transfer element comprises a variable light redirecting element and a focusing element, such as a microlens array film, a lenticular array film, or a Fresnel lens array film (comprising linear or radial elements).

Thermal Transfer Heat Exchanger

In one embodiment, the fluid transfer component is a heat exchanger. Examples of fluidic device structures used as heat exchangers are disclosed in U.S. Pat. No. 6,907,921, the entire contents are incorporated by reference herein. In one embodiment, the fluid transfer component comprises a plurality of channels defined by a metal material, a conformal coating disposed upon the surfaces of the metal material, or surface relief features of a coating physically coupled to the surface of a metal material. In one embodiment, the metal material is a metal film of copper, aluminum, steel, stainless steel, aluminum alloy, lead, nickel, tin, zinc, or an alloy or combination thereof. In one embodiment, the fluid transfer component is a heat exchanger, evaporative cooler, or mass exchanger using a porous or mass permeable layer such as disclosed in WIPO patent application publication number (WO)2009020679, the entire contents are incorporated by reference herein. In one embodiment, the fluid transfer system or component is a heat exchanger or a heat exchanging system used for cooling a laptop computer, heating or cooling a vehicle seat, an airfoil skin heat exchanger, a micro-chemical reactor, and a compact heat exchanger. In one embodiment, the fluid transfer component is an in-ground heat exchanger used to cool and/or heat a fluid using the ground, such as in a geothermal heat pump instead of tubes running underground. In this embodiment, the fluid transfer component in the form of a film provides a large surface area for efficient thermal transfer.

Heat and Moisture Exchanger

In one embodiment, the thermal transfer component is an exchange film where heat and/or moisture is transmitted between two or more fluid channels. In one embodiment, one or more fluid channels are defined at least in part by a porous material with an equal pressure moisture vapor transmission rate greater than 200 grams per 100 square inches per 24 hours. In this embodiment, the thermal transfer component can function as a heat and moisture exchanger where moisture and/or heat from a first fluid flow through first fluid channels is transferred to a second flow through second fluid channels. In this embodiment, the heat can transfer through conduction through the material defining the first and/or second fluid channels and the moisture vapor may transfer through the porous material. For example, in one embodiment, the fluid transfer component is a micro-capillary film or corrugated film where a first group of first fluid channels in the film are disposed to receive a first fluid and transmit the fluid across the active region of the fluid transfer component where moisture vapor transmits from the first fluid to the second fluid through one or more surfaces defining one or more first or second fluid channels (such as a porous or PTFE film) and heat may flow, via conduction for example, from the first fluid to the second fluid or the second fluid to the first fluid through a material or layer of the fluid transfer component that may define one or more portions of the first fluid channels and/or second fluid channels. In one embodiment, an architectural panel comprises one or more fluid transfer components (that have their active regions stacked upon each other) where the active regions each or collectively are substantially transparent and/or have an ASTM D1003-00 haze less than 10%, 7%, 5%, 3%, and 2%. In one embodiment, the fluid channels have an average flow dimension less than one selected from the group of 40, 30, 20, 10, 5, 4, 3, 2, 1, and 0.5 micrometers and the haze is less than 5%.

Different configurations and materials suitable for architectural panels comprising exchange films may be used, such as those described in U.S. Pat. No. 6,178,966, the entire contents of which is incorporated by reference herein. In one embodiment, an exchange film comprises one or more fluid transfer components that each or collectively comprises one or more fluid channel geometry converters for one or more input and/or output coupler along one or more sides of each fluid transfer component or a stack of fluid transfer components. In this embodiment, one end of one fluid flow connector, such as pipe, may connect to one input coupler for a fluid channel geometry converter, to two or more input couplers for different regions (each comprising an array of fluid channels) or to two or more input couplers for different fluid transfer components (such as the input couplers from two different stacked films). In these embodiments, a stack of alternating exhaust air fluid transfer components and make-up air fluid transfer components may each have fluid channel geometry converters on two sides such that efficient heat and/or moisture exchange can occur between the fluid transfer components. Example of exchange film configurations and materials that may be used for part of a fluid transfer component are described in European Patent Application Publication EP0661502, the entire contents of which is incorporated by reference herein.

Dehumidification System

In one embodiment, the fluid transfer system is a dehumidification system wherein a first group of fluid channels (such as in a single fluid transfer component or multiple fluid transfer components) comprise air from the environment comprising moisture and a second group of fluid channels (such as in a single fluid transfer component or multiple fluid transfer components with their active regions stacked in thermal connection) positioned adjacent (in the thickness direction or in a lateral direction orthogonal the thickness direction and fluid flow direction in the active region) the first group of fluid channels. In one embodiment, one or more surfaces of the first group of fluid channels comprises surface relief features whereupon condensate from the moist air wicks along the features and is collected at an input coupler, output coupler, or is drained between the input coupler and output coupler. In another embodiment, one or more porous membranes, films or materials separate two or more arrays of fluid channels (and may optionally define one or more inner surfaces of one or more fluid channels) wherein water vapor from moist air flowing through the first group of fluid channels transmits through the porous membrane, film or material and condenses within the second group of fluid channels (and is optionally wicked along the channel or pumped or pushed out of the second group of channels).

Heated Fluid Convection Transfer System

In one embodiment, a fluid transfer system transfers a heated fluid to collected and optionally use the moving fluid to generate electricity. In one embodiment, the active region of a fluid transfer component receives heat from an internal or external component. For example, in one embodiment, the fluid transfer component comprises a black solar light absorbing material (that may comprise one or more surfaces of a fluid channel or one or more layer or substrates of a fluid transfer component) that heats due to solar radiation. This heat may transfer via conduction and/or radiation into a fluid in one or more fluid channels. In this embodiment, the fluid transfer component may be oriented at an angle to the ground such that the heated fluid convectively rises through the channels and may optionally go to a rotor and generator to generate electricity, such as with wind turbines. In one embodiment, the fluid transfer component is formed from a film and the fluid channels (and the film) rotate along an axis the further the film is from the ground. By rotating the film and channels, the fluid flow may create a columnar vortex that continues to draw the hot air to sustain the fluid flow. For example, in one embodiment, a microcapillary film or corrugated film comprises fluid channels formed in a light transmitting material such that solar radiation passes through the film and onto a light absorber (such as an anodized foil). The light absorber absorbs the heat and conducts it (and re-radiates) the heat into the fluid flowing through the fluid channels. The film may be suspended or mounted at an angle to the ground and may optionally rotate around an axis that is angled to the ground. In one embodiment, the fluid output coupler (and optionally fluid input coupler) for the fluid transfer component comprises one or more manifolds or fluid channel geometry converters. In another embodiment, one or more of the fluid channels comprises surface relief features that enable the fluid to wick toward the output coupler (as in a heat pipe, for example). In one embodiment, the fluid flows due to wicking and/or convection. In one embodiment, the fluid is air. In another embodiment, the fluid is a liquid.

Polymer Film Based Thermosipohn

In one embodiment, the fluid transfer system is a thermosiphon wherein the thermal expansion of the fluid within the fluid channels creates convective flow due to the less dense heated liquid. In this embodiment, the fluid circulates through the fluid channels based on natural convection without the necessity of a mechanical pump. In another embodiment the fluid flows through the fluid transfer system due to natural convection and capillary action.

Thermal Transfer Heat Pipe

In one embodiment, the fluid transfer system is a heat pipe. Examples of fluidic device structures used as heat pipes are disclosed in U.S. Pat. Nos. 7,334,630 and 7,331,378, the contents of which are incorporated by reference herein.

Solar Hot Water Pasteurizer

In one embodiment, the fluid transfer system is a solar hot water pasteurizer where the solar heated fluid in the active region flows to a heat exchanger where untreated water is treated or pasteurized.

Thermal Transfer Fabric, Carpet, or Mat

In one embodiment the thermal transfer component comprises one or more hollow fibers comprising fluids wherein the fibers are not covered in the application and form a mat, carpet, rug, towel-like, or cloth-like material that transfers heat to or transmits heat from an external environment. For example, in one embodiment the fluid transfer component comprising hollow fibers with a heat transfer fluid flowing through the fibers may be submersed to heat or cool a liquid or environment. In one embodiment, the surface area of the fluid transfer component is greater by a magnification factor than the length of the fluid transfer element multiplied by the width of the fluid transfer component. In one embodiment, the magnification factor is greater than one selected from the group: 1, 2, 3, 4, 6, 8, 10, 15, 20, 30, and 50. In one embodiment, the fluid transfer component is a thermal transfer component that can be used to cool or heat an object or person. For example, the thermal transfer film may be used to cool a person with a fever or to warm a patient with hypothermia. In another embodiment, the thermal transfer component may cool or heat an article of clothing such as a suit (such as cooling a fireman's suit or heating an astronaut's suit), shirt, shorts, pants, dress or accessory such as a hat, helmet, shoes, coat, gloves, mask, and scarf. In another embodiment, the fluid transfer component is a mat (such as a doormat) that heats a region of a walkway or driveway to melt ice and/or snow.

Light Source Cooling Device

In one embodiment the fluid transfer system removes heat from a light source. In one embodiment, the fluid transfer component is thermally coupled along one or more sides to a light source and removes heat from the light source. For example, in one embodiment, a fluid transfer film is thermally coupled to the front (the light emitting side) of an organic light emitting diode panel or an inorganic light emitting diode. In this embodiment, the fluid transfer film may be optically transparent and/or light transmitting and optically coupled to the organic light emitting diode panel or the inorganic light emitting diode. In another embodiment, the fluid transfer film is thermally coupled to the back surface of a light emitting diode and transfers heat from the light emitting diode to lower the junction temperature and increase the efficacy of the light emitting diode.

Semiconductor Component Cooling Device

In one embodiment the fluid transfer system removes heat from a semiconductor device. In one embodiment, the fluid transfer component is thermally coupled to a semiconductor device (such as a microchip, processor, microprocessor, semiconductor laser, charged coupled detector, or complementary metal-oxide-semiconductor) and removes heat from the semiconductor.

De-Icing or De-Fogging Element

In one embodiment, the fluid transfer system defogs or defrosts a window or light transmitting surface by transferring heat to the light transmitting surface from the fluid transfer component to warm the surface. In one embodiment, a transparent or light transmitting fluid transfer film is physically and thermally coupled to a window in a vehicle or building to heat and defrost or defog the inner or outer surface of the window. In one embodiment, the fluid transfer film positioned adjacent or within a window of a vehicle (such as a car or plane) uses the warm cooling fluid from the vehicle directly (or through a heat exchanger) to heat the window. In another embodiment, the fluid transfer component is positioned between to glass layers (such as in a glass laminate (such as safety glass) or a double-pane window). In another embodiment, one or more layers, regions, or materials defining the surface of one or more fluid channels comprises polyvinyl butyral (PVB). In another embodiment, a fluid transfer component comprises a microcapillary film or corrugated film, either or which may comprise additional layers such as substrates, wherein the outer surfaces of the film comprising fluid channels are adhered to inner surfaces of two layers of PVB, with the two layers of PVB adhering two layers of glass on their outer surfaces and encapsulating the fluid transfer component. In one embodiment, the active region of the fluid transfer component has low haze, high clarity, and good light transmission.

Heat Collection System

In one embodiment, the fluid transfer system is a heat collection system that collects heat through the active area of the fluid transfer component and transports the heat via fluid flow through the channels away from the active region to a second location. For example, the active region could be place adjacent to or form part of a refrigeration device to collect the heat from the refrigeration device and distribute it to another location such as outside the home where it can reduce the need for cooling the home in the summer. In one embodiment, the fluid in the fluid transfer component flows to an insulated pipe (such as by a fluid channel geometry converter) that flows to a radiator (such as a radiator outside of the home) to transfer the heat to a different location.

High Pressure System

In one embodiment, the fluid transfer component comprises a channel with a burst pressure greater than one selected from the group of 100, 200, 300, 400, 600, 800, 1000, 1200, 1600, and 2000 pounds per square inch. In one embodiment, the fluid transfer component comprises two polyimide film layers with a FEP nanoparticle adhesive or an adhesive polyimide film defining the fluid channels.

Vacuum Insulation Film

In one embodiment, a fluid transfer system comprises a vacuum insulation film and the fluid transfer component comprises one or more channels defined by an inorganic material (such as an aluminum foil, thin stainless steel, or thin titanium alloy), optionally comprises a getter and/or desiccant that absorbs moisture and gas, and optionally comprises an outer envelope. In another embodiment, the vacuum insulation film further comprises a support layer affixed to the thermal transfer component or within the fluid transfer component. In another embodiment, the fluid channels are drawn to a pressure below 0.5, 0.1, 0.05, 0.01, 0.005 or 0.001 torr. A vacuum insulation film may be used in vacuum insulation panel (VIP) or insulating product. In one embodiment, the fluid transfer component comprises a fluid channel geometry converter which is used to draw the fluid channels to a low pressure. In another embodiment, methods of manufacturing a vacuum insulation film or panel, or product, suitable materials, or configurations may be used for a fluid transfer system comprising a vacuum insulation film such as those describe for a vacuum insulation panel in US Patent Application Publication No. US20130216854, the entire contents are incorporated by reference herein. In another embodiment, a fluid transfer component comprises a vacuum insulation panel on one or both sides of the fluid transfer component to provide insulation in a thin format for thermal transfer. In another embodiment, an active vacuum insulation panel comprises one or more fluid transfer components wherein the fluid transfer component is connected to a flow source such as a vacuum pump that can pull a vacuum or reduce the pressure when needed. In a further embodiment, the fluid channel converter may comprise a valve which switches the fluid flow source and/or the fluid such that a different fluid may flow through one or more fluid channels. In this embodiment, for example, an active vacuum insulating film comprising a fluid transfer component could switch to a low viscosity adhesive or sealant to seal a leak or puncture in one or more channels by switching the valve. In this embodiment, each or either of the flow sources may be fluidly connected (optionally via a valve) to a fluid channel geometry converter or manifold.

Building Material Comprising Fluid Transfer Film

In one embodiment, an architectural or other building material such as a slab, plywood, sheathing, brick, masonry, shingle, framing, steel framing, foam insulation, door, tile, concrete, wallpaper, artificial stone, glass, composite panel, roof tile, concrete form, engineered wood, flashing, fiberboard, masonry, geomembrane, geopolymer cement, cement board, building insulation, cladding, housewrap, asphalt, window, decking, plank, polymer sheet, or other building material comprises a fluid transfer film (such as embedded within the building material or on one or more sides thereof) wherein the fluid transfer film transfers a fluid (such as air, liquid water, or water vapor, for example) through the fluid channels out of the material. In this embodiment, the fluid transfer film (such as a microcapillary film) could facilitate thermal transfer of heat to or from the fluid, aid in the transfer of a fluid to or from the building material, or provide or change other properties of the building material disclosed herein, such as optical properties of the building material, for example. In one embodiment, the fluid transfer film provides ventilation from the building material to an environment external to the building material. In one embodiment, the fluid transfer film transfers a fluid from the material into the fluid channels, such as a fluid transfer film that wicks (or otherwise flows) water (in liquid form or water condensed within the fluid channels) or water vapor collected from the building material through the fluid channels and out of the building material.

Optically Changing Film

In one embodiment, the optical properties of the active region of the fluid transfer component change from first optical state to a second optical state. Examples of optical state changes include, but are not limited to light reflecting state, light scattering state, light absorbing state, light transmitting state, a light emitting state, and a first angular light redirecting state. The active region may also change in the degree or level of the property of the state. In one embodiment, for example, the fluid control film is coupled to a window and changes from a first light transmitting clear state with a substantially refractive index matched liquid flowing through channels in the active region defined by surface features, to a second light scattering (or reflecting) state by pumping air through the channels such that the refractive index between the air and the polymeric material forming the surface relief features scatters the incoming light. In this embodiment, the device can be used as a changeable privacy window or film that converts from transparent to opaque. Alternatively, if the scattering of the light is very high (such as by using scattering surface relief features to define the channel with average cross-sectional feature dimensions less than 10 micrometers in width and using a polymer with a high refractive index such as a polymer with a refractive index of 1.58 or higher), the second state is highly scattering and reflective such that it appears white. Also, the fluid transfer component can be used as a switchable projection screen that can change from a transparent state to a diffusely forward scattering state for a rear projection screen (or for a front projection screen when the active region is proximate a reflecting layer) or a strongly backscattering state for a reflective projection system (which may also comprise a reflecting layer proximate the active region). Other applications for the fluid transfer component include light valves, displays, and other applications that employ Polymer Dispersed Liquid Crystals (PDLC) films or materials for active optical state control.

Optically Changing Film for Thermal Control

In one embodiment, the active region of the fluid transfer component in the fluid transfer system changes from a first optical state to a second optical state in order to facilitate heat absorption and transfer or light reflection. For example, in one embodiment, the active region of the fluid transfer component in the fluid transfer system is designed to change from a light reflecting state to a light absorbing state. The optical state of the fluid transfer element, in some embodiments, may be different from the optical properties of the fluid flowing through the channels (such as in embodiments where a light absorbing or light reflecting material is positioned behind the channels in the thickness direction in the active region). For example, in one embodiment, a fluid transfer film comprises at least one substantially transparent top film with channels defined by the transparent film and a surface relief profile on an inner surface, a fluid flow source, a first reservoir comprising a light transmitting fluid and a second reservoir comprising a light reflecting fluid (such as water comprising nano- and/or micro-sized particles of titanium dioxide and a dispersant aid). The rear surface may be light absorbing material, such as a black nickel oxide coating on a stainless steel sheet. In this example, when the active region of the fluid transfer film is placed on the roof of a building, a light transmitting fluid is pumped from the first reservoir through the active region of the fluid transfer film such that the ambient light (such as sunlight) passes through the film and is absorbed by the rear light absorbing material and the heat is radiated into the fluid. In this embodiment, the fluid transfer film may further comprise a thermal insulation layer on the light receiving side of the channels and a thermal insulation layer behind the light absorbing material (such as between the light absorbing material and the roof) to insulate the transfer fluid and retain more heat in the fluid. If the fluid is light transmitting material with a high heat capacity (such as water for example), then the fluid can be carried back to a heat exchanger to provide heating, hot water, or solar hot water heating for the building (such as during the winter, for example). When the light transmitting fluid is pumped out of the channels in the active region and a light reflecting fluid is pumped into the channels, ambient light is reflected from the film and the building absorbs less radiant heat and is cooler.

In another embodiment, a first light transmitting fluid comprises a gas, such as without limitation air, and the second fluid provides a light scattering, light absorbing, or light reflecting state and the second fluid is pumped out or pulled out of the active region and air or a vacuum is generated in the active region to change it to a light transmitting state. A fluid with a high heat capacity may also be used on the back side (opposite the light incidence side) of the light absorbing rear surface to transfer heat away from the light absorbing material on one or both sides. The fluid transfer system may have fluid transfer films, components, or regions on opposite sides of a light absorbing material. Alternatively, the light absorbing material could be the roof of the building or thermally coupled to the roof such that the roof absorbs the light or solar radiation and the building is heated. In these examples, a light reflecting fluid may be pumped into the active region of the fluid transfer film (flowing or pumped in an held for a steady state reflectance) in order to reflect ambient light or electromagnetic radiation, such as in the summertime, to keep the roof cool. In these examples, the light transmitting fluid may also absorb a first portion of the incident light and allow the light not absorbed to pass through to the light absorbing material.

In another example, the rear surface may be a light reflecting surface and the active region may transition from a light reflecting state to a light absorbing state using a light transmitting fluid (such as a transparent liquid or air) or light absorbing fluid, respectively. For example, in the winter, a light absorbing fluid may be pumped into the active region of the fluid transfer film in order to absorb the heat into the liquid, film, or system. The fluid may be substantially non-flowing or flowing into other areas of the system. For example, the fluid could flow into a heat exchanger for hot water heating or HVAC system or the fluid could flow into a geothermal heat exchange or ground source heat pump to cool the water and the roof. In this example, in the summer, a light transmitting fluid could be pumped (and possibly circulated through) the active region of the fluid film to allow the light to pass through the light transmitting fluid and reflect from a light reflecting rear surface to reduce solar radiant heating on the building and/or fluid or system.

Thus, for example, the active region of a fluid transfer film may transition from a first state to a second state; the states selected from the group of light reflecting state, light absorbing state, and light transmitting state depending on the configuration and desire to absorb (and/or optionally transfer) or reflect the light (and/or radiant heat).

In one embodiment, the active region of an optically changing fluid transfer component is positioned adjacent an interior or exterior surface, upon an interior or exterior surface, or within one or more selected from the group: roof, building, roof, wall, window, skylight, pedestrian structure, structure for vehicles, garage, and pool or fountain (including for example configurations where the transfer fluid is optionally filtered and obtained directly or indirectly from a pool or fountain or body of water). For example, in on embodiment, the active region of the fluid transfer component is positioned on the inner surface of a roof to absorb and transfer the heat collected from within the attic (from the home or from heat conduction through the roof) to a separate location (such as a ground source heat pump).

In another embodiment, the active region of the fluid transfer film is disposed within a window and the active region transitions from a light transmitting state to a light reflecting and/or light scattering state. For example, in one embodiment, the active region of the fluid transfer film disposed within a window receives a light transmitting fluid such that a first portion of the exterior sun light transmits through the window into the building to warm the interior in the winter season. In this example, in the summertime, a light reflecting fluid (such as water comprising hollow microspheres) is pumped into the active region and reflects a first portion of the sunlight to reduce solar thermal loading on the interior. In one embodiment, the active region of the fluid transfer element transitions to a state that reflects infrared light and substantially transmits visible light to allow the window to be used for visible light transmission and reduced solar loading through the window in the summertime. In another embodiment, the active region of the light transmitting film is configured to transition to a light scattering state to reduce glare in the interior of an office building. For example, in one embodiment a remote sensor detects direct solar radiation, the intensity is compared against a programmed or predetermined light level, information is sent (via a wireless or wired connection) from the sensor to the receiver and a pump and or valve is configured to flow a light scattering fluid into the active region of the fluid transfer film to reduce glare from the bright sunlight.

Optically Changing Shingles

In one embodiment, a fluid transfer system comprises one or more shingles comprising one or more fluid transfer components that change from a first optical state to a second optical state in the active regions. In another embodiment, a fluid transfer system comprises one or more shingles comprising one or more fluid transfer components that transfer heat away from the shingles by fluid flow through channels in the active regions of the fluid transfer components. As discussed above in the context a fluid transfer component for solar applications, the shingle may transition via fluid flow from a light absorbing state to a light reflecting state and the shingle may have a light absorbing material or layer or a light reflecting material or layer beneath the channels in the active region (on the side of the channels opposite the light receiving side). Similarly, the fluid transfer component with the shingles may function as an element in a CPV, CSP, or photovoltaic cell cooling system. In one embodiment, the shingle physically couple or interlock and fluidly couple with each other in one, two, three, or four directions. In one embodiment, the shingle comprises at least one fluid channel geometry converter input or output coupler positioned behind and along the bottom edge of the shingle when installed on a slanted roof. In this example, the fluid transfer component may comprise the fluid input and output couplers (such as fluid channel geometry converters) along the same lower edge of the shingle.

Colored Optical Effects of Continuous Flowing Liquid

In one embodiment, the optical properties of the fluid transfer component change to provide a decorative visual transition across the active region over time. In another embodiment, the active region of the fluid transfer component transitions from a first optical state to a second optical state or first level or degree of a first optical state to a second level or degree of a first optical state or second optical state and the active region of the fluid transfer component is positioned adjacent a roof or wall of a building roof, the inner wall of a building, the outer wall or surface of a building, ceiling of a building, or the floor of a building, or within upon, or behind a structure, building, vehicle or other device or component disclosed herein. In one embodiment, for example, the active region transitions from a non-scattering red filter to a non-scattering blue filter. In one embodiment, the fluid transfer component is formed along the surface contour of a vehicle or craft and by flowing different fluids through the fluid channels, the color or other optical property (state) of the vehicle or craft may be changed.

Camouflage Film or Material

In one embodiment, the fluid transfer system provides camouflage for a person or object. In one embodiment, the fluid transfer system comprises a sensor operatively configured to detect the relative intensity in one or more wavelength bands of an object or area and change the color of the light reflecting from the light transmitting region to substantially match the apparent color of the object or area. In one embodiment, the light transmitting region is positioned above a white light reflecting region such that when the color of the fluid in the active region changes, the reflected color of the active region of the fluid transfer component changes. For example, in one embodiment, a camouflage uniform comprises a color calibrated camera that detects the color of the ambient surroundings and changes the color in one or more spatial regions of the uniform to match the corresponding environment. In another embodiment, the fluid transfer system provides camouflage capabilities to a sheet, fabric, blanked, cover, tent, building, netting, article of clothing, accessory, land craft, air craft, water craft, panel, thermoformable panel, structure or component of a building, electronic device housing (such as a phone, computer, laptop, telecommunication equipment), and radar. In one embodiment, the camouflage fluid transfer system comprises a fluid transfer component physically and operatively coupled within or adjacent a panel that can be attached to a land craft, water craft, or air craft.

Color or Optical Property Changing Clothing or Article

In one embodiment, the fluid transfer system comprises a fluid transfer component in the form or operatively coupled to an article of clothing or a fabric wherein the active region of the fluid transfer component changes its color or optical state.

In one embodiment, for example, a shirt may change from white to black. In another embodiment, a chemiluminescent fluid is pumped into the active region to provide a light emitting fabric to be used on an article of safety clothing. In another embodiment, a transfer fluid system incorporated into a clothing, article, device or structure comprises an ultraviolet or blue light emitting diode or light source and the transfer fluid comprises a plurality of phosphorescent particles wherein the fluid passes by the light source, the phosphors enter an excited state, and light is emitting from the active region when the particles flow through the active region. In one embodiment, an article of clothing, a light fixture, display, or sign comprises a fluid transfer system wherein light is emitted from channels in the active region of a fluid transfer component comprising a fluid with phosphors excited from a light source in the system remote from the active region.

Privacy Film

In one embodiment, the fluid transfer system provides privacy by switching from a first optical state to a second optical state or a first degree or level of a first optical state to second degree or level of the first optical state or a second optical state. For example, in one embodiment, a fluid transfer film comprising surface features on the inner surface of the fluid channels is laminated to glass to switch from a transparent glass panel to a diffusely scattering glass panel by pumping a non-scattering transparent fluid through the active region of the fluid transfer film to effectively index-match out the surface relief features.

Optical Switch

In one embodiment, the fluid transfer system functions as an optical switch by switching from a first optical state to a second optical state or a first degree or level of a first optical state to second degree or level of the first optical state or a second optical state. Examples of optical switch configurations incorporating fluids include those discussed in U.S. Pat. No. 7,027,683, the entire contents are incorporated by reference herein.

Color Changing Sign or Display

In one embodiment, the fluid transfer system comprises an active region of a fluid transfer component that functions as a color changing sign or display. In one embodiment the active region of the sign varies spatially and is in the form of letters, characters, or indicia. In another embodiment, the active region of the display varies spatially and is in the form of pixels or sub-pixels. In one embodiment, the sign or display comprises segmented characters or pixels wherein each segment or pixel can be individually controlled by one or more flow sources or one flow source and multiple valves or switches to direct fluid flow into each active region corresponding to a segment or pixel. In a further embodiment, a display comprises a fluid transfer component disposed to receive light from a light emitting panel (such as a light emitting diode based backlight or an organic light emitting diode panel) and change the optical path, wavelength transmission, polarization state, or intensity of the light transmitted through the active region or a sub-region of the active region (such as a pixel or segment).

Color Changing Light Source

In one embodiment, a light source comprises a fluid transfer component disposed to receive light from a point light source (such as an LED), an array of light sources, or an extended light source or light emitting panel (such as a light emitting diode based backlight or an organic light emitting diode panel) and change the optical path, wavelength transmission, polarization state, or intensity of the light transmitted through the active region or a sub-region of the active region to provide a light source with varying light output properties.

Smart Window

In one embodiment, a smart window comprises a fluid transfer system comprising a fluid transfer component wherein the active region of the fluid transfer component transitions from a first optical state to a second optical state. In this embodiment, the smart window can change to or from one or more optical states such as light absorbing, light reflecting, infrared light reflecting, infrared light absorbing, light transmitting, forward light scattering, reflectively light scattering, or a combination thereof. In another embodiment, the optical state of the smart window changes based on user input, automatically based on sensors, on a programmed schedule, or in response to the environment. In one embodiment, the smart window comprises the active region of the fluid transfer component on the interior surface of the window, on the exterior surface of the window or between two panes of the window (such as in a double-glazed window or a window with an interior film laminate (such as safety glass or a glass laminate comprising a film and polyvinyl butyral). In another embodiment, the fluid transfer system comprises an active region of a fluid transfer component that changes from a high refracting state to a low refracting state. For example, in one embodiment a fluid transfer system comprises an active region with one or more fluid channels with inner facing angled and/or arcuate surface relief structures in cross-section that refract (and/or diffract and/or totally internally reflect in systems and configurations with inner facing surface relief structures that can totally internal reflect light from a particular range of angles and refractive index differences) incident light (such as light from the sun) from a range of incident angles to a first angle output range different from the first input range. In this embodiment, the active region of the fluid transfer component could be positioned adjacent, within, or upon the surface of a window such that when the sun is at a high angle, the light may be redirected toward the ceiling of a room to provide better illumination and a fluid with a small refractive index difference with the relief features could be pump into or pulled into the active region such that the window transitioned to a substantially clear, transparent state after sunset, for example. In another embodiment, gradients, blends, or transitions of one or more liquids or fluids may be used to control the amount of refraction (or diffraction, or reflection) to provide states of refraction (or diffraction or reflection) between a high refracting state (or high diffraction state or totally internal reflecting state) and low refracting state (or low totally internally reflection state or low diffraction state).

Variable Focus Device

In one embodiment, the fluid transfer component comprises one or more flexible membrane regions in contact with the fluid in the active region that expand when the pressure on the fluid is increased and the membrane and the fluid are transparent to a first wavelength band of radiation such that the flexed membrane has focusing lens properties (such as the membrane forming a convex lens) and focuses incident light in a focal region within or proximate the active region of the fluid transfer element. In one embodiment, the channels adjacent circular (or rectangular openings) could use a flexible variable focusing film or membrane to positioned above imager or detector or in front of microdisplay, thus increasing the pressure could focus light onto imager or cell. In this embodiment, a very small array of variable focus lenses may be created where the focus of each lens changes simultaneously since they are in fluid communication with each other. In another embodiment, the shape of one or more fluid channels may change by changing the fluid pressure in one or more channels. By changing the shape of one or more fluid channels, the cross-sectional shape of the fluid channel can change and thus the focal length and/or light reflecting or light directing properties of the fluid transfer component may change. For example, in one embodiment, increasing the pressure of the fluid transfer component may be used to create an optical film or sheet with an electrically controllable (such as by controlling a pump) focal distance, angle of light refraction, or light directing properties. Similarly, by increasing the pressure of the fluid in the fluid transfer component the optical properties of the active region may change to refract the light into different angles such that the optical film could optically track the sun, for example, as it moves across the sky. In these active optical properties changing applications, one or more of the sides or surfaces of the fluid transfer component may be adhered or fixed in place by a rigid material or fasteners to a rigid material to help control the change in the shape of the fluid channel to a desired shape.

In one embodiment, the refractive index of the fluid in a fluid channel is adjusted to achieve a change in the optical properties of the fluid transfer film. In one embodiment, a fluid transfer system comprises a fluid transfer film and a plurality of reservoirs comprising fluids with different refractive indexes. In this embodiment, the system may comprise a pump and/or valve wherein the fluid flowing through one or more fluid channels in the fluid transfer film is changed such that the optical properties are changed. For example, by flowing a second fluid with a second refractive index higher than the first refractive index of a first fluid after flowing the first fluid, the focal length of a lens created by the cross-sectional profile of the fluid channel is reduced, such as the case where the fluid channel has a cross-sectional shape of a bi-convex lens. Similarly, when a fluid flows through a fluid channel with a triangular cross-sectional shape and a second fluid with a second refractive index different than the refractive index of the first fluid is directed to flow through the fluid channel, the angle of the light redirection increases or decreases, or the light may totally internally reflect.

In one embodiment, an optical switch device, a varying focal device, or a device with varying optical properties includes one or more fluid transfer components, such as devices, configurations, and their methods of manufacture disclosed in U.S. Pat. Nos. 7,027,683, 6,721,104, 7,755,840 and U.S. patent application publication no. 20040169932, the entire contents of each are incorporated by reference herein.

Variable Light Redirecting Element

In one embodiment, the cross-sectional shape of one or more channels is asymmetric about a central axis parallel to the thickness direction (such as the thickness of the film in a film-based fluid transfer component). In another embodiment, the asymmetric channel surface features asymmetrically directs a portion of incident light from a first incident angle to a second angle different from the first angle when one or more channels comprises a first fluid with a first refractive index; and the asymmetric channel surface features asymmetrically direct a portion of incident light from a first incident angle to a third angle different from the first angle and second angle when one or more channels comprises a second fluid with a second refractive index different from the first refractive index. In one embodiment, the light redirection is due to refraction, total internal reflection, or a combination of refraction and total internal reflection. For example, in one embodiment, the cross sectional shape of a plurality of channels in the active region is scalene triangle (or two adjacent sides of a scalene triangle) and all of the interior angles are less than 90 degrees. In this embodiment, when the fluid in the channel is changed, the angle of refraction of incident light can change. Alternatively, if the angle of incident light changes, then angle of light output from the active region can remain constant over a range of incident light angles. In one embodiment, the angle of incidence, the angle of refraction, reflection, or a combination thereof for a variable light redirecting element in a first optical state with a first transfer fluid of a first refractive index can be the first angle or the first angular range as disclosed above in the context of a light reflecting state; and the angle of incidence, the angle of refraction, reflection, or a combination thereof for a variable light redirecting element in a second optical state with a second transfer fluid of a second refractive may be a second angle or second angular range chosen from the first angles or first angular ranges disclosed in the light reflecting state section above where the second angle or second angular range due to the refractive index of the second fluid is different from the first angle or first angular range due to refractive index of the first fluid.

Wavelength Band Reflective or Absorptive Filter

In one embodiment, the fluid transfer component is a wavelength bandwidth reflective or absorptive filter. The filter may be positioned to receive light from one or more light sources and selectively transmit or reflect a portion of the incident light in the reflecting or transmitting wavelength band. In one embodiment, the reflecting wavelength or reflecting wavelength band the same as the first wavelength or the first wavelength band disclosed above in the context of the light reflecting state. Similarly, the light absorbing wavelength or light absorbing wavelength band may be the same as the first wavelength or the first wavelength band disclosed above in the context of the light reflecting state. For example, in one embodiment, a fluid transfer film changes from a first light transmitting state that transmits all visible wavelengths of light substantially uniformly due to a clear, transparent fluid in the channels in the first state and in the second state, a fluid absorbing more light in the blue wavelengths that then red wavelengths flows into the channels and the fluid transfer component filters out (absorbs) more blue light than red light. The filter in this embodiment, for example, could be placed in front of a light source such as a lamp or bulb and the fluid change could effectively change the light from having a cool white color temperature to light having a warm white color temperature in a discrete change or by gradually mixing the fluids flowing through the channel in a gradual change.

FIG. 1 is a top view of an embodiment of a fluid transfer system 100 comprising a flow source 101 operatively coupled by a fluid connector 102 to a fluid transfer component 103 comprising a fluid input coupler 104 and a fluid output coupler 105. The fluid transfer component 103 receives fluid 107 flowing 108 from the flow source 101 through the input coupler 104 and the fluid 107 flows through fluid channels (not shown) in the active region 106 of the fluid transfer component 103 and the fluid 107 flows into the fluid output coupler 105 that couples the fluid 107 into the fluid connector 102 where the fluid 107 flows 108 back to the flow source 101.

Figure 2:
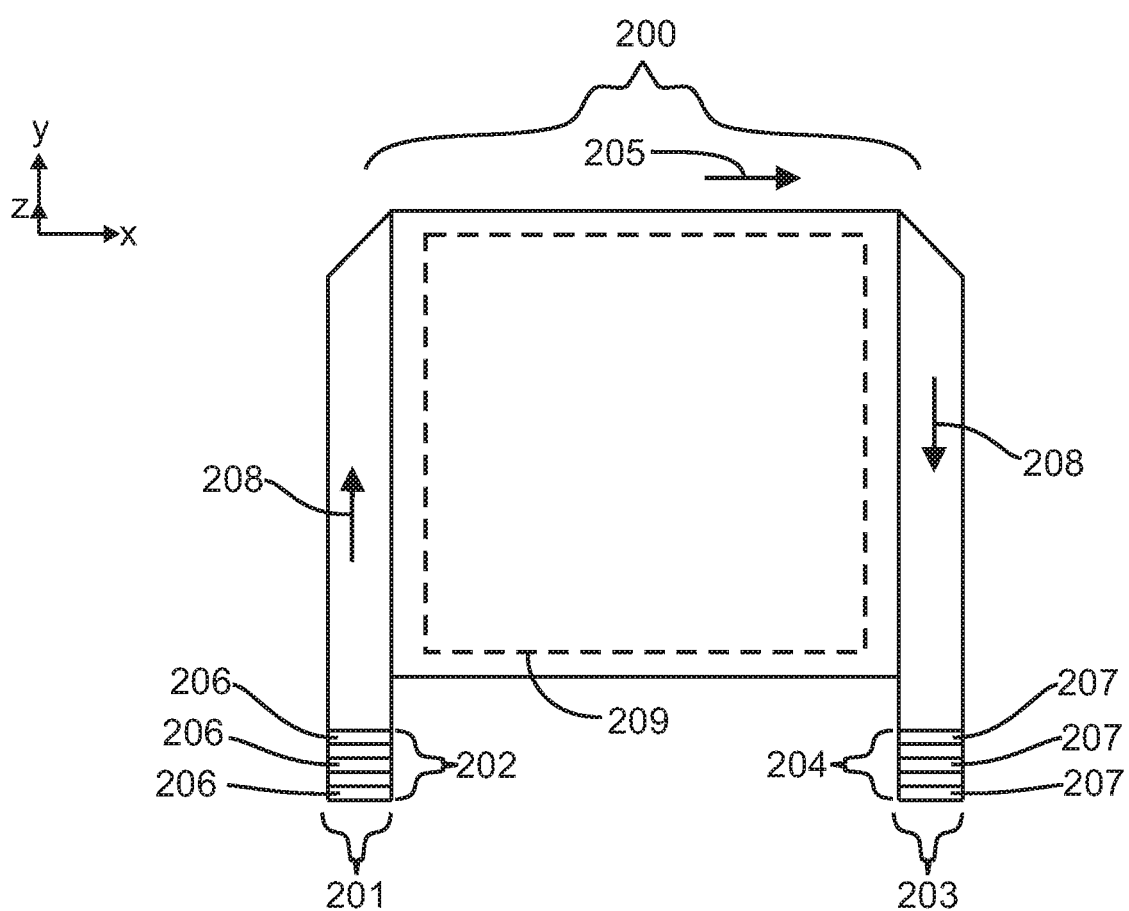
FIG. 2 is a perspective view of an embodiment of a fluid transfer film comprising a fluid channel geometry converter input coupler with an input end region defined by the ends of the folded and stacked input segments of the fluid transfer film.

FIG. 2 is a perspective view of an embodiment of a fluid transfer film 200 comprising a fluid channel geometry converter input coupler 201 with an input end region 202 defined by the ends of the folded and stacked input segments 206 of the fluid transfer film 200. The fluid transfer film 200 further comprises a fluid channel geometry converter output coupler 203 with an output end region 204 defined by the ends of the folded and stacked output segments 207 extended from the fluid transfer film 200. In this embodiment, the fluid transfer film 200 receives a fluid 208 in channels (not shown) at the input end region 202, the fluid 208 flows through the channels in the input segments 206, flows in a flow direction 205 through the channels in the active region 209, flows through the channels in the stacked output segments 207 and out of the channels at the output end region 204.

FIG. 3 is a perspective view of a portion of an embodiment of a fluid transfer component 300 comprising a fluid channel geometry converter input coupler 303 formed by folding and stacking strips 302 extended from the fluid transfer component 300. In this embodiment, the fluid transfer component 300 is a film comprising channels 301 defined by a surface relief profile 304 and a cover layer 306 positioned above the surface relief profile 304. In this embodiment, the input end region 305 is defined by the ends of the strips 302, and fluid (not shown) coupled into the fluid transfer component 300 flows through the channels 301 in the strips 302 to the active region 307 of the fluid transfer component 300.

FIG. 4 is a side view of an input end region of an embodiment of a fluid channel geometry converter input coupler 400 comprising a stacked layer of ends of segments 408 extending from a film comprising a cover layer 401 adhered using an adhesive layer 402 to a surface relief profile 404. In this embodiment, the bottom of the adhesive layer 402 and the surface relief profile 404 define fluid channels 403. In this embodiment, a sealant 405 defines the blocked channels 407. The sealant 405 prevents fluid from entering channels that may be open due to the separation process used to separate the segments 408 before stacking them.

Figure 5:
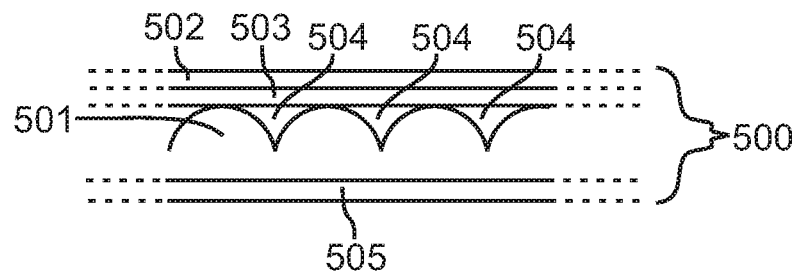
FIG. 5 is a cross-sectional side view of a portion of an embodiment of a fluid transfer film comprising a lenticular lens array film.

FIG. 5 is a cross-sectional side view of a portion of an embodiment of a fluid transfer film 500 comprising a lenticular lens array film 501 with a substrate 505 adhered to a cover layer 502 using an adhesive 503. In this embodiment, the channels 504 are defined by the lenticular lens array film 501 and the adhesive 503.

Figure 6:
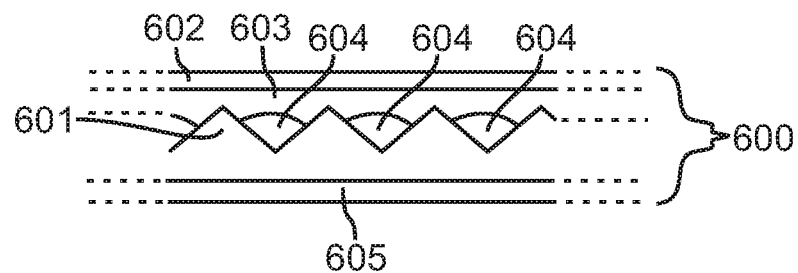
FIG. 6 is a cross-sectional side view of a portion of an embodiment of a fluid transfer film comprising a linear prismatic lens array film.

FIG. 6 is a cross-sectional side view of a portion of an embodiment of a fluid transfer film 600 comprising a linear prismatic lens array film 601 with a substrate 605 adhered to a cover layer 602 using an adhesive 603. In this embodiment, the channels 604 are defined by the linear prismatic lens array film 601 and the adhesive 603. In this embodiment, the lamination pressure used to adhere the cover layer 602 to the linear prismatic lens array film 601 caused the adhesive 603 to spread into the gap between the peaks of the linear prismatic lens array film 601.

Figure 7:
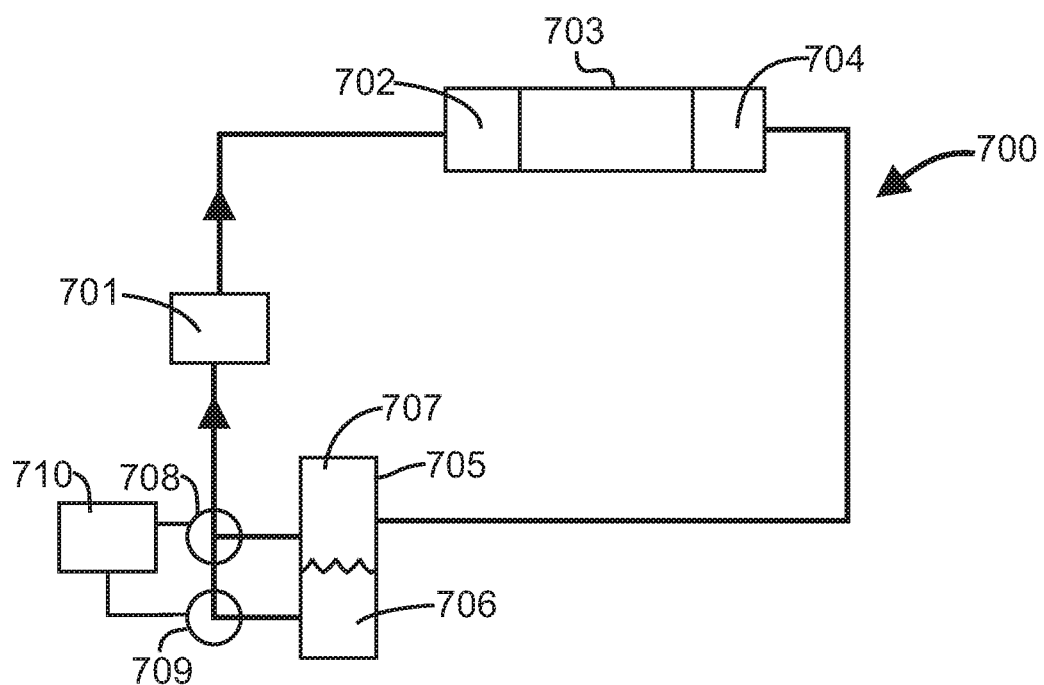
FIG. 7 is a schematic diagram of an embodiment of a fluid transfer system comprising a fluid transfer component, a flow source, and a controller.

FIG. 7 is a schematic diagram of an embodiment of a fluid transfer system 700 comprising a fluid transfer component 703, a flow source 701, a controller 710, a reservoir 705, and valves 708, 709. In this embodiment, the flow source 701 transfers a first fluid 706 or a second fluid 707 through the fluid input coupler 702 of the fluid transfer component 703, through the fluid channels (not shown) in the active region of the fluid transfer component 703, through the fluid output coupler 704, and out of the fluid transfer component 703. A controller 710 (such as a microprocessor) controls a first valve 708 and second valve 709 (such as in response to a temperature sensor or other sensor) to control the flow of the first fluid 706 and the second fluid 707 through the fluid transfer component 703. When the first valve 708 is open and the second valve 709 is closed, the flow source 701 (such as a pump) transfers the second fluid 707 (such as a low density fluid such as air) through the fluid transfer component 703 and back into the reservoir 705. When the first valve 708 is closed and the second valve 709 is open, the flow source 701 transfers the first fluid 706 (such as water or other liquid) through the fluid transfer component 703 and back into the reservoir 705. In this embodiment, since the fluids have different densities, they will separate by gravity. In this embodiment, the optical state of the fluid transfer component 703 may change when the fluid flowing through the channels changes from the first fluid 706 to the second fluid 707.

Figure 8:
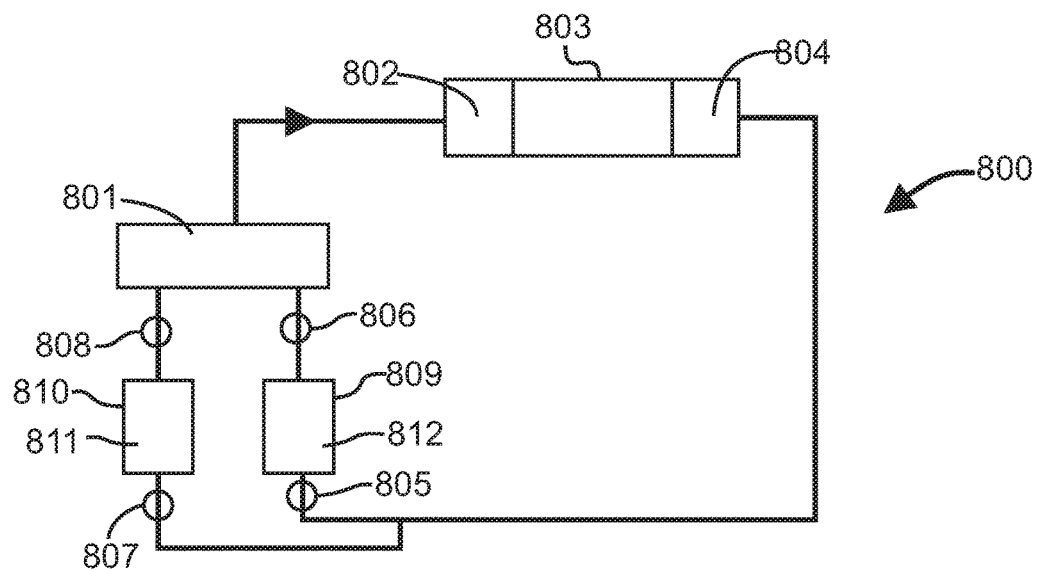
FIG. 8 is a schematic diagram of an embodiment of a fluid transfer system comprising a fluid transfer component, a flow source, and two reservoirs.

FIG. 8 is a schematic diagram of an embodiment of a fluid transfer system 800 comprising a fluid transfer component 803, a flow source 801, a first reservoir 810 comprising a first fluid 811, and a second reservoir 809 comprising a second fluid 812. In this embodiment, the flow source 801 transfers a first fluid 811 or a second fluid 812 and optionally a third fluid (not shown) such as air through the input coupler 802 of the fluid transfer component 803, through the fluid channels (not shown) in the active region of the fluid transfer component 803, through the fluid output coupler 804, and out of the fluid transfer component 803. When the second return valve 805 and the second flow valve 806 are closed, and the first return valve 807 and the first flow valve 808 are open, the flow source 801 (such as a pump) transfers the first fluid 811 through the fluid transfer component 803 and back into the first reservoir 810. When the second return valve 805 and the second flow valve 806 are open, and the first return valve 807 and the first flow valve 808 are closed, the flow source 801 transfers the second fluid 812 through the fluid transfer component 803 and back into the first reservoir 810. In this embodiment, one or more of the valves 805, 806, 807, and 808 may be controlled by a controller and a third fluid such as air may be used to purge the lines before or opening or closing one or more valves or before transitioning between the first fluid 811 and the second fluid 812. In this embodiment, the optical state of the fluid transfer component 803 may change when the fluid flowing through the channels changes from the first fluid 811 to the second fluid 812.

Figures 9, 10:
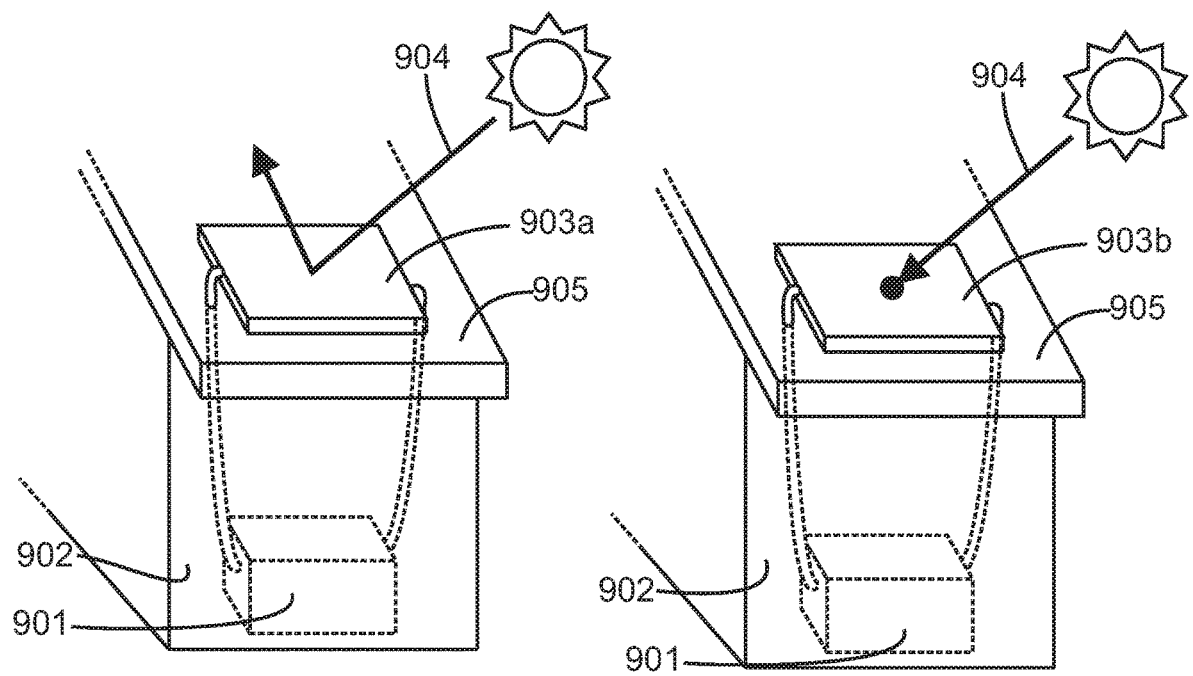
FIGS. 9 and 10 are perspective views of portions of an embodiment of a fluid transfer system comprising a fluid transfer component and in two different optical states.

FIGS. 9 and 10 are perspective views of portions of an embodiment of a fluid transfer system comprising a fluid transfer component 903*a* and 903*b* in two different optical states. In this embodiment, the fluid transfer system comprises a fluid transfer component 903*a* and 903*b* operatively connected to a flow source 901 to supply and receive a fluid from a fluid transfer component 903*a* and 903*b* mounted on the roof 905 of a house 902. On hot days, the fluid transfer component 903*a* is in a light reflecting optical state such that it reflects solar radiation 904 as shown in FIG. 9 to help keep the house cool. On cold days, the fluid transfer component 903*b* is in a light absorbing state such that it absorbs solar radiation 904 as shown in FIG. 10. In this light absorbing state, the fluid transfer component 903*b* may comprise a light absorbing fluid that is transferred by the flow source 901 to a heat exchanger where it may be used to warm air for a furnace. In the light reflecting state, for example, the fluid transfer component 903*a* may comprise a light reflecting film behind the fluid channels in the active area and air, a gas, a transparent liquid, a translucent liquid, or a light reflecting liquid may be transferred to the channels in the active region by the flow source 901.

Figure 11:
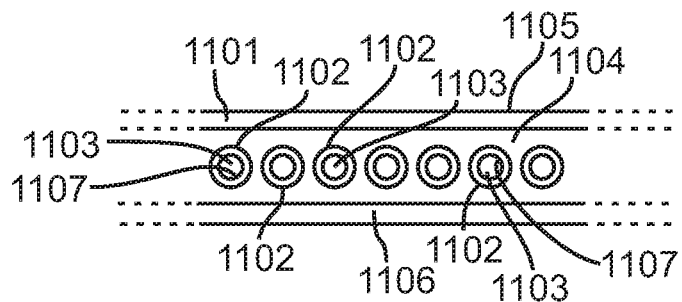
FIG. 11 is a cross-sectional side view of a portion of an embodiment of a fluid transfer component comprising an arrangement of hollow fibers.

FIG. 11 is a cross-sectional side view of a portion of an embodiment of a fluid transfer component 1105 comprising an arrangement of hollow fibers 1102 positioned between and adhered to a top substrate 1101 and a bottom substrate 1106 using an adhesive 1104. In this embodiment, the inner surface 1107 of the hollow fibers 1102 define the channels through which the transfer fluid 1103 flows in the fluid transfer component 1105.

Figure 12:
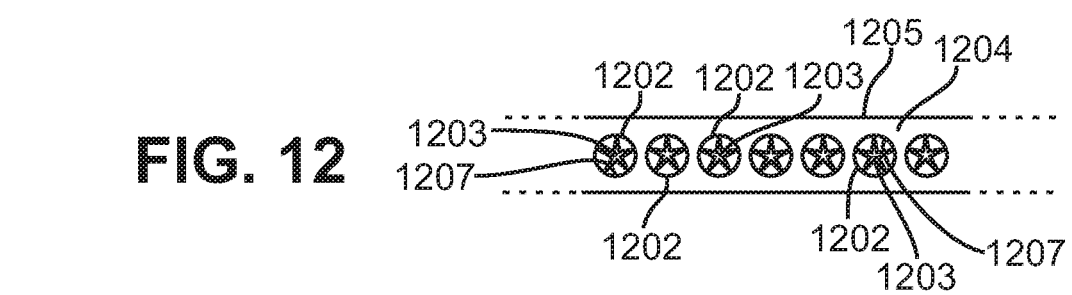
FIG. 12 is a cross-sectional side view of a portion of an embodiment of a fluid transfer component comprising an arrangement of solid, shaped fibers.

FIG. 12 is a cross-sectional side view of a portion of an embodiment of a fluid transfer component 1205 comprising an arrangement of solid, shaped fibers 1203 (star shaped in this example) embedded in a polymer 1204. In this embodiment, during the manufacturing of the fluid transfer component 1205, the structure of the of the solid, shaped fibers 1203 and/or the surface wettability of the polymer 1204 with the solid, shaped fibers 1203 prevents the polymer 1204 from wetting out with the solid, shaped fibers 1203, creating an air pocket that defines a surface 1207 of the polymer 1204 along the length of the solid, shaped fibers 1203 that defines the channels 1202 in the fluid transfer component 1205. In this embodiment, a fluid may flow through the channels 1202 in the fluid transfer component 1205.

Figure 13:
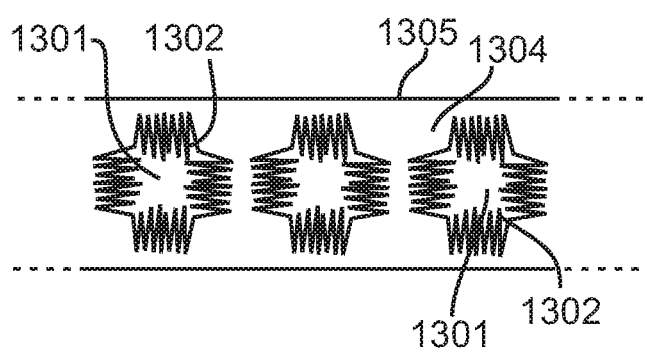
FIG. 13 is a cross-sectional side view of a portion of an embodiment of a fluid transfer component comprising a plurality of high aspect ratio surface relief features.

FIG. 13 is a cross-sectional side view of a portion of an embodiment of a fluid transfer component 1305 wherein a plurality surface relief features 1302 with a high aspect ratio of a material 1304 surround and define a plurality of fluid channels 1301. In this embodiment, for example, the size and shape of the surface relief features 1302 along with wettability of the material 1304 with the fluid can enable a very low contact surface for the fluid and reduce the flow resistance through the fluid channels 1301.

Figure 14:
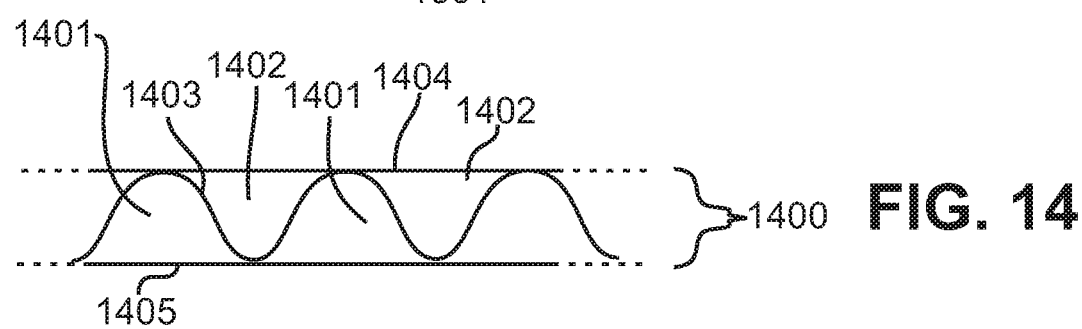
FIG. 14 is a cross-sectional side view of a portion of an embodiment of a fluid transfer film that is fluted.

FIG. 14 is a cross-sectional side view of a portion of an embodiment of a fluid transfer film 1400 that is fluted comprising first fluid channels 1401 and second fluid channels 1402 defined by a corrugated film 1403 and a top film 1404 and a bottom film 1405. In this embodiment, the volume of region between the top film 1404 and bottom film 1405 can be maximized for large cross-sectional areas within the fluid channels 1401 and 1402.

Figure 15:
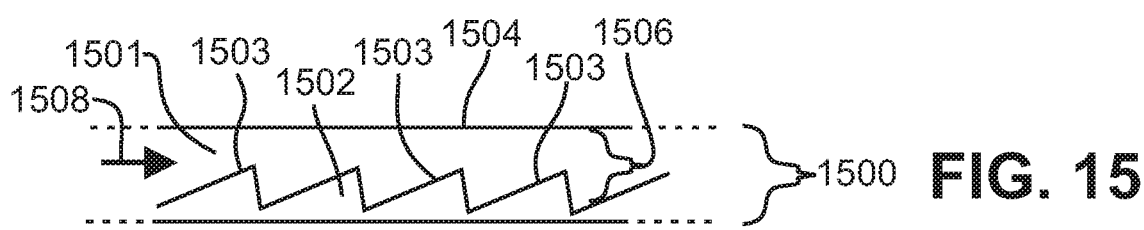
FIG. 15 is a cross-sectional side view with the cross section parallel to the flow direction of a portion of an embodiment of a channel in a fluid transfer component.

FIG. 15 is a cross-sectional side view with the cross section parallel to the flow direction of a portion of an embodiment of a channel 1506 in a fluid transfer component 1500. In this embodiment, the channel 1506 is defined by surface relief features 1503 asymmetrically shaped in the flow direction 1508 and a top surface 1504. The surface relief features 1503 are formed in the surface of a first material 1502 and have a cross sectional shape of two adjacent sides of a scalene triangle. In this embodiment, the asymmetrically shaped surface relief features 1503 can propel the fluid by the Leidenfrost effect.

Figure 16:
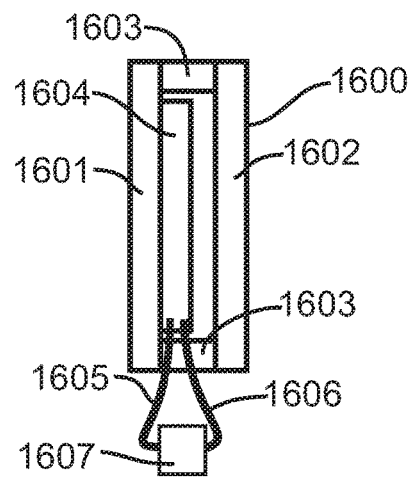
FIG. 16 is a cross-sectional side view of an embodiment of window comprising a fluid transfer component.

FIG. 16 is a cross-sectional side view of an embodiment of window 1600 comprising a fluid transfer component 1604 positioned between a first pane of glass 1601 and a second pane of glass 1602 sealed by a sealant 1603. In this embodiment, a flow source 1607 transfers a liquid through a supply conveyor 1605 (such as a pipe) to the fluid transfer component 1604 and returns the fluid through a return conveyor 1606. In this embodiment, the fluid transfer component 1604 may change from a first optical state to a second optical state when the flow source 1607 directs a second fluid to the channels (not shown) in the fluid transfer component to replace the fluid residing in the channels.

Figure 17:
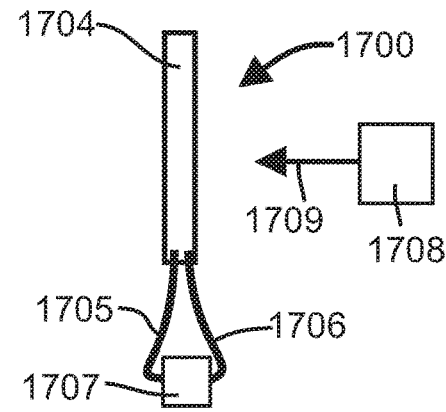
FIG. 17 is a cross-sectional side view of an embodiment of an optical filter comprising a fluid transfer component.

FIG. 17 is a cross-sectional side view of an embodiment of an optical filter 1700 comprising a fluid transfer component 1704. In this embodiment, a flow source 1707 transfers a liquid through a supply conveyor 1705 (such as a pipe) to the fluid transfer component 1704 and returns the fluid through a return conveyor 1706. In this embodiment, the fluid transfer component 1704 may change from a first optical state to a second optical state when the flow source 1707 directs a second fluid to the channels (not shown) in the fluid transfer component to replace the fluid residing in the channels. Light 1709 from a light source 1708 may be dynamically filtered by the fluid transfer component 1704 when it changes from a first optical state to a second optical state.

Figure 18A:
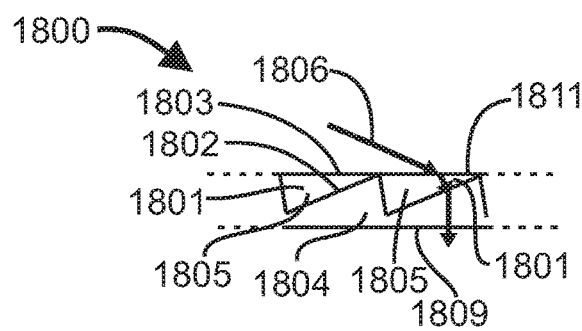
FIGS. 18a and 18b are cross sectional side views of portions of an embodiment of a variable light redirecting element.
Figure 18B:
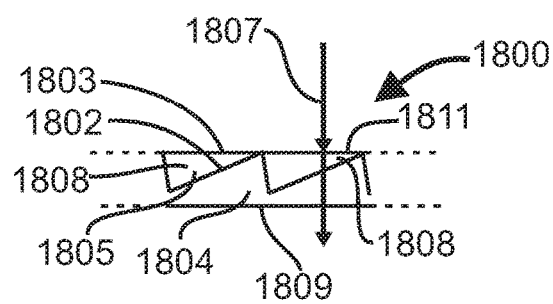

FIGS. 18a and 18b are cross sectional side views of portions of an embodiment of a variable light redirecting element 1800 comprising a fluid transfer component 1811 in two optical states. The fluid transfer component 1811 comprises channels 1805 defined between asymmetric surface relief features 1802 of a first material 1804 of a first refractive index and a second surface 1803. In FIG. 18a, the channel 1805 comprises a first liquid 1801 with a second refractive index larger than the first refractive index and the fluid transfer component is in a first optical state. As shown in FIG. 18a, the angled interface between the first liquid 1801 and the first material 1804 refracts incident light 1806 from a large angle to a direction normal to the bottom surface 1809 of the fluid transfer component 1811 in a first optical state. As shown in FIG. 18b, when a second liquid 1808 with a third refractive index the same as the first refractive index fills the channels 1805, the angled interface between the second liquid 1808 and the first material 1804 does not refract incident light 1807 incident on the fluid transfer component 1811 from a direction normal to the bottom surface 1809 of the fluid transfer component 1811 and the fluid transfer component is in a second optical state. In this embodiment, the incident light 1807 exits the fluid transfer component 1811 at the same angle as in FIG. 18a when the incident light 1806 is incident at a large angle. Thus, by changing the refractive index of the fluid (such as by changing the fluid or the fluid mixture) light incident from a range of angles can be redirected to the same angle. This can be useful, for example, when the variable light redirecting element is positioned above a photovoltaic cell or a concentrated photovoltaic system (which may comprise a Fresnel or TIR optic) where the variable light redirecting element can track the sun across the sky. Similarly, light from a constant direction can be changed to a range of angles by varying the refractive index of the fluid in the channels.

Figure 19:
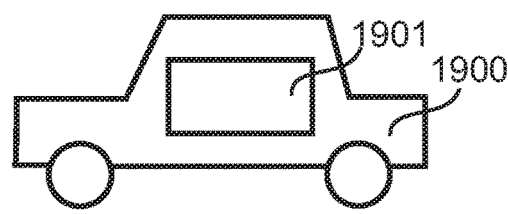
FIG. 19 is a side view of an embodiment of a vehicle comprising a fluid transfer component.

FIG. 19 is a side view of an embodiment of a vehicle 1900 comprising a fluid transfer component 1901. In this embodiment, the fluid transfer component may change from a first optical state to a second optical state to function as dynamic camouflage.

Figure 20:
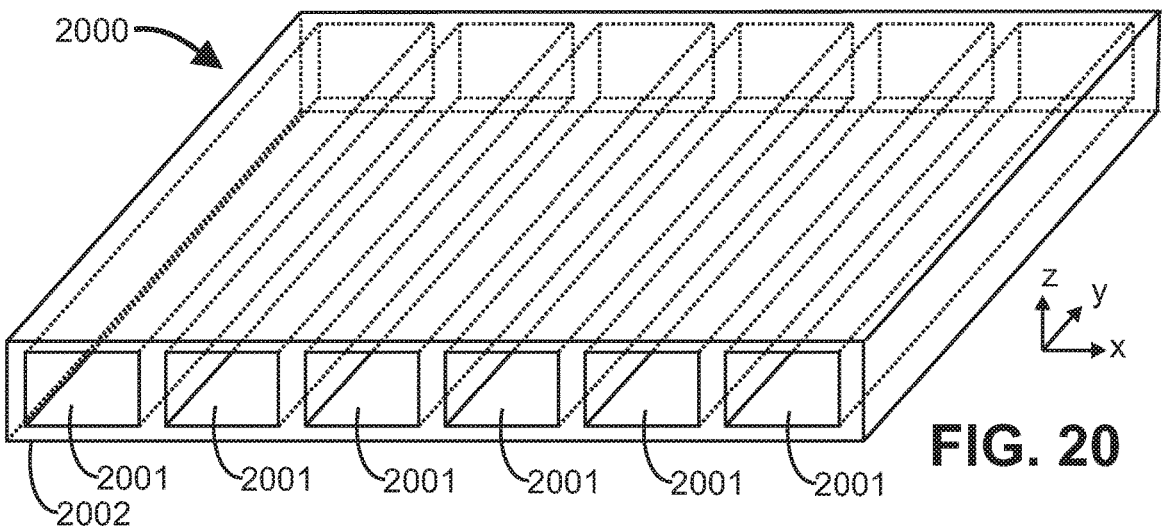
FIG. 20 is a perspective view of a fluid transfer component formed from a microcapillary film comprising a plurality of fluid channels along the flow direction.

FIG. 20 is a perspective view of a fluid transfer component 2000 formed from a microcapillary film 2002 comprising a plurality of fluid channels 2001 along the flow direction (y direction in FIG. 20).

Figure 21:
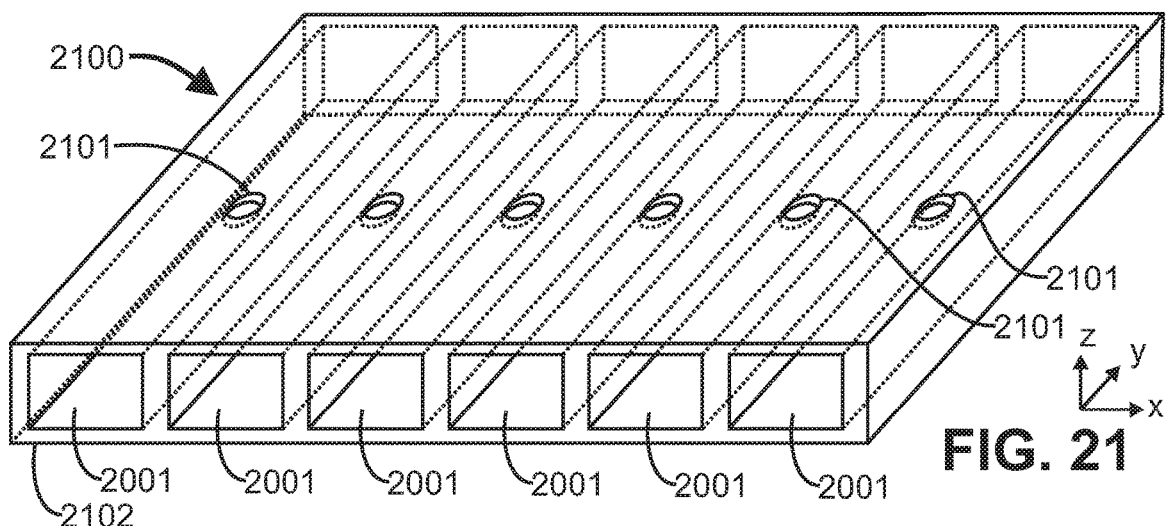
FIG. 21 is a perspective view of a fluid transfer component formed from a microcapillary film comprising a plurality of fluid channels along the flow direction and channel openings.

FIG. 21 is a perspective view of a fluid transfer component 2100 formed from a microcapillary film 2102 comprising a plurality of fluid channels 2001 along the flow direction (y direction in FIG. 20). The microcapillary film 2102 further comprises channel openings 2101, positioned along a line parallel to the direction orthogonal to the flow direction (y direction) and orthogonal to the thickness direction (z direction), extending to the environment surrounding the fluid transfer component 2100 in the thickness direction (z direction).

Figure 22:
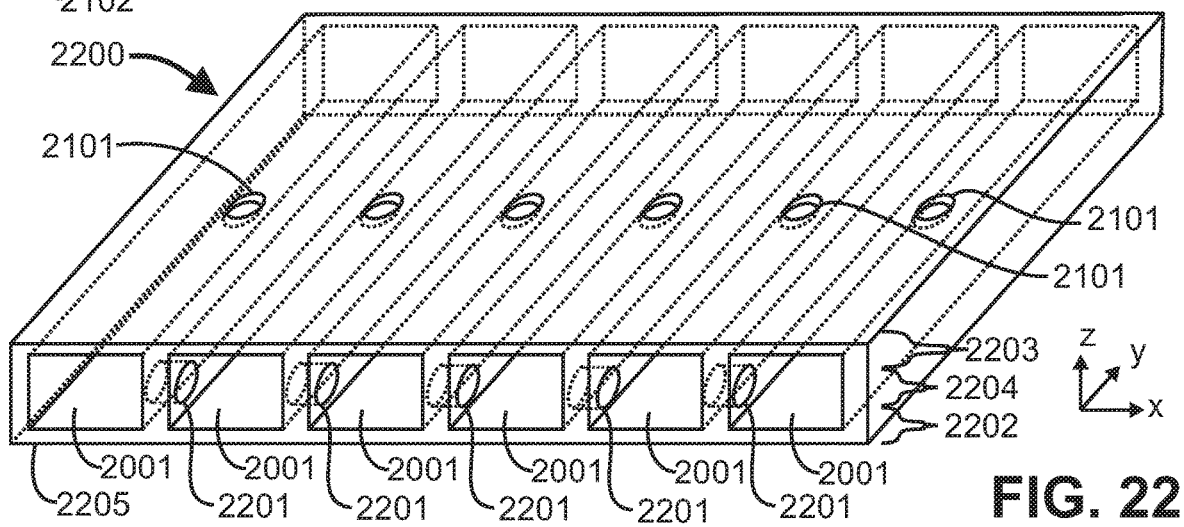
FIG. 22 is a perspective view of a fluid transfer component formed from a microcapillary film comprising a plurality of fluid channels along the flow direction, channel openings, and cross-channel openings.

FIG. 22 is a perspective view of a fluid transfer component 2200 formed from a microcapillary film 2205 comprising a plurality of fluid channels 2001 along the flow direction (y direction in FIG. 20). The microcapillary film 2205 further comprises channel openings 2101 positioned along a line parallel to the direction orthogonal to the flow direction (y direction) and orthogonal to the thickness direction (z direction), extending to the environment surrounding the fluid transfer component 2200 in the thickness direction (z direction). The fluid transfer component 2200 further comprises cross-channel openings 2201 extending in a direction (x direction) orthogonal to the fluid flow direction (y direction) and orthogonal to the thickness direction (z direction) of the microcapillary film 2205. The cross-channel openings 2201 permit fluid flow between the fluid channels 2001. The microcapillary film 2205 may be formed of an inner layer 2204 positioned between two outer layers 2202, 2203 wherein the inner layer 2204 may comprise an infrared light absorbing additive such that when the fluid transfer component 2200 is exposed to infrared laser radiation, a portion of the inner layer 2204 in the vertical wall of the fluid channels 2001 increases in temperature and a cross-channel opening 2201 is formed. In one embodiment, a pressure difference (such as pump drawing a vacuum or increasing the pressure) may be applied to the fluid in the fluid channels 2001 relative to the environment to aid in the formation of the cross-channel openings 2201.

Figure 23:
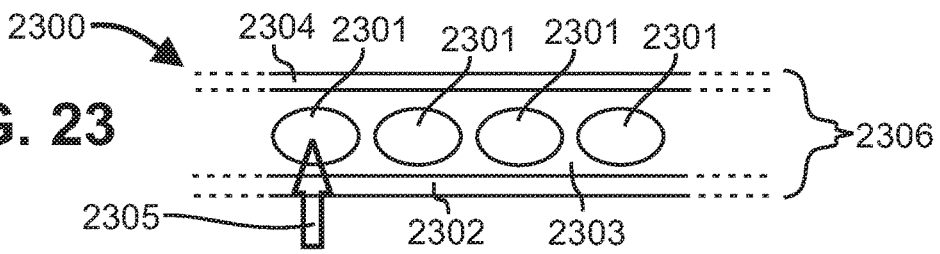
FIG. 23 is a perspective view of a fluid transfer component formed from a multi-layer microcapillary film comprising a plurality of fluid channels.

FIG. 23 is a perspective view of a fluid transfer component 2300 formed from a microcapillary film 2306 comprising a plurality of fluid channels 2301 along the flow direction (y direction). The microcapillary film comprises fluid channels 2301 in an inner layer 2303 between a lower layer 2302 and upper layer 2304. In one embodiment, the upper layer 2304 has an equal pressure transmission rate, at 73 degrees Fahrenheit, 0% relative humidity, less than 1 cubic centimeters (cc) per 100 square inches per 24 hours for a first gas and the lower layer 2302 has an equal pressure transmission rate, at 73 degrees Fahrenheit, 0% relative humidity, greater than 100 cubic centimeters (cc) per 100 square inches per 24 hours for the first gas. In this embodiment, the fluid transfer component may be positioned over a region or substance to collect the first gas 2305 directly flowing into fluid channels and indirectly from accumulation since it has a high transmission rate through the lower layer 2302 (and preferably through the material defining the inner layer 2303) but has a low transmission rate through the upper layer 2304. In one embodiment, the first gas 2305 is methane and the fluid transfer component 2300 is a sheet, film, or panel positioned above a landfill or other methane generating area as part of a fluid transfer system to capture methane gas into the fluid transfer component and out through fluid output couplers (which may include one or more fluid channel geometry converters) for removal and/or processing.

Figure 24:
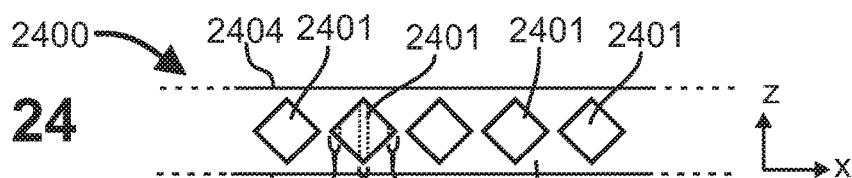
FIG. 24 is a cross-sectional side view of a portion of an embodiment of a fluid transfer film comprising fluid channels within a polymer with a cross-sectional shape similar to a diamond shape or rotated square shape.

FIG. 24 is a cross-sectional side view of a portion of an embodiment of a fluid transfer film 2400 comprising fluid channels 2401 within a polymer 2402 with a cross-sectional shape similar to a diamond shape or rotated square shape. The fluid transfer film 2400 comprises a thickness between an upper surface 2404 and lower surface 2403 in the thickness direction (parallel to the z direction). The fluid channels 2401 comprise a width in the cross direction (parallel to the x direction) perpendicular to the thickness direction (parallel to z direction) and the flow direction (parallel to the y direction in or out of the page). The fluid channels 2401 also comprise an edge region 2405 and a second edge region 2407 on the opposite side of the fluid channel 2401 in the cross direction that is 10 percent of the average maximum width for the fluid channels 2401 from the edge of the fluid channels 2401 closest to one or more neighboring fluid channels 2401 in the cross direction. The fluid channels 2401 also comprise a central region 2406 that is within 10 percent of the average maximum width for the fluid channels 2401 from the center of the fluid channel 2401 in the cross direction. In this embodiment, the average thickness of the fluid channels 2401 in the edge region 2405 and/or second edge region 2407 of the fluid channel 2401 is less than 20 percent of the average maximum thickness of the fluid channels 2401. In this embodiment, the average thickness of the fluid channels 2401 in the central region 2406 is greater than 70 percent of the average maximum thickness of the fluid channels 2401. In this embodiment, the thickness of the fluid channels 2401 taper from the central region 2406 to the edge region 2405 (and to the second edge region 2407 on the opposite side of the fluid channel 2401 in the cross direction) and edges closest to the neighboring fluid channel in the cross direction. In one embodiment the ratio of the average thickness of the fluid channels 2401 in the central region 2406 to the average thickness of the fluid channels 2401 in the edge region 2405 and/or the second edge region 2407 is greater than 4.

Figure 25:
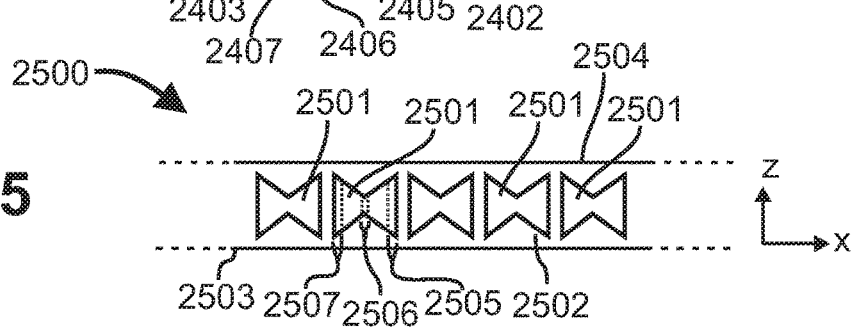
FIG. 25 is a cross-sectional side view of a portion of an embodiment of a fluid transfer film comprising fluid channels within a polymer with an edge region and a central region.

FIG. 25 is a cross-sectional side view of a portion of an embodiment of a fluid transfer film 2500 comprising fluid channels 2501 within a polymer 2502. The fluid transfer film 2500 comprises a thickness between an upper surface 2504 and lower surface 2503 in the thickness direction (parallel to the z direction). The fluid channels 2501 comprise a width in the cross direction (parallel to the x direction) perpendicular to the thickness direction (parallel to z direction) and the flow direction (parallel to the y direction in or out of the page). The fluid channels 2501 also comprise an edge region 2505 and a second edge region 2507 on the opposite side of the fluid channel 2501 in the cross direction that is 10 percent of the average maximum width for the fluid channels 2501 from the edge of the fluid channels 2501 closest to one or more neighboring fluid channels 2501 in the cross direction. The fluid channels 2501 also comprise a central region 2506 that is within 10 percent of the average maximum width for the fluid channels 2501 from the center of the fluid channel 2501 in the cross direction. In this embodiment, the average thickness of the fluid channels 2501 in the central region 2506 of the fluid channel 2501 is less than 20 percent of the average maximum thickness of the fluid channels 2501. In this embodiment, the average thickness of the fluid channels 2501 in the edge region 2505 and/or in the second edge region 2507 is greater than 70 percent of the average maximum thickness of the fluid channels 2501. In this embodiment, the thickness of the fluid channels 2501 taper from the edge region 2505 (and from a second edge region 2507 on the opposite side of the fluid channel 2501 in the cross direction) to the central region 2506 in the cross direction. In one embodiment the ratio of the average thickness of the fluid channels 2501 in the edge region 2505 and/or the edge region 2507 to the average thickness of the fluid channels 2501 in the central region 2506 is greater than one selected from the group: 2, 4, 5, 8, and 10.

Figure 26:
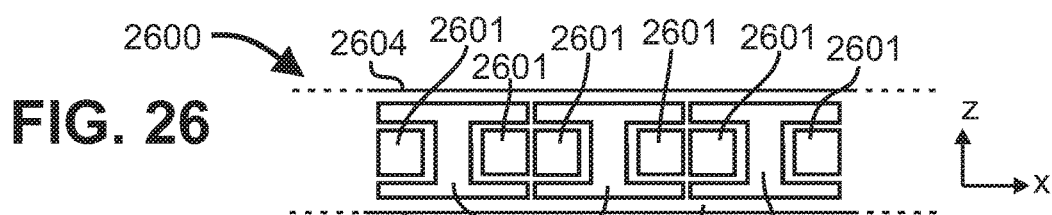
FIG. 26 is a cross-sectional side view of a portion of an embodiment of a fluid transfer film comprising first fluid channels and second fluid channels separate from the first fluid channels within a polymer.

FIG. 26 is a cross-sectional side view of a portion of an embodiment of a fluid transfer film 2600 comprising first fluid channels 2601 and second fluid channels 2602 separate from the first fluid channels 2601 within a polymer 2605. The fluid transfer film 2600 comprises a thickness between an upper surface 2604 and lower surface 2603 of the fluid transfer film 2600 in the thickness direction (parallel to the z direction). The first fluid channels 2601 and second fluid channels 2602 overlap in the thickness direction (parallel to the z direction) such that a line parallel to the thickness direction passing through at least a portion of the first fluid channels 2601 also passes through at least a portion of the second fluid channels 2602. In this embodiment, the second fluid channels 2602 overlap the first fluid channels 2601 twice such that a line parallel to the thickness direction passing through the first fluid channels 2601 also passes through two portions of the second fluid channels 2602 (it passes in and out of the second fluid channel twice). In this embodiment, the separation between the first fluid channels 2601 varies in the cross direction and the first fluid channels 2601 have an irregular pitch. In one embodiment, the first fluid channels comprise a first fluid flowing in the +z direction while the second fluid channels comprise a second fluid flowing in the −z direction.

Figure 27:
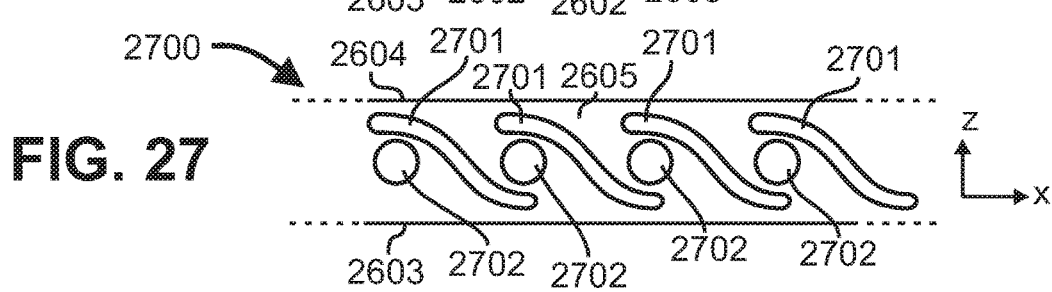
FIG. 27 is a cross-sectional side view of a portion of an embodiment of a fluid transfer film comprising first fluid channels that overlap second fluid channels within a polymer.

FIG. 27 is a cross-sectional side view of a portion of an embodiment of a fluid transfer film 2700 comprising first fluid channels 2701 and second fluid channels 2702 separate from the first fluid channels 2701 within a polymer 2605. The fluid transfer film 2700 comprises a thickness between an upper surface 2604 and a lower surface 2603 of the fluid transfer film 2700 in the thickness direction (parallel to the z direction). The first fluid channels 2701 and second fluid channels 2702 overlap in the thickness direction (parallel to the z direction) such that a line parallel to the thickness direction passing through at least a portion of the second fluid channels 2702 also passes through at least a portion of the first fluid channels 2701. In this embodiment, the first fluid channels 2701 overlap two second fluid channels 2702 such that a line parallel to the thickness direction passing through a first portion of a first fluid channels 2701 passes through a second fluid channel 2702 and a second line parallel to the thickness direction passing through a second portion of the same first fluid channel 2701 passes through a different second fluid channel 2702. In one embodiment portions of the first fluid channel or second fluid channel may overlap portions of the second fluid channel or first fluid channel, respectively.

Figure 28:
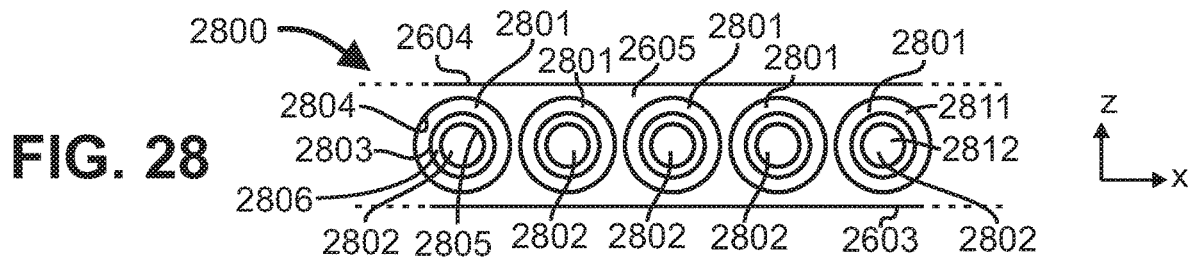
FIG. 28 is a cross-sectional side view of a portion of an embodiment of a fluid transfer film comprising outer fluid channels and inner fluid channels wherein the inner fluid channels are positioned within the outer fluid channels.

FIG. 28 is a cross-sectional side view of a portion of an embodiment of a fluid transfer film 2800 comprising outer fluid channels 2801 and inner fluid channels 2802 wherein the inner fluid channels 2802 are positioned within the outer fluid channels 2801. The fluid transfer film 2800 comprises a thickness between an upper surface 2604 and a lower surface 2603 of the fluid transfer film 2800 in the thickness direction (parallel to the z direction). In this embodiment, the inner fluid channel walls 2806 of the inner fluid channels 2802 comprise an outer surface 2803 and an inner surface 2805. In this embodiment, an inner surface 2804 of the polymer 2605 defines the outer fluid channels 2801. In one embodiment, the inner fluid channel walls 2806 of the inner fluid channels 2802 comprise a flexible material (such as a rubber, elastomer, or other polymer) such that when the pressure of the inner fluid 2812 in the inner fluid channel 2802 is increased, the inner fluid channel walls 2806 expand, and one or both orthogonal dimensions of the inner fluid channel 2802 increase in the cross plane (x-z plane parallel to the cross direction (x direction) and orthogonal to the direction of fluid flow (parallel to the y direction) and may reduce the volume of the outer fluid 2811 in the outer fluid channel 2801 and/or substantially fill the outer fluid channel 2801. In one embodiment, the pressure of the inner fluid 2812 in the inner fluid channel 2802 and/or the outer fluid

2811 in the outer fluid channel 2801 may be adjusted to change the properties (optical, thermal, mechanical, and others disclosed herein) of the fluid transfer film 2800 in the active region.

In one light emitting embodiment, the outer fluid channel 2801 comprises an outer fluid 2811 which may comprise air or a low refractive index fluid, the inner fluid channel walls 2806 of the inner fluid channel 2802 comprise a first polymer, and the inner fluid 2812 and the inner fluid channel walls 2806 define a lightguide with light propagating within the inner fluid 2812 and inner fluid channel walls 2806 in a waveguide condition due to total internally reflection of light at the interface between the outer surface 2803 of the inner fluid channel walls 2806 and the outer fluid 2811 due to the refractive index difference between the material of the inner fluid channel walls 2806 and the outer fluid 2811. With the inner fluid 2812 at a first pressure, such as a low pressure, the outer surface 2803 of the inner fluid channel walls 2806 have a minimal or low percentage of contact with the inner surface 2804 of the outer fluid channels 2801 such that a low percentage of light is extracted from the lightguide due to contact. In this embodiment, when the pressure of the inner fluid 2812 is increased, the percentage of the surface area of the outer surface 2803 of the inner fluid channel walls 2806 in contact with the inner surface 2804 of the outer fluid channels 2801 increases and more light is coupled into the polymer 2605 defining the outer fluid channels 2801 due to frustration of the total internal reflection of the light propagating within the inner fluid 2812 and the inner fluid channel walls 2806. In this embodiment, the polymer 2605 defining the outer fluid channels 2801 may comprise a light scattering material (or a light scattering film (volumetric or surface scattering) may be in contact with the upper surface 2604 or lower surface 2603 of the fluid film or the outer surface of the polymer 2605 defining the outer fluid channels 2801 may comprise a surface relief profile that scatters light) such that with a low pressure of the inner fluid 2812 with light from a light source propagating by total internal reflection through the inner fluid channel 2802 and the inner fluid channel wall 2806, a low percentage of the propagating light exits the fluid transfer film 2800 in a light emitting region. In this embodiment, when the pressure of the inner fluid 2812 is increased, a higher percentage of the propagating light is extracted into the polymer 2605 defining the outer fluid channel 2801, is scattered, and exits the fluid transfer film 2800 in the active region. In this example, the pressure of the inner fluid 2812 controls the amount of light emitted in the active region of the fluid transfer film 2800. Likewise, the pressure of the outer fluid 2811 may be increased relative to the pressure of the inner fluid 2812 to decrease the amount of light emitted in the active region of the fluid transfer film 2800.

Figure 29:
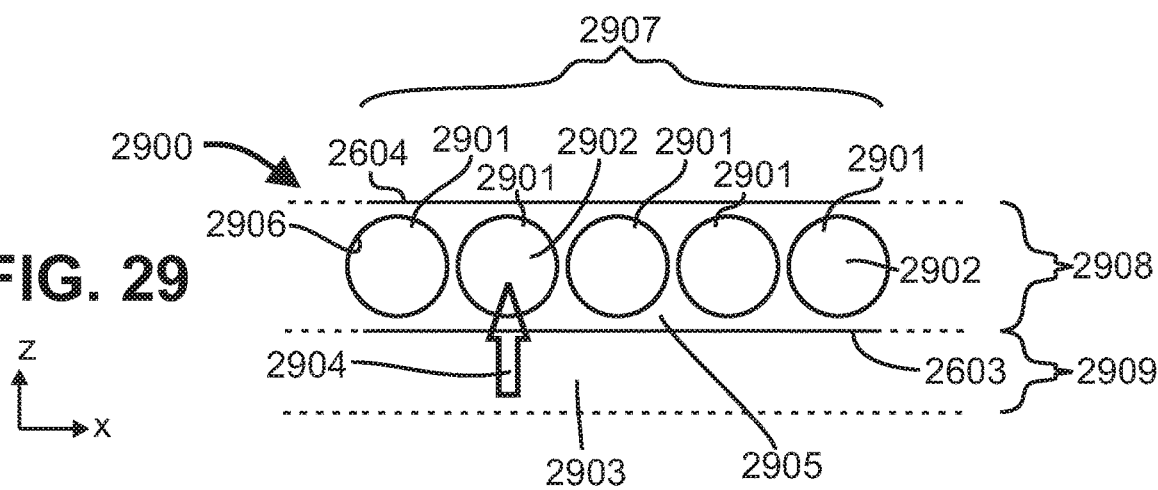
FIG. 29 is a cross-sectional side view of a portion of an embodiment of a fluid transfer system comprising a fluid transfer film comprising fluid channels in an active region of the fluid transfer film.

FIG. 29 is a cross-sectional side view of a portion of an embodiment of a fluid transfer system 2900 comprising a fluid transfer film 2908 (such as a microcapillary film) comprising fluid channels 2901 in an active region 2907 of the fluid transfer film 2908. The fluid transfer film 2908 comprises a thickness between an upper surface 2604 and a lower surface 2603 of the fluid transfer film 2908 in the thickness direction (parallel to the z direction). An inner surface 2906 of the polymer 2905 defines the fluid channels 2901. In this embodiment, the polymer 2905 is a porous polymer. The system further comprises a first fluid 2903 in a region 2909 adjacent (or in fluid communication with) the polymer 2905 wherein the first fluid 2903 is pressurized to a pressure higher than the pressure of the second fluid 2902 in the fluid channels 2901 and such that one or more selected from the group: impurities, salts, bacteria, microparticles, ionic particles or liquids, liquids, and nanoparticles, are filtered out of the first fluid 2903 by the polymer 2905 such that a portion of the first fluid 2903 permeates 2904 into the fluid channels 2901 in the form of the second fluid 2902 where it may flow through the fluid channels 2901 in the +y direction (into the page in FIG. 29) where it may be collected or transferred. In one embodiment, the polymer 2905, fluid transfer system 2900, and/or fluid transfer film 2908 comprises one or more selected from the group: barrier layer or coating, asymmetric barrier coating or layer, ionic coatings, ionic membranes, hydrophobic coatings or layers, and hydrophilic coatings or layers on the inner surface 2906 of the fluid channels 2901, on the upper surface 2604 of the fluid transfer film 2908, or on the lower surface 2603 of the fluid transfer film 2908, and the fluid transfer system 2900 is one or more selected from the group: particulate filtration system, reverse osmosis system, forward osmosis system, electrodeionization system, and electrodialsysis system. In one embodiment, the region 2909 (such as a layer of the first fluid 2901 or an channel or region between two or layers comprising the first fluid 2903) or a composite comprising the fluid transfer film 2908 comprises cross-flow filtration and optionally turbulence generating structures such as a mesh to carry particulates that did not pass through the polymer 2905 away from the active region 2907 and/or lower surface 2603 of the fluid transfer film 2908.

In one embodiment, a fluid transfer component for transferring a fluid comprises an input side and an output side where the fluid flows in a flow direction through an active region from the input side to the output side; a film comprising a polymer and having a thickness in a thickness direction of the film less than 5 millimeters; a plurality of fluid channels defined by one or more interior surfaces within the film, each fluid channel of the plurality of fluid channels is separated spatially in at least 1 row in the thickness direction of the film, each fluid channel of the plurality of fluid channels has a channel flow dimension defined as a dimension of flow length of the fluid in the fluid channel from the input side to the output side, a channel transverse flow dimension in the thickness direction of the film, and an active flow ratio defined as a ratio of an average channel flow dimension to an average channel transfer flow dimension in the active region; and an active flow ratio of the fluid transfer component defined as an average of the active flow ratio from each of the plurality of fluid channels, wherein the active flow ratio for the fluid transfer component is greater than 1,000. In one embodiment, the one or more interior surfaces that define the plurality of fluid channels comprise a coating or surface treatment. In one embodiment, the one or more interior surfaces that define the plurality of fluid channels comprise a vapor deposition coating or plasma enhanced vapor deposition coating. In one embodiment, the one or more interior surfaces that define the plurality of fluid channels comprise a coating applied by co-extrusion. In one embodiment, the one or more interior surfaces that define the plurality of fluid channels comprise a coating applied by wet coating. In one embodiment, the one or more interior surfaces that define the plurality of fluid channels comprise a coating applied by covalent grafting of a functional moiety. In one embodiment, the one or more interior surfaces that define the plurality of fluid channels comprise a hydrophilic coating. In another embodiment, the one or more interior surfaces that define the plurality of fluid channels is a surface modified to produce a surface relief profile. In one embodiment, the fluid flows through the plurality of fluid channels by capillary action. In another embodiment, each channel of the plurality of fluid channels is formed by extrusion. In a further embodiment, the fluid transfer component comprises a layer co-extruded onto the film. In one embodiment, a fluid transfer film for transferring a fluid comprises an extruded polymer layer having a thickness less than 5 millimeters; an input side and an output side where the fluid flows in a flow direction through an active region from the input side to the output side; and more than 10 fluid channels defined by interior surfaces within the extruded polymer layer formed during in an extrusion process, each fluid channel of the more than 10 fluid channels is separated spatially in at least 1 row in a thickness direction of the fluid transfer film, the more than 10 fluid channels have a channel density across the active region greater than 5 fluid channels per centimeter, wherein the interior surfaces defining the more than 10 fluid channels are hydrophilic, and the fluid flows through the more than 10 fluid channels by at least capillary action. In one embodiment, the interior surfaces defining the more than 10 fluid channels have a surface free energy at 20 degrees Celsius greater than 50 mN/m2. In one embodiment, the interior surfaces defining the more than 10 fluid channels comprise a hydrophilic applied by covalent grafting. In one embodiment, the interior surfaces defining the more than 10 fluid channels are permanently wet, liquid impregnated surfaces. In another embodiment, a multilayer fluid transfer film for transferring a fluid comprises a thickness less than 5 millimeters; a first extruded polymer layer; a second polymer layer co-extruded with the first extruded polymer layer; an input side and an output side where the fluid flows in a flow direction from the input side to the output side; and more than 5 fluid channels defined by interior surfaces within the first extruded polymer layer formed during in an extrusion process, each fluid channel of the more than 5 fluid channels is separated spatially in at least 1 row in a thickness direction of the multilayer fluid transfer film, the more than 5 fluid channels have a channel density across an active region greater than 2 fluid channels per centimeter, wherein the interior surfaces defining the more than 5 fluid channels are hydrophilic, and the fluid flows through the more than 5 fluid channels by at least capillary action. In one embodiment, the interior surfaces defining the more than 5 fluid channels comprise a hydrophilic applied by covalent grafting. In another embodiment, the multilayer fluid transfer film comprises a dimension in a first direction larger than 10 centimeters. In one embodiment, the multilayer fluid transfer film comprises a coating applied by wet coating, chemical vapor deposition, plasma enhanced vapor deposition, or vacuum deposition. In another embodiment the wherein an average separation between the more than 5 fluid channels in a direction orthogonal to the flow direction and the thickness direction is greater than 5 micrometers.

EQUIVALENTS

Those skilled in the art will recognize or be able to ascertain using no more than routine experimentation, numerous equivalents to the specific procedures described herein. Such equivalents are considered to be within the scope of the invention. Various substitutions, alterations, and modifications may be made to the invention without departing from the spirit and scope of the invention. Other aspects, advantages, and modifications are within the scope of the invention. This application is intended to cover any adaptations or variations of the specific embodiments discussed herein. Therefore, it is intended that this disclosure be limited only by the claims and the equivalents thereof.

Unless otherwise indicated, all numbers expressing feature sizes, amounts, and physical properties used in the specification and claims are to be understood as being modified by the term "about". Accordingly, unless indicated to the contrary, the numerical parameters set forth in the foregoing specification and attached claims are approximations that can vary depending upon the desired properties sought to be obtained by those skilled in the art utilizing the teachings disclosed herein.

What is claimed is:

1. A fluid transfer component for transferring a fluid, the fluid transfer component comprising:
    an input side and an output side where the fluid flows in a flow direction through an active region from the input side to the output side;
    a film comprising a polymer and having a thickness in a thickness direction of the film less than 5 millimeters;
    a plurality of fluid channels defined by one or more interior surfaces within the film, each fluid channel of the plurality of fluid channels is separated spatially in at least 1 row in the thickness direction of the film, each fluid channel of the plurality of fluid channels has a channel flow dimension defined as a dimension of flow length of the fluid in the fluid channel from the input side to the output side, a channel transverse flow dimension in the thickness direction of the film, and an active flow ratio defined as a ratio of an average channel flow dimension to an average channel transfer flow dimension in the active region; and
    an active flow ratio of the fluid transfer component defined as an average of the active flow ratio from each of the plurality of fluid channels,
    wherein the active flow ratio for the fluid transfer component is greater than 1,000.

2. The fluid transfer component of claim 1 wherein the one or more interior surfaces that define the plurality of fluid channels comprise a coating or surface treatment.

3. The fluid transfer component of claim 2 wherein the one or more interior surfaces that define the plurality of fluid channels comprise a vapor deposition coating or plasma enhanced vapor deposition coating.

4. The fluid transfer component of claim 1 wherein the one or more interior surfaces that define the plurality of fluid channels comprise a coating applied by co-extrusion.

5. The fluid transfer component of claim 1 wherein the one or more interior surfaces that define the plurality of fluid channels comprise a coating applied by wet coating.

6. The fluid transfer component of claim 1 wherein the one or more interior surfaces that define the plurality of fluid channels comprise a coating applied by covalent grafting of a functional moiety.

7. The fluid transfer component of claim 1 wherein the one or more interior surfaces that define the plurality of fluid channels comprise a hydrophilic coating.

8. The fluid transfer component of claim 1 wherein the one or more interior surfaces that define the plurality of fluid channels is a surface modified to produce a surface relief profile.

9. The fluid transfer component of claim 1 wherein the fluid flows through the plurality of fluid channels by capillary action.

10. The fluid transfer component of claim 1 wherein each channel of the plurality of fluid channels is formed by extrusion.

11. The fluid transfer component of claim 1 wherein the fluid transfer component further comprises a layer co-extruded onto the film.

12. A fluid transfer film for transferring a fluid, the fluid transfer film comprising:
   an extruded polymer layer having a thickness less than 5 millimeters;
   an input side and an output side where the fluid flows in a flow direction through an active region from the input side to the output side; and
   more than 10 fluid channels defined by interior surfaces within the extruded polymer layer formed during in an extrusion process, each fluid channel of the more than 10 fluid channels is separated spatially in at least 1 row in a thickness direction of the fluid transfer film, the more than 10 fluid channels have a channel density across the active region greater than 5 fluid channels per centimeter,
   wherein the interior surfaces defining the more than 10 fluid channels are hydrophilic, and the fluid flows through the more than 10 fluid channels by at least capillary action.

13. The fluid transfer film of claim 12 wherein the interior surfaces defining the more than 10 fluid channels have a surface free energy at 20 degrees Celsius greater than 50 mN/m².

14. The fluid transfer film of claim 12 wherein the interior surfaces defining the more than 10 fluid channels comprise a hydrophilic applied by covalent grafting.

15. The fluid transfer film of claim 12 wherein the interior surfaces defining the more than 10 fluid channels are permanently wet, liquid impregnated surfaces.

16. A multilayer fluid transfer film for transferring a fluid, the multilayer fluid transfer film comprising:
   a thickness less than 5 millimeters;
   a first extruded polymer layer;
   a second polymer layer co-extruded with the first extruded polymer layer;
   an input side and an output side where the fluid flows in a flow direction from the input side to the output side; and
   more than 5 fluid channels defined by interior surfaces within the first extruded polymer layer formed during in an extrusion process, each fluid channel of the more than 5 fluid channels is separated spatially in at least 1 row in a thickness direction of the multilayer fluid transfer film, the more than 5 fluid channels have a channel density across an active region greater than 2 fluid channels per centimeter,
   wherein the interior surfaces defining the more than 5 fluid channels are hydrophilic, and the fluid flows through the more than 5 fluid channels by at least capillary action.

17. The multilayer fluid transfer film of claim 16 wherein the interior surfaces defining the more than 5 fluid channels comprise a hydrophilic applied by covalent grafting.

18. The multilayer fluid transfer film of claim 16 wherein the multilayer fluid transfer film comprises a dimension in a first direction larger than 10 centimeters.

19. The multilayer fluid transfer film of claim 16 further comprising a coating applied by wet coating, chemical vapor deposition, plasma enhanced vapor deposition, or vacuum deposition.

20. The multilayer fluid transfer film of claim 16 wherein an average separation between the more than 5 fluid channels in a direction orthogonal to the flow direction and the thickness direction is greater than 5 micrometers.

* * * * *